(12) United States Patent
Okhonin et al.

(10) Patent No.: US 7,606,066 B2
(45) Date of Patent: Oct. 20, 2009

(54) MEMORY CELL AND MEMORY CELL ARRAY HAVING AN ELECTRICALLY FLOATING BODY TRANSISTOR, AND METHODS OF OPERATING SAME

(75) Inventors: Serguei Okhonin, Lausanne (CH); Mikhail Nagoga, Pully (CH)

(73) Assignee: Innovative Silicon ISi SA, Lausanne (CH)

( * ) Notice: Subject to any disclaimer, the term of this patent is extended or adjusted under 35 U.S.C. 154(b) by 280 days.

(21) Appl. No.: 11/509,188

(22) Filed: Aug. 24, 2006

(65) Prior Publication Data

US 2007/0058427 A1    Mar. 15, 2007

Related U.S. Application Data

(60) Provisional application No. 60/714,917, filed on Sep. 7, 2005, provisional application No. 60/722,139, filed on Sep. 30, 2005, provisional application No. 60/728,061, filed on Oct. 19, 2005, provisional application No. 60/749,385, filed on Dec. 12, 2005, provisional application No. 60/774,275, filed on Feb. 16, 2006.

(51) Int. Cl.
    *G11C 11/34* (2006.01)
(52) U.S. Cl. .................................. 365/177; 365/189.16
(58) Field of Classification Search .................. 365/177
    See application file for complete search history.

(56) References Cited

U.S. PATENT DOCUMENTS 3,439,214 A   4/1969  Kabell
3,997,799 A   12/1976 Baker
4,032,947 A   6/1977  Kesel et al.
4,250,569 A   2/1981  Sasaki et al.

(Continued)

FOREIGN PATENT DOCUMENTS

EP          0 030 856       6/1981

(Continued)

OTHER PUBLICATIONS

U.S. Appl. No. 11/703,429.*

(Continued)

*Primary Examiner*—Amir Zarabian
*Assistant Examiner*—Kretelia Graham
(74) *Attorney, Agent, or Firm*—Neil A. Steinberg

(57) ABSTRACT

A technique of writing, programming, holding, maintaining, sampling, sensing, reading and/or determining the data state of a memory cell of a memory cell array (for example, a memory cell array having a plurality of memory cells which consist of an electrically floating body transistor). In one aspect, the present inventions are directed to techniques to control and/or operate a semiconductor memory cell (and memory cell array having a plurality of such memory cells as well as an integrated circuit device including a memory cell array) having one or more electrically floating body transistors in which an electrical charge is stored in the body region of the electrically floating body transistor. The techniques of the present inventions may employ bipolar transistor currents to control, write and/or read a data state in such a memory cell. In this regard, the present inventions may employ a bipolar transistor current to control, write and/or read a data state in/of the electrically floating body transistor of the memory cell.

42 Claims, 42 Drawing Sheets

U.S. PATENT DOCUMENTS

| | | | |
|---|---|---|---|
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,791,610 A | 12/1988 | Takemae |
| 4,954,989 A | 9/1990 | Auberton-Herve et al. |
| 4,979,014 A | 12/1990 | Hieda et al. |
| 5,144,390 A | 9/1992 | Matloubian |
| 5,164,805 A | 11/1992 | Lee |
| 5,258,635 A | 11/1993 | Nitayama et al. |
| 5,388,068 A | 2/1995 | Ghoshal et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,528,062 A | 6/1996 | Hsieh et al. |
| 5,568,356 A | 10/1996 | Schwartz |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,696,718 A | 12/1997 | Hartmann |
| 5,740,099 A | 4/1998 | Tanigawa |
| 5,778,243 A | 7/1998 | Aipperspach et al. |
| 5,780,906 A | 7/1998 | Wu et al. |
| 5,784,311 A | 7/1998 | Assaderaghi et al. |
| 5,811,283 A | 9/1998 | Sun |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 6,018,172 A | 1/2000 | Hidaka et al. |
| 6,081,443 A | 6/2000 | Morishita |
| 6,096,598 A | 8/2000 | Furukawa et al. |
| 6,097,056 A | 8/2000 | Hsu et al. |
| 6,111,778 A | 8/2000 | MacDonald et al. |
| 6,121,077 A | 9/2000 | Hu et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,708 B1 | 1/2001 | Kuang et al. |
| 6,214,694 B1 | 4/2001 | Leobandung et al. |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,556,477 B2 | 4/2003 | Hsu et al. |
| 6,560,142 B1 | 5/2003 | Ando |
| 6,566,177 B1 | 5/2003 | Radens et al. |
| 6,567,330 B2 | 5/2003 | Fujita et al. |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,714,436 B1 | 3/2004 | Burnett et al. |
| 6,721,222 B2 | 4/2004 | Somasekhar et al. |
| 6,825,524 B1* | 11/2004 | Ikehashi et al. ............. 257/314 |
| 6,861,689 B2 | 3/2005 | Burnett |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portmann et al. |
| 6,913,964 B2 | 7/2005 | Hsu |
| 7,061,806 B2 | 6/2006 | Tang et al. |
| 7,085,156 B2 | 8/2006 | Ferrant et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146488 A1 | 8/2003 | Nagano et al. |
| 2003/0151112 A1 | 8/2003 | Yamada et al. |
| 2004/0108532 A1 | 6/2004 | Forbes |
| 2005/0001269 A1 | 1/2005 | Hayashi et al. |
| 2005/0017240 A1 | 1/2005 | Fazan |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0135169 A1 | 6/2005 | Somasekhar et al. |
| 2005/0141262 A1 | 6/2005 | Yamada et al. |
| 2005/0141290 A1 | 6/2005 | Tang et al. |

| | | |
|---|---|---|
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0226070 A1 | 10/2005 | Ohsawa |
| 2005/0232043 A1 | 10/2005 | Ohsawa |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2007/0023833 A1 | 2/2007 | Okhonin et al. |

FOREIGN PATENT DOCUMENTS

| | | |
|---|---|---|
| EP | 0 350 057 | 1/1990 |
| EP | 0 354 348 | 2/1990 |
| EP | 0 362 961 | 4/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 642 173 | 3/1995 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | S62-007149 A | 1/1987 |
| JP | 62-272561 | 11/1987 |
| JP | 02-294076 | 2/1991 |
| JP | 03171768 | 7/1991 |
| JP | H04-176163 A | 6/1992 |
| JP | 08213624 | 8/1996 |
| JP | H08-213624 A | 8/1996 |
| JP | 8-274277 | 10/1996 |
| JP | H08-316337 A | 11/1996 |
| JP | 09046688 | 2/1997 |
| JP | 9-82912 | 3/1997 |
| JP | 10242470 | 11/1998 |
| JP | 11-87649 | 3/1999 |
| JP | 247735 | 8/2000 |
| JP | 274221 | 9/2000 |
| JP | 389106 | 12/2000 |
| JP | 180633 | 6/2001 |
| JP | 2002-94027 | 3/2002 |
| JP | 2002-176154 | 6/2002 |
| JP | 2002-246571 | 8/2002 |
| JP | 2002-0981 | 11/2002 |
| JP | 2002-329795 | 11/2002 |
| JP | 2002-343886 | 11/2002 |
| JP | 2002-353080 | 12/2002 |
| JP | 2003-31693 | 1/2003 |
| JP | 2003-68877 A | 3/2003 |
| JP | 2003-86712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |

OTHER PUBLICATIONS

U.S. Appl. No. 12/019,320.*
"A Capacitorless Double-Gate DRAM Cell", Kuo et al., IEEE Electron Device Letters, vol. 23, No. 6, Jun. 2002, pp. 345-347.
"The Multi-Stable Behaviour of SOI-NMOS Transistors at Low Temperatures", Tack et al., Proc. 1988 SOS/SOI Technology Workshop (Sea Palms Resort, St. Simons Island, GA, Oct. 1988), p. 78.
"The Multistable Charge-Controlled Memory Effect in SOI MOS Transistors at Low Temperatures", Tack et al., IEEE Transactions on Electron Devices, vol. 37, No. 5, May 1990, pp. 1373-1382.
"Mechanisms of Charge Modulation in the Floating Body of Triple-Well nMOSFET Capacitor-less DRAMs", Villaret et al., Proceedings of the Infos 2003, Insulating Films on Semiconductors, 13th Bi-annual Conference, Jun. 18-20, 2003, Barcelona (Spain), (4 pages).
"A Memory Using One-Transistor Gain Cell on SOI (FBC) with Performance Suitable for Embedded Dram's", Ohsawa et al., 2003 Symposium on VLSI Circuits Digest of Technical Papers, Jun. 2003 (4 pages).
FBC (Floating Body Cell) for Embedded DRAM on SOI, Inoh et al., 2003 Symposium on VLSI Circuits Digest of Technical Papers, Jun. 2003 (2 pages).
"Toshiba's DRAM Cell Piggybacks on SOI Wafer", Y. Hara, EE Times, Jun. 2003.
"Memory Design Using a One-Transistor Gain Cell on SOI", Ohsawa et al., IEEE Journal of Solid-State Circuits, vol. 37, No. 11, Nov. 2002, pp. 1510-1522.
"Opposite Side Floating Gate SOI Flash Memory Cell", Lin et al., IEEE, Mar. 2000, pp. 12-15.
"Advanced TFT SRAM Cell Technology Using a Phase-Shift Lithography", Yamanaka et al., IEEE Transactions on Electron Devices, vol. 42, No. 7, Jul. 1995, pp. 1305-1313.

"Soft-Error Characteristics in Bipolar Memory Cells with Small Critical Charge", Idei et al., IEEE Transactions on Electron Devices, vol. 38, No. 11, Nov. 1991, pp. 2465-2471.

"An SOI 4 Transistors Self-Refresh Ultra-Low-Voltage Memory Cell", Thomas et al., IEEE, Mar. 2003, pp. 401-404.

"Design of a SOI Memory Cell", Stanojevic et al., IEEE Proc. 21$^{st}$ International Conference on Microelectronics (MIEL '97), vol. 1, NIS, Yugoslavis, Sep. 14-17, 1997, pp. 297-300.

"Effects of Floating Body on Double Polysilicon Partially Depleted SOI Nonvolatile Memory Cell", Chan et al., IEEE Electron Device Letters, vol. 24, No. 2, Feb. 2003, pp. 75-77.

"MOSFET Design Simplifies DRAM", P. Fazan, EE Times, May 14, 2002 (3 pages).

"One of Application of SOI Memory Cell—Memory Array", Lončar et al., IEEE Proc. 22$^{nd}$ International Conference on Microelectronics (MIEL 2000), vol. 2, NIŠ, Serbia, May 14-17, 2000, pp. 455-458.

"A SOI Current Memory for Analog Signal Processing at High Temperature", Portmann et al., 1999 IEEE International SOI Conference, Oct. 1999, pp. 18-19.

"Chip Level Reliability on SOI Embedded Memory", Kim et al., Proceedings 1998 IEEE International SOI Conference, Oct. 1998, pp. 135-139.

"Analysis of Floating-Body-Induced Leakage Current in 0.15 μm SOI DRAM", Terauchi et al., Proceedings 1996 IEEE International SOI Conference, Oct. 1996, pp. 138-139.

"Programming and Erase with Floating-Body for High Density Low Voltage Flash EEPROM Fabricated on SOI Wafers", Chi et al., Proceedings 1995 IEEE International SOI Conference, Oct. 1995, pp. 129-130.

"Measurement of Transient Effects in SOI DRAM/SRAM Access Transistors", A. Wei, IEEE Electron Device Letters, vol. 17, No. 5, May 1996, pp. 193-195.

"In-Depth Analysis of Opposite Channel Based Charge Injection in SOI MOSFETs and Related Defect Creation and Annihilation", Sinha et al., Elsevier Science, Microelectronic Engineering 28, 1995, pp. 383-386.

"Dynamic Effects in SOI MOSFETs", Giffard et al., IEEE, 1991, pp. 160-161.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"A Novel Pattern Transfer Process for Bonded SOI Giga-bit DRAMs", Lee et al., Proceedings 1996 IEEE International SOI Conference, Oct. 1996, pp. 114-115.

"An Experimental 2-bit/Cell Storage DRAM for Macrocell or Memory-on-Logic Application", Furuyama et al., IEEE Journal of Solid-State Circuits, vol. 24, No. 2, Apr. 1989, pp. 388-393.

"High-Performance Embedded SOI DRAM Architecture for the Low-Power Supply", Yamauchi et al., IEEE Journal of Solid-State Circuits, vol. 35, No. 8, Aug. 2000, pp. 1169-1178.

"An SOI-DRAM with Wide Operating Voltage Range by CMOS/SIMOX Technology", Suma et al., 1994 IEEE International Solid-State Circuits Conference, pp. 138-139.

"A Capacitorless DRAM Cell on SOI Substrate", Wann et al., IEEE IEDM, 1993, pp. 635-638.

"The Multistable Charge Controlled Memory Effect in SOI Transistors at Low Temperatures", Tack et al., IEEE Workshop on Low Temperature Electronics, Aug. 7-8, 1989, University of Vermont, Burlington, pp. 137-141.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Hot-Carrier Effects in Thin-Film Fully Depleted SOI MOSFETs", Ma et al., IEEE Electron Device Letters, vol. 15, No. 6, Jun. 1994, pp. 218-220.

"Design Analysis of Thin-Body Silicide Source/Drain Devices", 2001 IEEE International SOI Conference, Oct. 2001, pp. 21-22.

"SOI MOSFET on Low Cost SPIMOX Substrate", Iyer et al., IEEE IEDM, Sep. 1998, pp. 1001-1004.

"Simulation of Floating Body Effect in SOI Circuits Using BSIM3SOI", Tu et al., Proceedings of Technical Papers (IEEE Cat No. 97$^{TH}$8303), pp. 339-342.

"High-Field Transport of Inversion-Layer Electrons and Holes Including Velocity Overshoot", Assaderaghi et al., IEEE Transactions on Electron Devices, vol. 44, No. 4, Apr. 1997, pp. 664-671.

"Dynamic Threshold-Voltage MOSFET (DTMOS) for Ultra-Low Voltage VLSI", Assaderaghi et al., IEEE Transactions on Electron Devices, vol. 44, No. 3, Mar. 1997, pp. 414-422.

"Hot-Carrier-Induced Degradation in Ultra-Thin-Film Fully-Depleted SOI MOSFETs", Yu et al., Solid-State Electronics, vol. 39, No. 12, 1996, pp. 1791-1794.

Hot-Carrier Effect in Ultra-Thin-Film (UTF) Fully-Depleted SOI MOSFET's, Yu et al., 54$^{th}$ Annual Device Research Conference Digest (Cat. No. 96$^{TH}$8193), pp. 22-23.

"SOI MOSFET Design for All-Dimensional Scaling with Short Channel, Narrow Width and Ultra-thin Films", Chan et al., IEEE IEDM, 1995, pp. 631-634.

"A Novel Silicon-On-Insulator (SOI) MOSFET for Ultra Low Voltage Operation", Assaderaghi et al., 1994 IEEE Symposium on Low Power Electronics, pp. 58-59.

"Interface Characterization of Fully-Depleted SOI MOSFET by a Subthreshold I-V Method", Yu et al., Proceedings 1994 IEEE International SOI Conference, Oct. 1994, pp. 63-64.

"A Capacitorless Double-Gate DRAM Cell Design for High Density Applications", Kuo et al., IEEE IEDM, Feb. 2002, pp. 843-846.

"A Dynamic Threshold Voltage MOSFET (DTMOS) for Ultra-Low Voltage Operation", Assaderaghi et al., IEEE IEDM, 1994, pp. 809-812.

"A Dynamic Threshold Voltage MOSFET (DTMOS) for Very Low Voltage Operation", Assaderaghi et al., IEEE Electron Device Letters, vol. 15, No. 12, Dec. 1994, pp. 510-512.

"A Capacitorless DRAM Cell on SOI Substrate", Wann et al., IEEE IEDM 1993, pp. 635-638.

"Studying the Impact of Gate Tunneling on Dynamic Behaviors of Partially-Depleted SOI CMOS Using BSIMPD", Su et al., IEEE Proceedings of the International Symposium on Quality Electronic Design (ISQED '02), Apr. 2002 (5 pages).

"Characterization of Front and Back Si-SiO$_2$ Interfaces in Thick- and Thin-Film Silicon-on-Insulator MOS Structures by the Charge-Pumping Technique", Wouters et al., IEEE Transactions on Electron Devices, vol. 36, No. 9, Sep. 1989, pp. 1746-1750.

"An Analytical Model for the Misis Structure in SOI MOS Devices", Tack et al., Solid-State Electronics vol. 33, No. 3, 1990, pp. 357-364.

"A Long Data Retention SOI DRAM with the Body Refresh Function", Tomishima et al., IEICE Trans. Electron., vol. E80-C, No. 7, Jul. 1997, pp. 899-904.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Capacitor-Less 1-Transistor DRAM", Fazan et al., 2002 IEEE International SOI Conference, Oct. 2002, pp. 10-13.

"SOI (Silicon-on-Insulator) for High Speed Ultra Large Scale Integration", C. Hu, Jpn. J. Appl. Phys. vol. 33 (1994) pp. 365-369, Part 1, No. 1B, Jan. 1994.

"Source-Bias Dependent Charge Accumulation in P+ -Poly Gate SOI Dynamic Random Access Memory Cell Transistors", Sim et al., Jpn. J. Appl. Phys. vol. 37 (1998) pp. 1260-1263, Part 1, No. 3B, Mar. 1998.

"Suppression of Parasitic Bipolar Action in Ultra-Thin-Film Fully-Depleted CMOS/SIMOX Devices by Ar-Ion Implantation into Source/Drain Regions", Ohno et al., IEEE Transactions on Electron Devices, vol. 45, No. 5, May 1998, pp. 1071-1076.

dRAM Design Using the Taper-Isolated Dynamic RAM Cell, Leiss et al., IEEE Transactions on Electron Devices, vol. ED-29, No. 4, Apr. 1982, pp. 707-714.

"Fully Isolated Lateral Bipolar-MOS Transistors Fabricated in Zone-Melting-Recrystallized Si Films on SiO2", Tsaur et al., IEEE Electron Device Letters, vol. EDL-4, No. 8, Aug. 1983, pp. 269-271.

"Silicon-On-Insulator Bipolar Transistors", Rodder et al., IEEE Electron Device Letters, vol. EDL-4, No. 6, Jun. 1983, pp. 193-195.

"Characteristics and Three-Dimensional Integration of MOSFET's in Small-Grain LPCVD Polycrystalline Silicon", Malhi et al., IEEE Transactions on Electron Devices, Vol. ED-32, No. 2, Feb. 1985, pp. 258-281.

"Triple-Wel nMOSFET Evaluated as a Capacitor-Less DRAM Cell for Nanoscale Low-Cost & High Density Applications", Villaret et al., Handout at Proceedings of 2003 Silicon Nanoelectronics Workshop, Jun. 8-9, 2003, Kyoto, Japan (2 pages).

"Mechanisms of Charge Modulation in the Floating Body of Triple-Well NMOSFET Capacitor-less DRAMs", Villaret et al., Handout at Proceedings of INFOS 2003, Jun. 18-20, 2003, Barcelona, Spain (2 pages).

"Embedded DRAM Process Technology", M. Yamawaki, Proceedings of the Symposium on Semiconductors and Integrated Circuits Technology, 1998, vol. 55, pp. 38-43.

"3-Dimensional Simulation of Turn-off Current in Partially Depleted SOI MOSFETs", Ikeda et al., IEIC Technical Report, Institute of Electronics, Information and Communication Engineers, 1998, vol. 97, No. 557 (SDM97 186-198), pp. 27-34.

"Dynamic floating body control SOI CMOS for power managed multimedia ULSIs", F. Morishita et al., Proc. CICC, pp. 263-266, 1997.

"A 312-MHz 16-Mb Random-Cycle Embedded DRAM Macro With a Power-Down Data Retention Mode for Mobile Applications", F. Morishita et al., J. Solid-State Circuits, vol. 40, No. 1, pp. 204-212, 2005.

"Leakage Mechanism due to Floating Body and Countermeasure on Dynamic Retention Mode of SOI-DRAM", F. Morishita et al., Symposium on VLSI Technology Digest of Technical Papers, pp. 141-142, 1995.

"Scalability Study on a Capacitorless 1T-DRAM: From Single-gate PD-SOI to Double-gate FINDRAM", Tanaka et al., 2004 IEEE, 4 pages.

"A Design of a Capacitorless 1-T-DRAM Cell Using Gate-induced Drain Leakage (GIDL) Current for Low-Power and High-speed Embedded Memory", Yoshida et al., 2003 IEEE, 4 pages.

"A Study of High Scalable DG-FinDRAM", Yoshida et al., IEEE Electron Device Letters, vol. 26, No. 9, Sep. 2005, pp. 655-657.

"Novel Capacitorless 1T-DRAM From Single-gate PD-SOI to Double-gate FinDRAM", ATIP Scoops, May 9, 2005, 9 pages.

"A High-Speed Clamped Bit-Line Current-Mode Sense Amplifier", T. Blalock, IEEE Journal of Solid-State Circuits, vol. 26, No. 4, Apr. 1991, pp. 542-548.

"Low-Voltage Transient Bipolar Effect Induced by Dynamic Floating-Body Charging in PD/SOI MOSFETs", Pelella et al., Final Camera Ready Art. SOI Conference, Oct. 1995, 2 pages.

"Floating-Body Concerns for SOI Dynamic Random Access Memory (DRAM)", Mandelman at al, Proceedings 1996 IEEE International SOI Conference, Oct. 1996, pp. 136-137.

"An SOI voltage-controlled bipolar-MOS device", J.P. Colinge, IEEE Transactions on Electron Devices, vol. ED-34, No. 4, Apr. 1987, pp. 845-849.

* cited by examiner

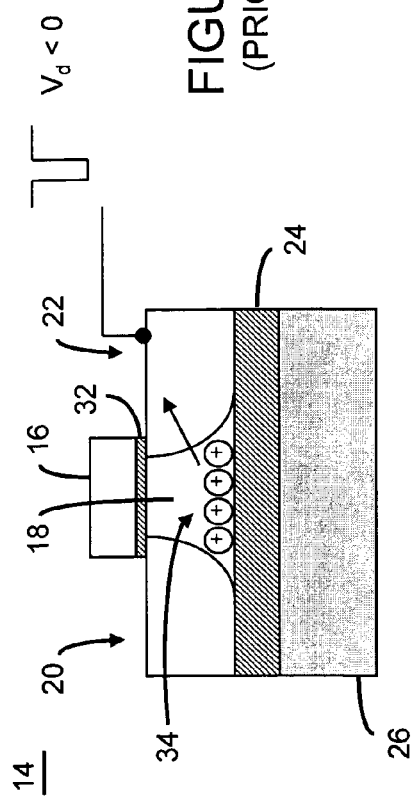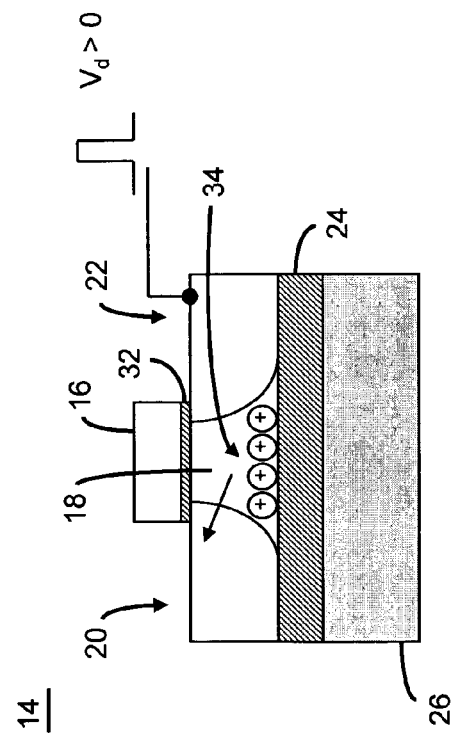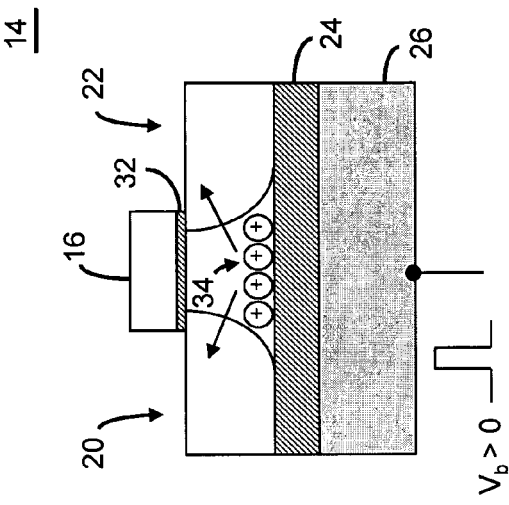
FIGURE 4A (PRIOR ART)
FIGURE 4B (PRIOR ART)
FIGURE 4C (PRIOR ART)

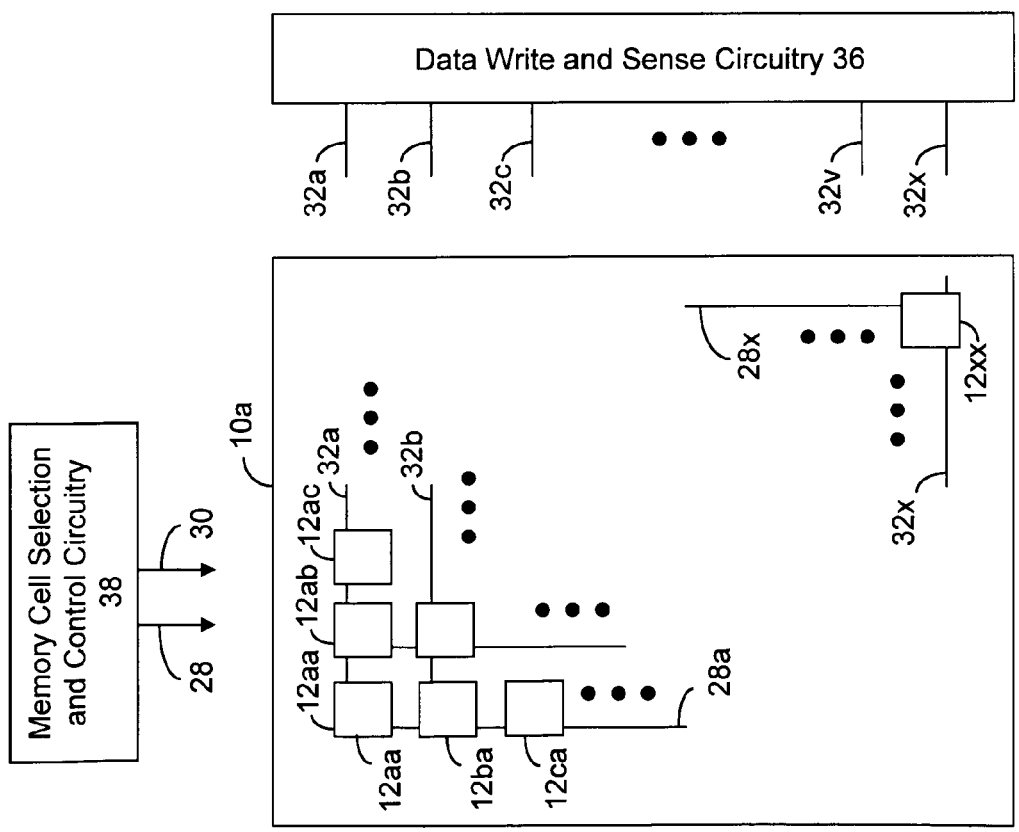

MEMORY CELL AND MEMORY CELL ARRAY HAVING AN ELECTRICALLY FLOATING BODY TRANSISTOR, AND METHODS OF OPERATING SAME

RELATED APPLICATIONS

This application claims priority to (1) U.S. Provisional Application Ser. No. 60/714,917, entitled "Semiconductor Memory Cell and Method of Operating Same", filed Sep. 7, 2005, (2) U.S. Provisional Application Ser. No. 60/722,139, entitled "Semiconductor Memory Cell and Array Using Bipolar Transistor Currents to Program Same", filed Sep. 30, 2005, (3) U.S. Provisional Application Ser. No. 60/728,061, entitled "Memory Cell, Array and Device, and Method of Operating Same", filed Oct. 19, 2005, (4) 60/749,385, entitled "Semiconductor Memory Cell and Array Using Bipolar Transistor Currents to Program and Read Same", filed Dec. 12, 2005, and (5) U.S. Provisional Application Ser. No. 60/774,275, entitled "Multilevel Memory Cell and Method for Programming and Reading Same", filed Feb. 16, 2006. The contents of these provisional applications are incorporated by reference herein in their entirety.

BACKGROUND

The inventions relate to a semiconductor memory cell, array, architecture and device, and techniques for controlling and/or operating such cell, array and device; and more particularly, in one aspect, to a dynamic random access memory ("DRAM") cell, array, architecture and device, wherein the memory cell includes an electrically floating body wherein an electrical charge is stored therein.

There is a continuing trend to employ and/or fabricate advanced integrated circuits using techniques, materials and devices that improve performance, reduce leakage current and enhance overall scaling. Semiconductor-on-Insulator (SOI) is a material in which such devices may be fabricated or disposed on or in (hereinafter collectively "on"). Such devices are known as SOI devices and include, for example, partially depleted (PD), fully depleted (FD) devices, multiple gate devices (for example, double or triple gate), and FinFET.

One type of dynamic random access memory cell is based on, among other things, the electrically floating body effect of SOI transistors. (See, for example, U.S. Pat. No. 6,969,662). In this regard, the dynamic random access memory cell may consist of a PD or a FD SOI transistor (or transistor formed in bulk material/substrate) on having a channel, which is disposed adjacent to the body and separated therefrom by a gate dielectric. The body region of the transistor is electrically floating in view of the insulation layer (or non-conductive region, for example, in a bulk-type material/substrate) disposed beneath the body region. The state of memory cell is determined by the concentration of charge within the body region of the SOI transistor.

With reference to FIGS. 1A, 1B and 1C, in one embodiment, semiconductor DRAM array 10 includes a plurality of memory cells 12 each consisting of transistor 14 having gate 16, body region 18, which is electrically floating, source region 20 and drain region 22. The body region 18 is disposed between source region 20 and drain region 22. Moreover, body region 18 is disposed on or above region 24, which may be an insulation region (for example, in an SOI material/substrate) or non-conductive region (for example, in a bulk-type material/substrate). The insulation or non-conductive region 24 may be disposed on substrate 26.

Data is written into or read from a selected memory cell by applying suitable control signals to a selected word line(s) 28, a selected source line(s) 30 and/or a selected bit line(s) 32. In response, charge carriers are accumulated in or emitted and/or ejected from electrically floating body region 18 wherein the data states are defined by the amount of carriers within electrically floating body region 18. Notably, the entire contents of the '662 patent, including, for example, the features, attributes, architectures, configurations, materials, techniques and advantages described and illustrated therein, are incorporated by reference herein.

The memory cell 12 of DRAM array 10 operates by accumulating in or emitting/ejecting majority carriers (electrons or holes) 34 from body region 18. (See, for example, the N-channel transistor in FIGS. 2A and 2B). In this regard, conventional write techniques may accumulate majority carriers (in this example, "holes") 34 in body region 18 of memory cells 12 by, for example, impact ionization near source region 20 and/or drain region 22. (See, FIG. 2A). The majority carriers 30 may be emitted or ejected from body region 18 by, for example, forward biasing the source/body junction and/or the drain/body junction. (See, FIG. 2B).

Notably, for at least the purposes of this discussion, logic high or logic "1" corresponds to, for example, an increased concentration of majority carries in the body region relative to an unprogrammed device and/or a device that is programmed with logic low or logic "0". In contrast, logic low or logic "0" corresponds to, for example, a reduced concentration of majority carries in the body region relative to an unprogrammed device and/or a device that is programmed with logic high or logic "1".

In one conventional technique, the memory cell is read by applying a small bias to the drain of the transistor as well as a gate bias which is above the threshold voltage of the transistor. In this regard, in the context of memory cells employing N-type transistors, a positive voltage is applied to one or more word lines 28 to enable the reading of the memory cells associated with such word lines. The amount of drain current is determined/affected by the charge stored in the electrically floating body region of the transistor. As such, conventional reading techniques sense the amount of the channel current provided/generated in response to the application of a predetermined voltage on the gate of the transistor of the memory cell to determine the state of the memory cell; a floating body memory cell may have two or more different current states corresponding to two or more different logical states (for example, two different current conditions/states corresponding to the two different logical states: "1" and "0").

In sum, conventional writing programming techniques for memory cells having an N-channel type transistor often provide an excess of majority carriers by channel impact ionization (see, FIG. 3A) or by band-to-band tunneling (gate-induced drain leakage "GIDL") (see, FIG. 3B). The majority carrier may be removed via drain side hole removal (see, FIG. 4A), source side hole removal (see, FIG. 4B), or drain and source hole removal, for example, using the back gate pulsing (see, FIG. 4C).

Notably, conventional programming/reading techniques often lead to relatively large power consumption (due to, for example, high writing "0" current) and relatively small memory programming window. The present inventions, in one aspect, are directed to a combination of the programming/reading methods which allows relatively low power memory programming and provides a relatively larger memory programming window (e.g., both relative to at least the conventional programming techniques). This new approach may also provide a floating body memory cell that may be less sensitive to the technology variations and may include improved retention characteristics.

SUMMARY OF THE INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In one aspect, the present inventions are directed to an integrated circuit device (for example, a logic or discrete memory device) including a memory cell including an electrically floating body transistor (for example, an N-channel type transistor or a P-channel type transistor). The electrically floating body transistor includes a source region, a drain region, a body region disposed between the source region and the drain region, wherein the body region is electrically floating, and a gate disposed over the body region. The memory cell includes (i) a first data state which is representative of a first charge in the body region of the electrically floating body transistor, and (ii) a second data state which is representative of a second charge in the body region of the electrically floating body transistor. The integrated circuit device further includes data write circuitry, coupled to the memory cell, to apply (i) first write control signals to the memory cell to write the first data state therein and (ii) second write control signals to the memory cell to write the second data state therein, wherein, in response to first write control signals applied to the memory cell, the electrically floating body transistor generates a first bipolar transistor current which substantially provides the first charge in the body region of the electrically floating body transistor. In this regard, the first write control signals cause, provide, produce and/or induce the first bipolar transistor current.

In one embodiment, the first write control signals include a signal applied to the gate and a signal applied to the source region wherein the signal applied to the source region includes a first voltage having a first amplitude and a second voltage having a second amplitude. In another embodiment, the first write control signals include a signal applied to the gate and a signal applied to the drain region wherein the signal applied to the drain region includes a first voltage having a first amplitude and a second voltage having a second amplitude.

In yet another embodiment, the first write control signals include a signal applied to the gate and a signal applied to the source region to cause, provide, produce and/or induce the first bipolar transistor current. In this embodiment, the signal applied to the source region includes a first voltage having a first amplitude and a second voltage having a second amplitude and the signal applied to the gate includes a third voltage having a third amplitude and a fourth voltage having a fourth amplitude.

The first write control signals, in another embodiment, include a signal applied to the gate and a signal applied to the drain region, wherein (i) the signal applied to the drain region includes a first voltage having a first amplitude and a second voltage having a second amplitude and (ii) the signal applied to the gate includes a third voltage having a third amplitude and a fourth voltage having a fourth amplitude.

In other embodiments, the first write control signals include a signal applied to the gate and a signal applied to the drain region wherein, in response to the first bipolar transistor current, majority carriers are generated in the electrically floating body region. In this embodiment, signal applied to the gate may temporally change relative to the signal applied to the drain region to cause, provide, produce and/or induce the majority carriers to accumulate in a portion of the electrically floating body region that is juxtaposed or near a gate dielectric which is disposed between the gate and the electrically floating body region. Indeed, the signal applied to the gate may change or terminate before the signal applied to the drain region.

In certain embodiments, the second write control signals include a signal applied to the gate, a signal applied to the source region, and a signal applied to the drain region. The signal applied to the drain region may include a blocking voltage to prevent the first data state from being written into the electrically floating body transistor.

The integrated circuit device may further include data sense circuitry, coupled to the memory cell, to sense the data state of the memory cell. In response to read control signals applied to the memory cell, the electrically floating body transistor may generate a second bipolar transistor current which is representative of the data state of the memory cell and wherein the data sense circuitry determines the data state of the memory cell at least substantially based on the second bipolar transistor current. In one embodiment, the second bipolar transistor current is representative of the first data state.

The read control signals may include a signal applied to the gate, source region, and drain region to cause, force and/or induce the bipolar transistor current which is representative of the data state of the memory cell. The signal applied to the drain region may include a positive voltage pulse or a negative voltage pulse. Indeed, one or more of the read control signals may include a constant or unchanging voltage amplitude (for example, ground).

In another aspect, the present inventions are directed to an integrated circuit device (for example, a logic or discrete memory device) comprising a memory cell array including a plurality of word lines, plurality of source lines, plurality of bit lines, and plurality of memory cells arranged in a matrix of rows and columns. Each memory cell includes an electrically floating body transistor (for example, an N-channel type transistor or a P-channel type transistor), wherein the electrically floating body transistor includes a source region coupled to an associated source line, a drain region, a body region disposed between the source region and the drain region coupled to an associated bit line, wherein the body region is electrically floating, and a gate disposed over the body region and coupled to an associated word line. The memory cell includes (i) a first data state which is representative of a first charge in the body region of the electrically floating body transistor, and (ii) a second data state which is representative of a second charge in the body region of the electrically floating body transistor.

In this aspect of the inventions, the source region of the electrically floating body transistor of each memory cell of a first row of memory cells is connected to a first source line.

The integrated circuit device of this aspect of the inventions further includes data write circuitry, coupled to the first row of memory cells, to apply (i) first write control signals to the memory cells to write the first data state therein and (ii) second write control signals to the memory cells to write the second data state therein. In response to first write control signals applied to at least a portion of the memory cells of the first row of memory cells, the electrically floating body transistor of each such memory cell of the first row generates a first bipolar transistor current which at least substantially provides the first charge in the body region of the electrically floating body transistor of the each such memory cells.

In one embodiment, the source region of the electrically floating body transistor of each memory cell of a second row of memory cells is connected to the first source line. In another embodiment, the source region of the electrically floating body transistor of each memory cell of a second row of memory cells is connected to a second source line, and the source region of the electrically floating body transistor of each memory cell of a third row of memory cells is connected to a second source line. In this embodiment, the second and third rows of memory cells are adjacent to the first row of memory cells.

In another embodiment, the first write control signals cause, provide, produce and/or induce the first bipolar transistor current. The first write control signals may include a signal applied to the gate which includes a first voltage having a first amplitude and a second voltage having a second amplitude. The write control signals may include a signal applied to the source region which includes a first voltage having a first amplitude and a second voltage having a second amplitude. Moreover, the first write control signal includes a signal applied to the drain region which includes a first voltage having a first amplitude and a second voltage having a second amplitude.

In certain embodiments, the data write circuitry, prior to applying the first write control signals, applies the second write control signals to all of all of the memory cells of the first row of memory cells to write the second data state therein. In certain other embodiments, the data write circuitry at least substantially simultaneously applies (i) the first write control signals to the portion of the memory cells of the first row of memory cells to write the first data state therein, and (ii) the second write control signals to the other portion of the memory cells of the first row of memory cells to write the second data state therein.

In one embodiment, the first write control signals may include a signal applied to the gate and a signal applied to the source region of the electrically floating body transistors of a one or more memory cells of the first row of memory cells to cause, provide, produce and/or induce the first bipolar transistor current, wherein (i) the signal applied to the source region includes a first voltage having a first amplitude and a second voltage having a second amplitude, and (ii) the signal applied to the gate includes a third voltage having a third amplitude and a fourth voltage having a fourth amplitude. In another embodiment, the first write control signals include a signal applied to the gate and a signal applied to the drain region of the electrically floating body transistors of a one or more memory cells of the first row of memory cells to cause, provide, produce and/or induce the first bipolar transistor current, wherein (i) the signal applied to the drain region includes a first voltage having a first amplitude and a second voltage having a second amplitude, and (ii) the signal applied to the gate includes a third voltage having a third amplitude and a fourth voltage having a fourth amplitude. In a preferred embodiment, the signal having the fourth voltage is applied to the gate before the signal having the second voltage is applied to the drain.

The integrated circuit device of this aspect of the present inventions may further include data sense circuitry, coupled to each memory cell of the plurality of memory cells, to sense the data state of the memory cell. In response to read control signals applied to the memory cells, the electrically floating body transistor of each memory cell generates a second bipolar transistor current which is representative of the data state of the memory cell. The data sense circuitry determines the data state of the memory cell substantially based on the second bipolar transistor current. In one embodiment, the second bipolar transistor current is representative of the first data state.

The read control signals may include a signal applied to the gate, source region, and drain region to cause, force and/or induce the bipolar transistor current which is representative of the data state of the memory cell. The signal applied to the drain region may include a positive voltage pulse or a negative voltage pulse. Indeed, one or more of the read control signals may include a constant or unchanging voltage amplitude (for example, ground).

In yet another aspect, the present inventions are directed to an integrated circuit device (for example, a logic or discrete memory device) including a memory cell consisting essentially of an electrically floating body transistor (for example, an N-channel type transistor or a P-channel type transistor). The electrically floating body transistor includes a source region, a drain region, a body region disposed between the source region and the drain region, wherein the body region is electrically floating, and a gate disposed over the body region. The memory cell includes (i) a first data state which is representative of a first charge in the body region of the electrically floating body transistor, and (ii) a second data state which is representative of a second charge in the body region of the electrically floating body transistor. The integrated circuit device further includes data write circuitry, coupled to the memory cell, to apply (i) first write control signals to the memory cell to write the first data state therein and (ii) second write control signals to the memory cell to write the second data state therein, wherein, in response to first write control signals applied to the memory cell, the electrically floating body transistor generates a first bipolar transistor current which substantially provides the first charge in the body region of the electrically floating body transistor. In this regard, the first write control signals cause, provide, produce and/or induce the first bipolar transistor current.

The first write control signals may include a signal applied to the gate and a signal applied to the source region wherein the signal applied to the source region includes a first voltage having a first amplitude and a second voltage having a second amplitude. Alternatively, the first write control signals include a signal applied to the gate and a signal applied to the drain region wherein the signal applied to the drain region includes a first voltage having a first amplitude and a second voltage having a second amplitude.

The first write control signals may include a signal applied to the gate and a signal applied to the source region to cause, provide, produce and/or induce the first bipolar transistor current. In this embodiment, the signal applied to the source region includes a first voltage having a first amplitude and a second voltage having a second amplitude. In addition, the signal applied to the gate includes a third voltage having a third amplitude and a fourth voltage having a fourth amplitude.

The first write control signals, in one embodiment, include a signal applied to the gate and a signal applied to the drain region, wherein (i) the signal applied to the drain region includes a first voltage having a first amplitude and a second voltage having a second amplitude and (ii) the signal applied to the gate includes a third voltage having a third amplitude and a fourth voltage having a fourth amplitude.

In other embodiments, the first write control signals include a signal applied to the gate and a signal applied to the drain region wherein, in response to the first bipolar transistor current, majority carriers are generated in the electrically floating body region. In this embodiment, signal applied to the gate may temporally change relative to the signal applied to the drain region to cause, provide, produce and/or induce the majority carriers to accumulate in a portion of the electrically floating body region that is juxtaposed or near a gate dielectric which is disposed between the gate and the electrically floating body region. Indeed, the signal applied to the gate may change or terminate before the signal applied to the drain region.

In certain embodiments, the second write control signals include a signal applied to the gate, a signal applied to the source region, and a signal applied to the drain region. The signal applied to the drain region may include a blocking voltage to prevent the first data state from being written into the electrically floating body transistor.

The integrated circuit device may further include data sense circuitry, coupled to the memory cell, to sense the data state of the memory cell. In response to read control signals applied to the memory cell, the electrically floating body transistor may generate a second bipolar transistor current which is representative of the data state of the memory cell and wherein the data sense circuitry determines the data state of the memory cell at least substantially based on the second bipolar transistor current. In one embodiment, the second bipolar transistor current is representative of the first data state.

The read control signals may include a signal applied to the gate, source region, and drain region to cause, force and/or induce the bipolar transistor current which is representative of the data state of the memory cell. The signal applied to the drain region may include a positive voltage pulse or a negative voltage pulse. Indeed, one or more of the read control signals may include a constant or unchanging voltage amplitude (for example, ground).

Again, there are many inventions, and aspects of the inventions, described and illustrated herein. This Summary of the Inventions is not exhaustive of the scope of the present inventions. Moreover, this Summary of the Inventions is not intended to be limiting of the inventions and should not be interpreted in that manner. While certain embodiments have been described and/or outlined in this Summary of the Inventions, it should be understood that the present inventions are not limited to such embodiments, description and/or outline, nor are the claims limited in such a manner. Indeed, many other embodiments, which may be different from and/or similar to, the embodiments presented in this Summary, will be apparent from the description, illustrations and claims, which follow. In addition, although various features, attributes and advantages have been described in this Summary of the Inventions and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

FIGS. 4A-4C are exemplary schematics and general illustrations of conventional methods to program a memory cell to logic state "0" (i.e., provide relatively fewer majority carrier by removing majority carriers from the electrically floating body of the transistor of the memory cell of FIG. 1B; majority carriers may be removed through the drain region/terminal of the transistor (FIG. 4A), the source region/terminal of the transistor (FIG. 4B), and through both drain and source regions/terminals of the transistor via using the back gate pulses applied to the substrate/backside terminal of the transistor of the memory cell (FIG. 4C);

FIGS. 12A and 12B are schematic block diagrams of embodiments of an integrated circuit device including, among other things, a memory cell array, data sense and write circuitry, memory cell selection and control circuitry, according certain aspects of the present inventions;

DETAILED DESCRIPTION

At the outset, it should be noted that there are many inventions described herein as well as many aspects and embodiments of those inventions. In one aspect, the present inventions are directed to techniques to control and/or operate a semiconductor memory cell (and memory cell array having a plurality of such memory cells as well as an integrated circuit device including a memory cell array) having one or more electrically floating body transistors in which an electrical charge is stored in the body region of the electrically floating body transistor. The techniques of the present inventions may employ intrinsic bipolar transistor currents to control, write and/or read a data state in such a memory cell. In this regard, the present inventions may employ the intrinsic bipolar transistor current to control, write and/or read a data state in/of the electrically floating body transistor of the memory cell.

The present inventions, in addition thereto or in lieu thereof, may employ band-to-band tunneling to write a data state in the electrically floating body memory cell and an intrinsic bipolar transistor current generated by the electrically floating body transistor to read and/or determine the data state of the memory cell. In this embodiment, however, during the read operation, the data state is determined primarily by, sensed substantially using and/or based substantially on the bipolar transistor current that is responsive to the read control signals and significantly less by the interface channel current component, which is less significant and/or negligible relatively to the bipolar component.

The present inventions are also directed to semiconductor memory cell, array, circuitry and device to implement such control and operation techniques. Notably, the memory cell and/or memory cell array may comprise a portion of an integrated circuit device, for example, logic device (such as, a microcontroller or microprocessor) or a portion of a memory device (such as, a discrete memory).

Figure 6A:
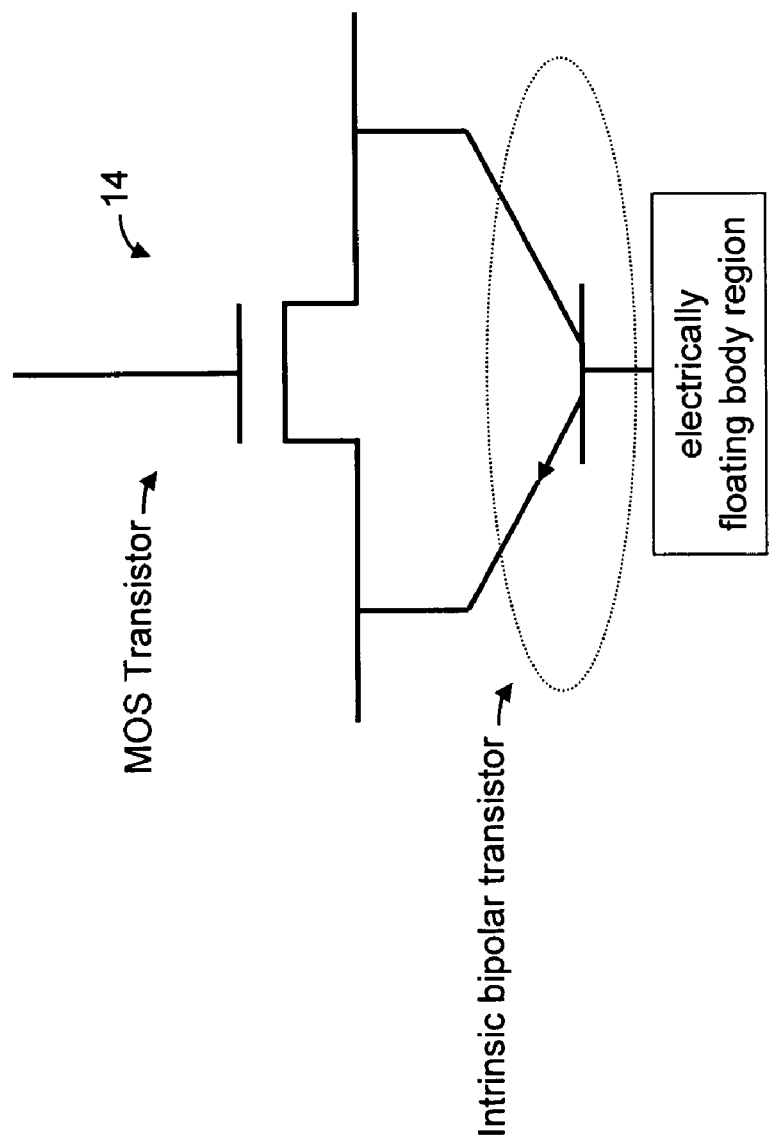
FIG. 6A is a schematic representation of an equivalent electrically floating body memory cell (N-channel type) including an intrinsic bipolar transistor in addition to the MOS transistor.

With reference to FIG. 6A, in one embodiment, electrically floating body transistor 14 may be schematically illustrated as including a MOS transistor "component" and an intrinsic bipolar transistor "component". In one aspect, the present inventions employ the intrinsic bipolar transistor "component" to program/write as well as read memory cell 12. In this regard, the intrinsic bipolar transistor generates and/or produces a bipolar transistor current which is employed to program/write the data state in memory cell 12 and read the data state of memory cell 12. Notably, in this exemplary embodiment, electrically floating body transistor 14 is an N-channel device. As such, majority carriers 34 are "holes".

Figure 6B:
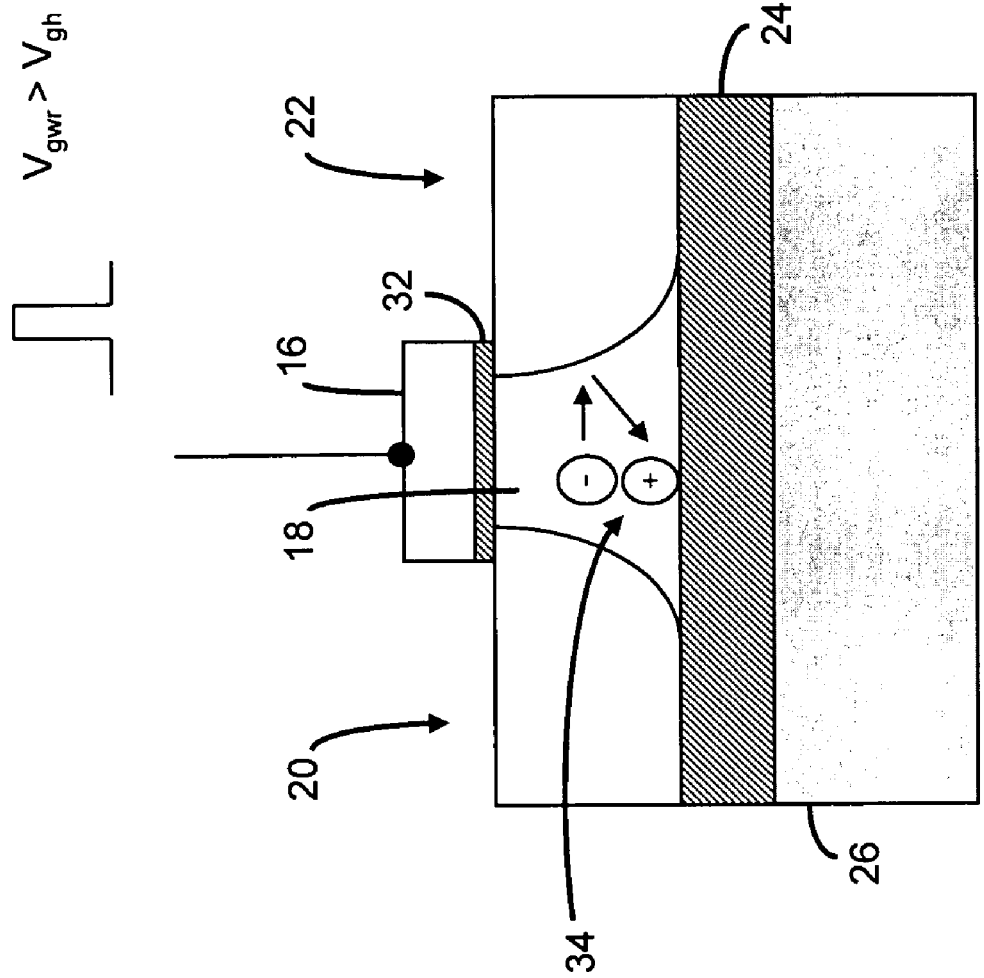
FIG. 6B is a schematic representation (and control signal voltage relationship) of an exemplary embodiment of an aspect of the present inventions of programming a memory cell to logic state "1" by generating, storing and/or providing an excess of majority carriers in the electrically floating body of the transistor of the memory cell in accordance with certain aspects and/or embodiments of the present inventions.
Figure 6C:
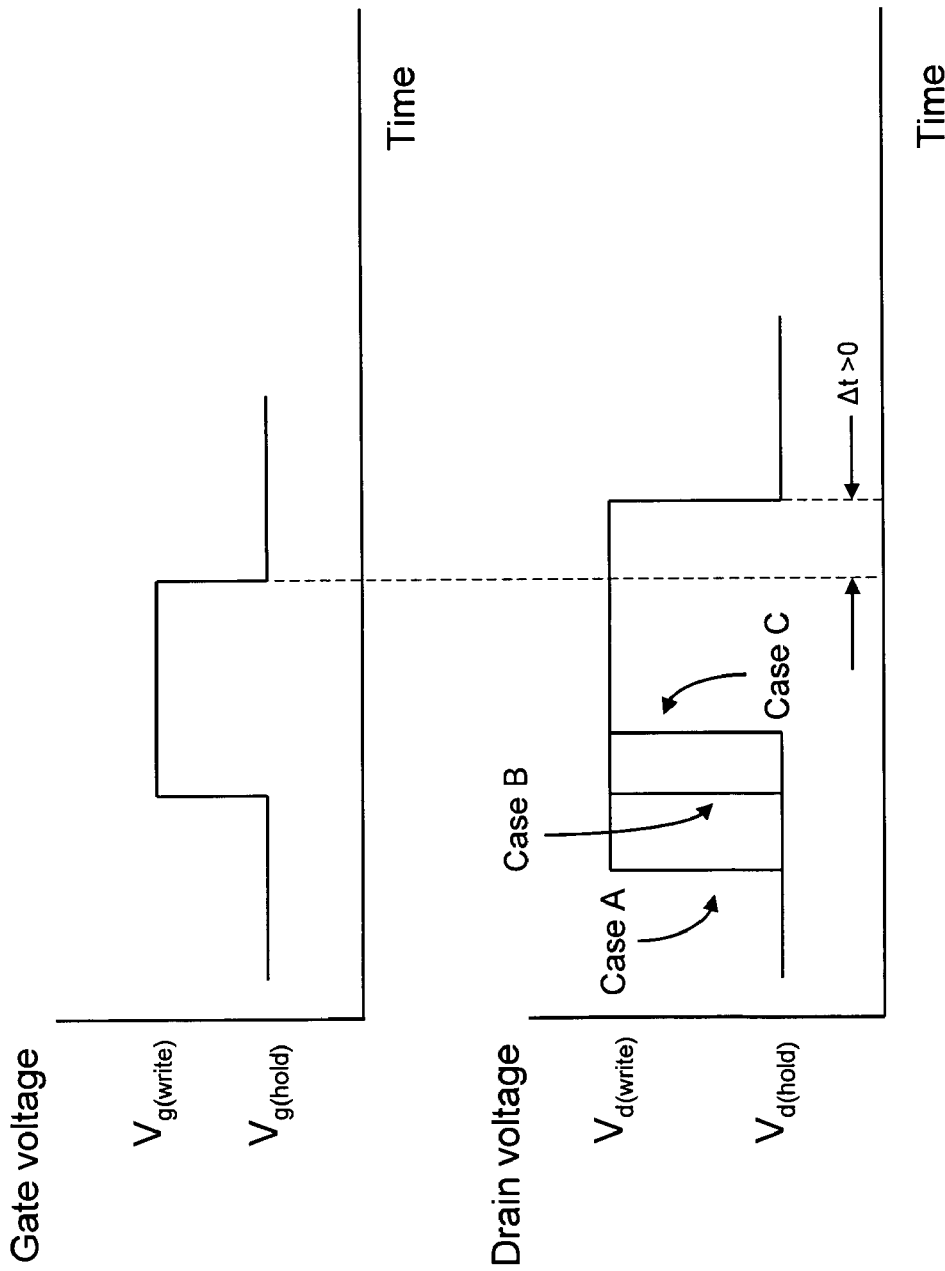
FIG. 6C illustrates three exemplary relationships of selected control signals to program or write logic state "1" into a memory cell in accordance with certain aspects and/or embodiments of the present inventions; notably, in this illustration the gate and drain control signal sequences are illustrated whereby the control signal applied to the drain region may be applied before the signal is applied to the gate of the transistor (Case A), simultaneously (Case B), or after the control signal is applied to the gate (Case C)

With reference to FIGS. 6A-6C, in operation, when writing or programming logic "1", in one embodiment, control signals having predetermined voltages (for example, Vg=0v, Vs=0v, and Vd=3v) are applied to gate 16, source region 20 and drain region 22 (respectively) of transistor 14 of memory cell 12. Such control signals generate or provide a bipolar current in electrically floating body region 18 of transistor 14. The bipolar current causes or produces impact ionization and/or the avalanche multiplication phenomenon in electrically floating body region 18. In this way, an excess of majority carriers is produced, provided and/or generated in electrically floating body region 18 of transistor 14 of memory cell 12. Thus, in this embodiment, the predetermined voltages of the control signals program or write logic "1" in memory cell 12 via impact ionization and/or avalanche multiplication in electrically floating body region 18, caused or produced by a bipolar current in body region 18 of transistor 14 of memory cell 12.

Notably, it is preferred that the bipolar transistor current responsible for impact ionization and/or avalanche multiplication in electrically floating body region 18 is initiated or induced by the control signal applied to gate 16 of transistor 14. Such a control signal may induce channel impact ionization which raises or increases the potential of body region 18 and "turns on", produces, causes and/or induces a bipolar current in transistor 14. One advantage of the proposed writing/programming technique is that a large amount of the excess majority carriers may be generated and stored in electrically floating body region 18 of transistor 14.

With reference to FIG. 6C, the control signal applied to drain region 22 of transistor 14 may be applied before the control signal is applied to the gate, simultaneously thereto, or after the control signal is applied to the gate (Cases A, B, C, respectively). From a relative timing perspective, it is preferred that the control signal applied to drain region 22 temporally extends beyond or continues after the control signal which is applied to gate 16 ceases. (See, for example, Case C of FIG. 6C). In this way, majority carriers 34 are generated in electrically floating body region 18 via the bipolar current, and majority carriers 34 may accumulate (and be stored) in a portion of electrically floating body region 18 of the transistor of memory cell(s) 12 that is juxtaposed or near gate dielectric 32 (which is disposed between gate 16 and electrically floating body region 18).

In another embodiment for programming or writing logic "1" into memory cell 12, the control signals having predetermined voltages (for example, Vg=−3v, Vs=−0.5v and Vd=1v) are applied to gate 16 and source region 20 and drain region 22 (respectively) to initiate or induce band-to-band tunneling. In this way, an excess of majority carriers are generated and stored in electrically floating body region 18 of transistor 14.

Figure 7:
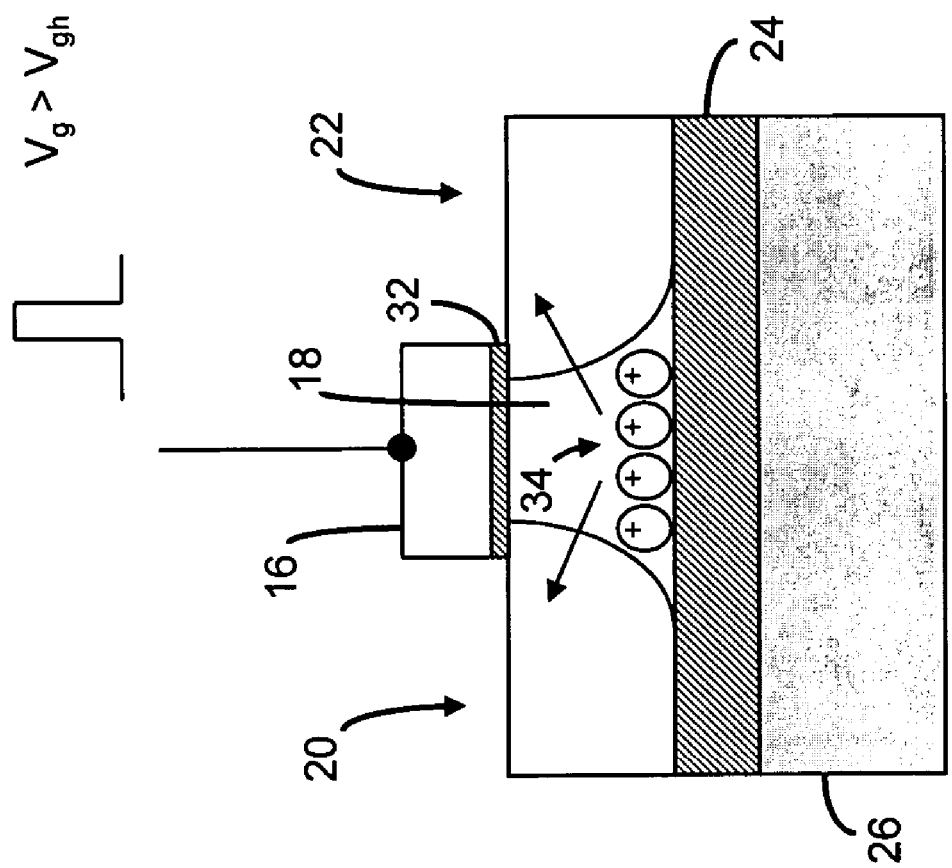
FIG. 7 illustrates an exemplary schematic (and control signal) of an exemplary embodiment of an aspect of the present inventions of programming a memory cell to logic state "0" by generating, storing and/or providing relatively fewer majority carriers (as compared to the number of majority carriers in the electrically floating body of the memory cell that is programmed to logic state "1") in the electrically floating body region of the transistor of the memory cell, wherein the majority carrier are removed (write "0") through both drain and source regions/terminals by applying a control signal (for example, a programming pulse) to the gate of the transistor of the memory cell.

With reference to FIG. 7, in one exemplary embodiment, memory cell 12 may be programmed to logic "0" by applying control signals having predetermined voltages to gate 16, source region 20 and drain region 22 (for example, Vg=1.5v, Vs=0v and Vd=0v, respectively). In response, majority carriers may be removed from electrically floating body region 18 of transistor 14. In one embodiment, the majority carriers are removed, eliminated or ejected from body region 18 through source region 20 and drain region 22. (See, FIG. 7). In another embodiment, the majority carriers may be removed, eliminated or ejected from body region 18 substantially through source region 20 or drain region 22.

The transistor 14 of memory cell 12 may be programmed to logic "0" by applying control signals, having predetermined voltages, to gate 16, source region 20 and drain region 22 of transistor 14 (for example, Vg=0v, Vs=−0.4v and Vd=−1.5v, respectively). In this embodiment, it is preferred that the gate-to-source voltage is below the threshold voltage of transistor 14. In this way, the power consumption during "0" writing may be even further reduced.

Notably, the control signal applied to gate 16 to write or program logic "0" is different from and, in at least one embodiment, higher than a holding voltage (discussed below) that may be applied to the gates of transistors 14 of other memory cells 12 (for example, other memory cells in a memory cell array). In this way, the impact of the write operation on the other memory cells is minimized and/or reduced.

The illustrated/exemplary voltage levels to implement the write operations are merely exemplary. The control signals increase the potential of electrically floating body region 18 which "turns on", produces, causes and/or induces a bipolar current in the transistor of the memory cell. In the context of a write operation, the bipolar current generates majority carriers in the electrically floating body region which are then stored. In the context of a write operation, the bipolar current generates majority carriers in the electrically floating body region which are then stored. In the context of a read operation, the data state may be determined primarily by, sensed substantially using and/or based substantially on the bipolar transistor current that is responsive to the read control signals and significantly less by the interface channel current component, which is less significant and/or negligible relatively to the bipolar component.

Accordingly, the voltage levels to implement the write operations are merely exemplary. Indeed, the indicated voltage levels may be relative or absolute. Alternatively, the voltages indicated may be relative in that each voltage level, for example, may be increased or decreased by a given voltage amount (for example, each voltage may be increased or decreased by 0.5, 1.0 and 2.0 volts) whether one or more of the voltages (for example, the source, drain or gate voltages) become or are positive and negative.

Notably, the inventive programming technique may consume less power relative to conventional techniques of FIGS. 4A and 4B. In this regard, the current for writing or programming to logic "0" is smaller when compared to such conventional techniques. Moreover, the programming techniques of the present inventions may be implemented without employing a back gate terminal (Compare, FIG. 4C).

In one embodiment, the memory cell 12 may be implemented in a memory cell array. When a memory cell is implemented in a memory cell array configuration, it may be advantageous to implement a "holding" operation or condition to certain memory cells when programming one or more other memory cells of the array in order to improve or enhance the retention characteristics of such certain memory cells. In this regard, the transistor of the memory cell may be placed in a "holding" state via application of control signals (having predetermined voltages) which are applied to the gate and the source and drain regions of the transistor of the memory cells which are not involved in the write or read operations.

Figure 8:
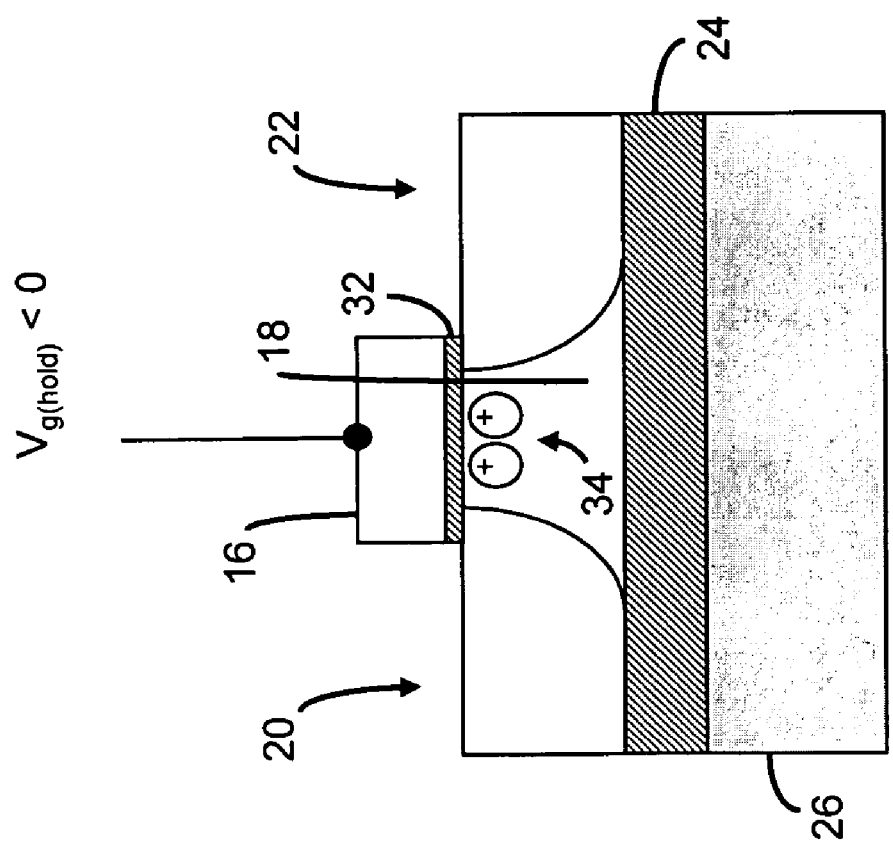
FIG. 8 illustrates an exemplary schematic (and control signal) of an exemplary embodiment of an aspect of the present inventions of holding or maintaining the data state of a memory cell when programming, for example, a neighboring memory cell to a predetermined data state (for example, logic state "1" and/or logic state "0")
Figure 9:
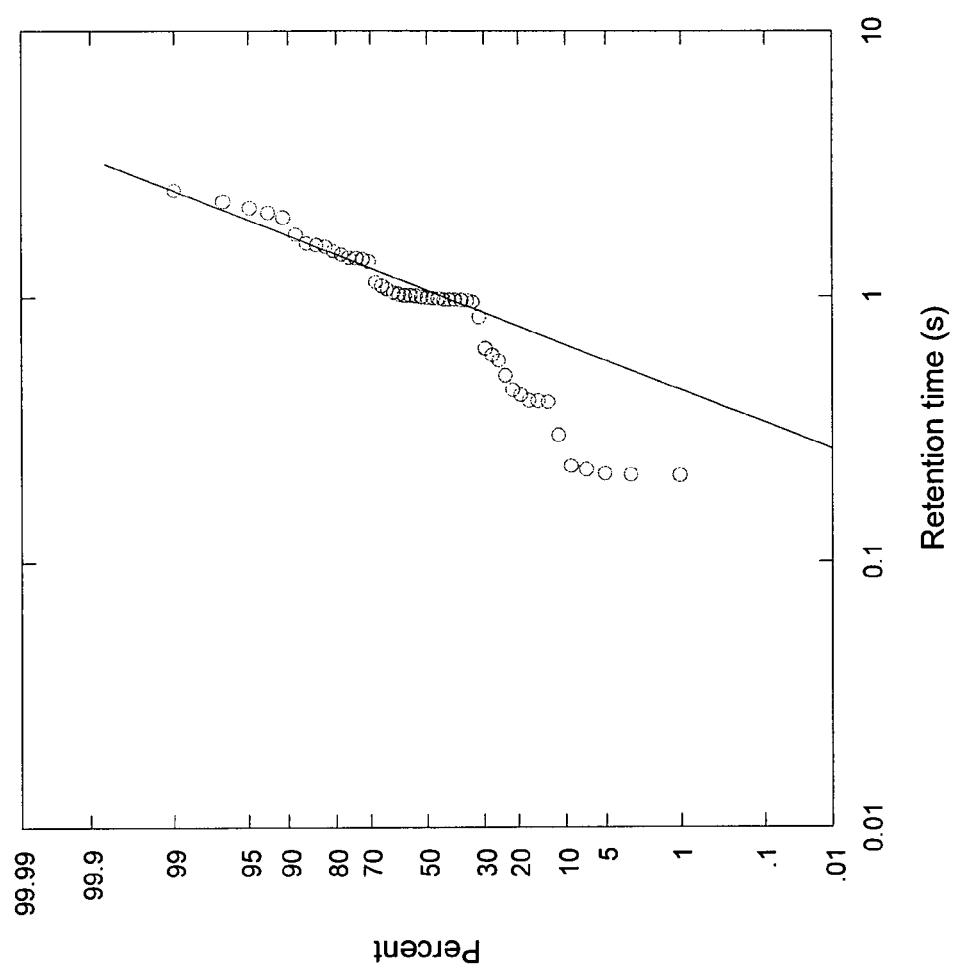
FIG. 9 is a graphical representation of the exemplary retention time distribution of a memory cell implementing one or more aspect of the present inventions.

For example, with reference to FIG. 8, such control signals provide, cause and/or induce majority carrier accumulation in an area that is close to the interface between gate dielectric 32 and electrically floating body 18. In this embodiment, it may be preferable to apply a negative voltage to gate 16 where transistor 14 is an N-channel type transistor 14. The proposed holding condition may provide enhanced retention characteristics (See, for example, FIG. 9).

Figure 10:
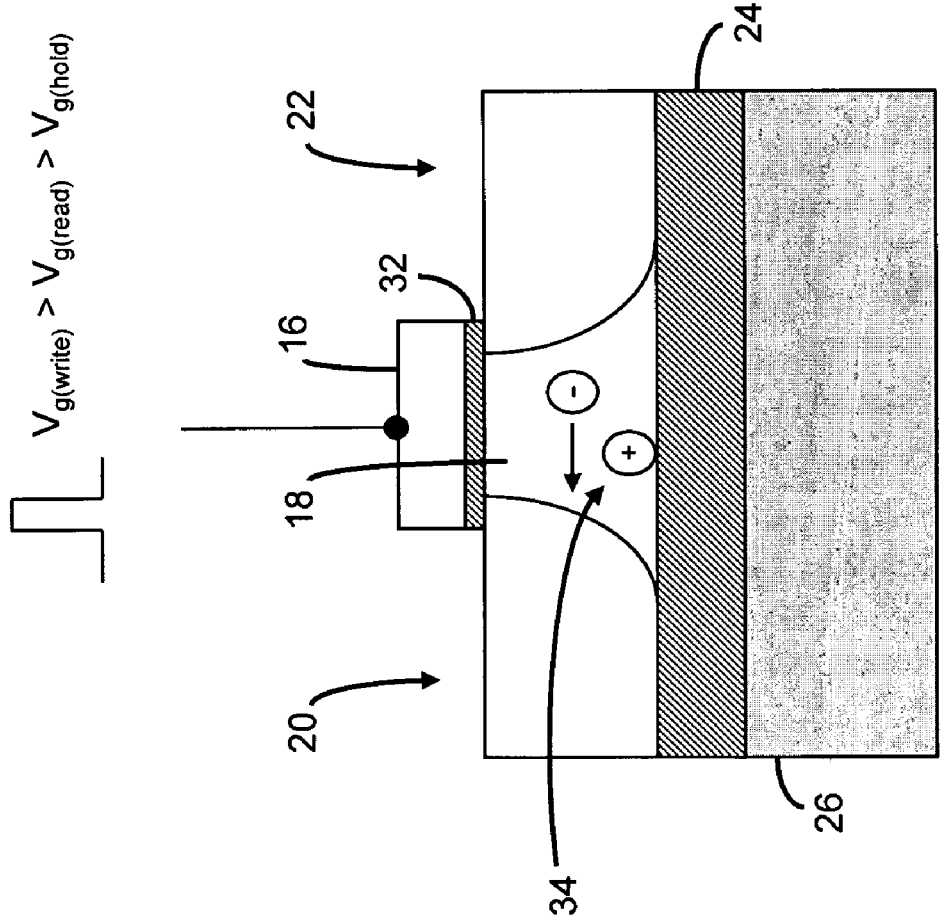
FIG. 10 illustrates an exemplary schematic (and control signal) of an exemplary embodiment of an aspect of the present inventions of reading the data state of a memory cell by sensing the amount of the current provided/generated in response to the application of a predetermined voltage on the gate of the transistor of the memory cell.

With reference to FIG. 10, in one embodiment, the data state of memory cell 12 may be read and/or determined by applying control signals having predetermined voltages to gate 16 and source region 20 and drain region 22 of transistor 14 (for example, Vg=−0.5v, Vs=3v and Vd=0v, respectively). Such control signals, in combination, induce and/or cause a bipolar transistor current in memory cells 12 that are programmed to logic "1". The bipolar transistor current may be considerably larger than a channel current. As such, sensing circuitry (for example, a cross-coupled sense amplifier), which is coupled to transistor 14 (for example, drain region 22) of memory cell 12, senses the data state using primarily and/or based substantially on the bipolar transistor current. Notably, for those memory cells 12 that are programmed to logic "0", such control signals induce, cause and/or produce little to no bipolar transistor current (for example, a considerable, substantial or sufficiently measurable bipolar transistor current).

Figure 1A:
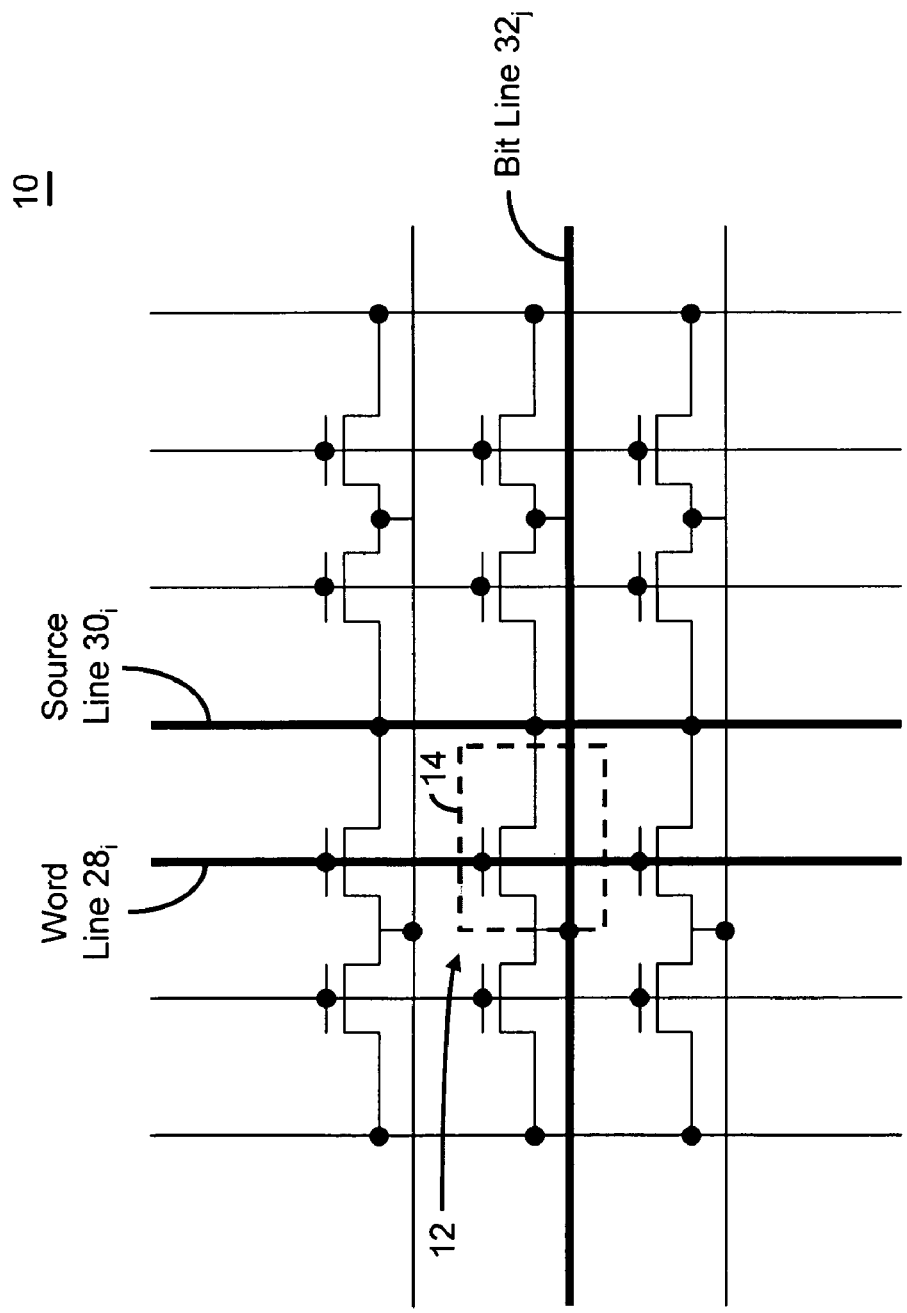
FIG. 1A is a schematic representation of a prior art DRAM array including a plurality of memory cells comprised of one electrically floating body transistor.
Figure 1B:
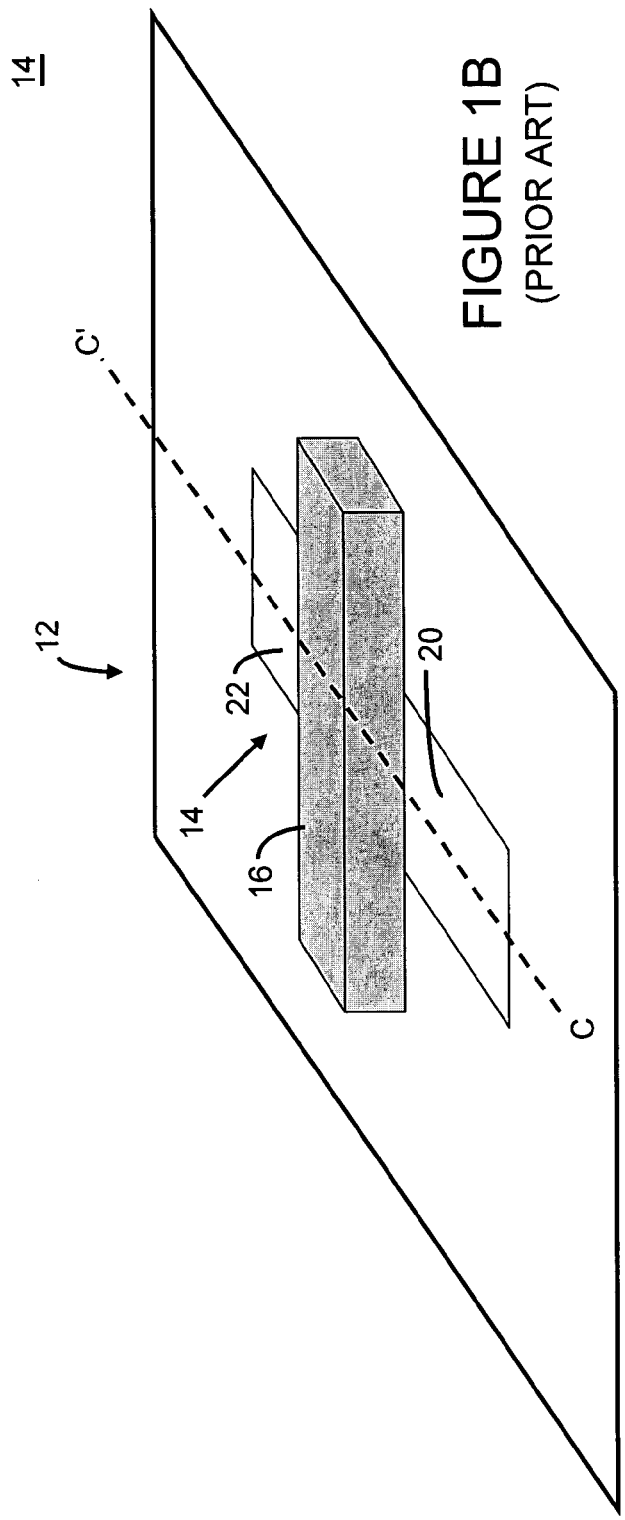
FIG. 1B is a three-dimensional view of an exemplary prior art memory cell comprised of one electrically floating body partially depleted transistor (PD-SOI NMOS)
Figure 1C:
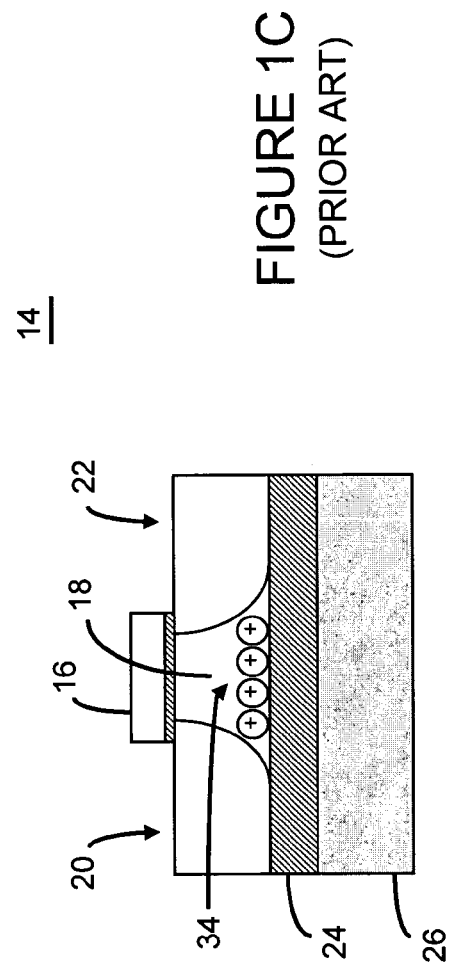
FIG. 1C is a cross-sectional view of the prior art memory cell of FIG. 1B, cross-sectioned along line C-C'.
Figure 2A:
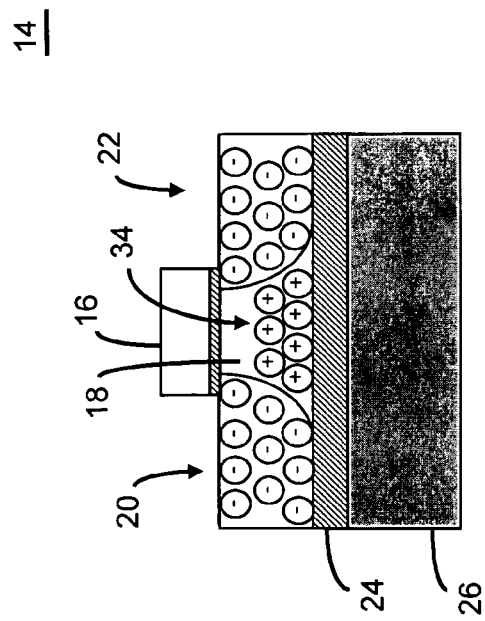
FIGS. 2A and 2B are exemplary schematic illustrations of the charge relationship, for a given data state, of the floating body, source and drain regions of a prior art memory cell comprised of one electrically floating body transistor (PD-SOI NMOS)
Figure 2B:
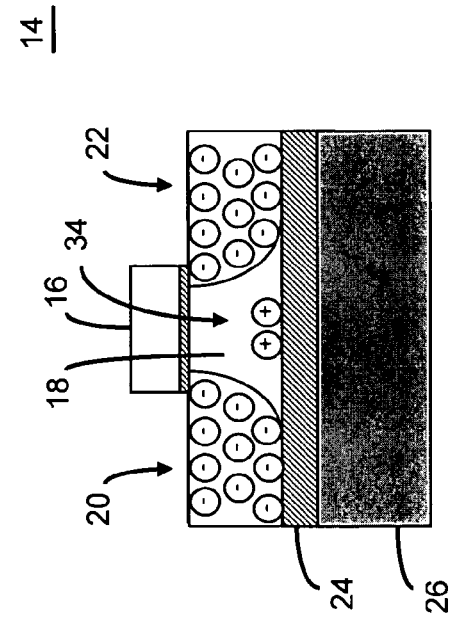
Figure 3A:
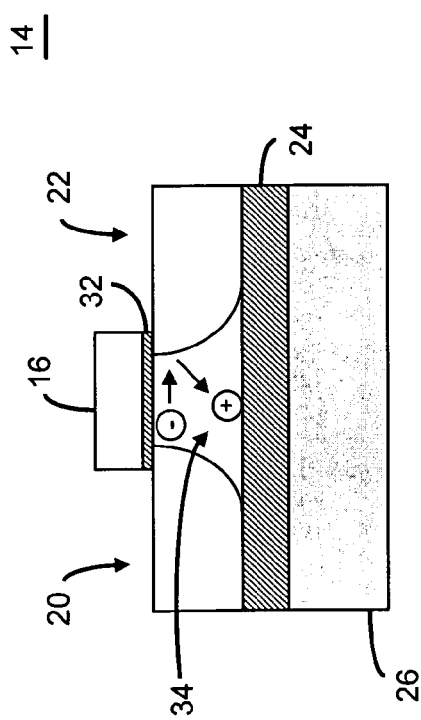
FIGS. 3A and 3B are exemplary schematic and general illustrations of conventional methods to program a memory cell to logic state "1" (i.e., generate or provide an excess of majority carrier in the electrically floating body of the transistor (an N-type channel transistor in this exemplary embodiment) of the memory cell of FIG. 1B; majority carriers in these exemplary embodiments are generated or provided by the channel electron impact ionization (FIG. 3A) and by GIDL or band to band tunneling (FIG. 3B)
Figure 3B:
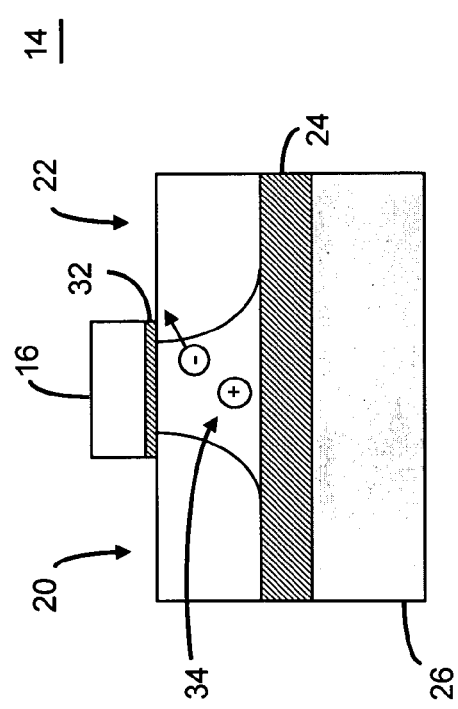
Figure 5:
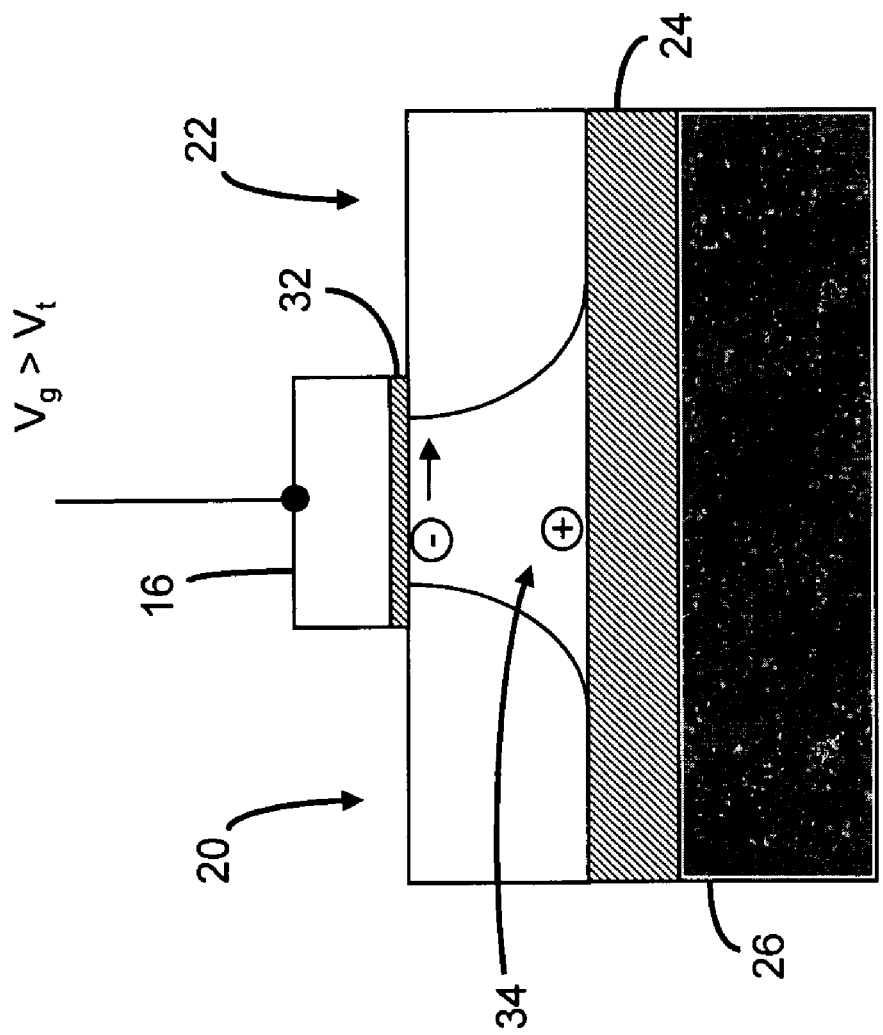
FIG. 5 illustrates an exemplary schematic (and control signal) of a conventional reading technique, the state of the memory cell may be determined by sensing the amount of the channel current provided/generated by the transistor of the memory cell in response to the application of a predetermined voltage on the gate of the transistor.
Figure 11:
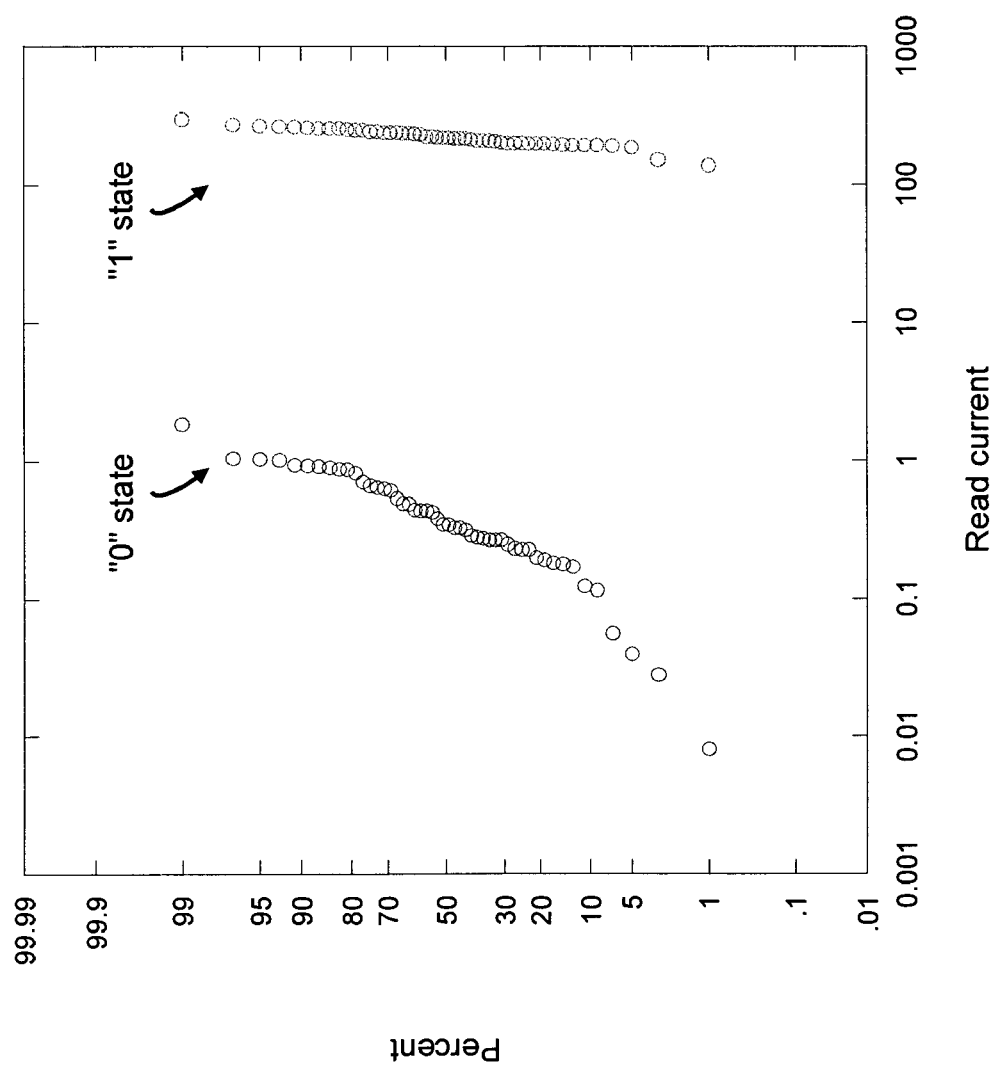
FIG. 11 illustrates an exemplary distribution of logic state "1" and state "0" of a memory cell implementing one or more aspect of the present inventions.

The proposed reading technique may provide a larger signal (see, FIG. 11) compared to the conventional method (see, FIG. 5). Moreover, the reading technique may simplify the sensing of the signal read from transistor 14 of memory cell 12.

In another embodiment, a read operation may be performed by applying 0 volts to source region 20 and gate 16 and a positive voltage (for example, +3.5 volts) to drain region 22. Under these circumstances, a bipolar transistor current is produced between source region 20 and drain region 22. The bipolar transistor current may be larger than a channel current. As such, sensing circuitry (for example, a cross-coupled sense amplifier), which is coupled to transistor 14 (for example, drain region 22) of memory cell 12, senses the data state using primarily and/or based substantially on the bipolar transistor current.

Thus, in response to read control signals, electrically floating body transistor 14 generates a bipolar transistor current which is representative of the data state of memory cell 12. Where the data state is logic high or logic "1", electrically floating body transistor 14 provides a substantially greater bipolar transistor current than where the data state is logic low or logic "0". Indeed, electrically floating body transistor 14 may provide little to no bipolar transistor current when the data state is logic low or logic "0". As discussed in more detail below, data sensing circuitry determines the data state of the memory cell based substantially on the bipolar transistor current induced, caused and/or produced in response to the read control signals.

Notably, where electrically floating body transistor 14 is an P-channel type transistor, in operation, during the read operation, in one embodiment, 0 volts may be applied to source region 20 and gate 16 and a negative voltage (for example, −4 volts) may be applied to drain region 22. Such control signals, in combination, induce and/or cause a bipolar transistor current which may be considerably larger than a channel current. Moreover, electrically floating body transistor 14 generates a bipolar transistor current which is representative of the data state of the memory cell. In this embodiment, where the data state is logic high or logic "1", electrically floating body transistor 14 provides a substantially greater bipolar transistor current than where the data state is logic low or logic "0". Indeed, electrically floating body transistor 14 may provide little to no bipolar transistor current when the data state is logic low or logic "0". The sensing circuitry (for example, a cross-coupled sense amplifier), which is coupled to transistor 14 (for example, drain region 22) of memory cell 12, senses the data state using primarily and/or based substantially on the bipolar transistor current.

As with other operations, the illustrated/exemplary voltage levels to implement the read operations are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.5, 1.0 and 2.0 volts) whether one or more of the voltages (for example, the source, drain or gate voltages) become or are positive and negative.

As mentioned above, the present inventions may be implemented in an integrated circuit device (for example, a discrete memory device or a device having embedded memory) including a memory array having a plurality of memory cells arranged in a plurality of rows and columns wherein each memory cell includes an electrically floating body transistor. The memory arrays may be comprised of N-channel, P-channel and/or both types of transistors. Indeed, circuitry that is peripheral to the memory array (for example, data sense circuitry (for example, sense amplifiers or comparators), memory cell selection and control circuitry (for example, word line and/or source line drivers), as well as row and column address decoders) may include P-channel and/or N-channel type transistors.

Figure 12B:
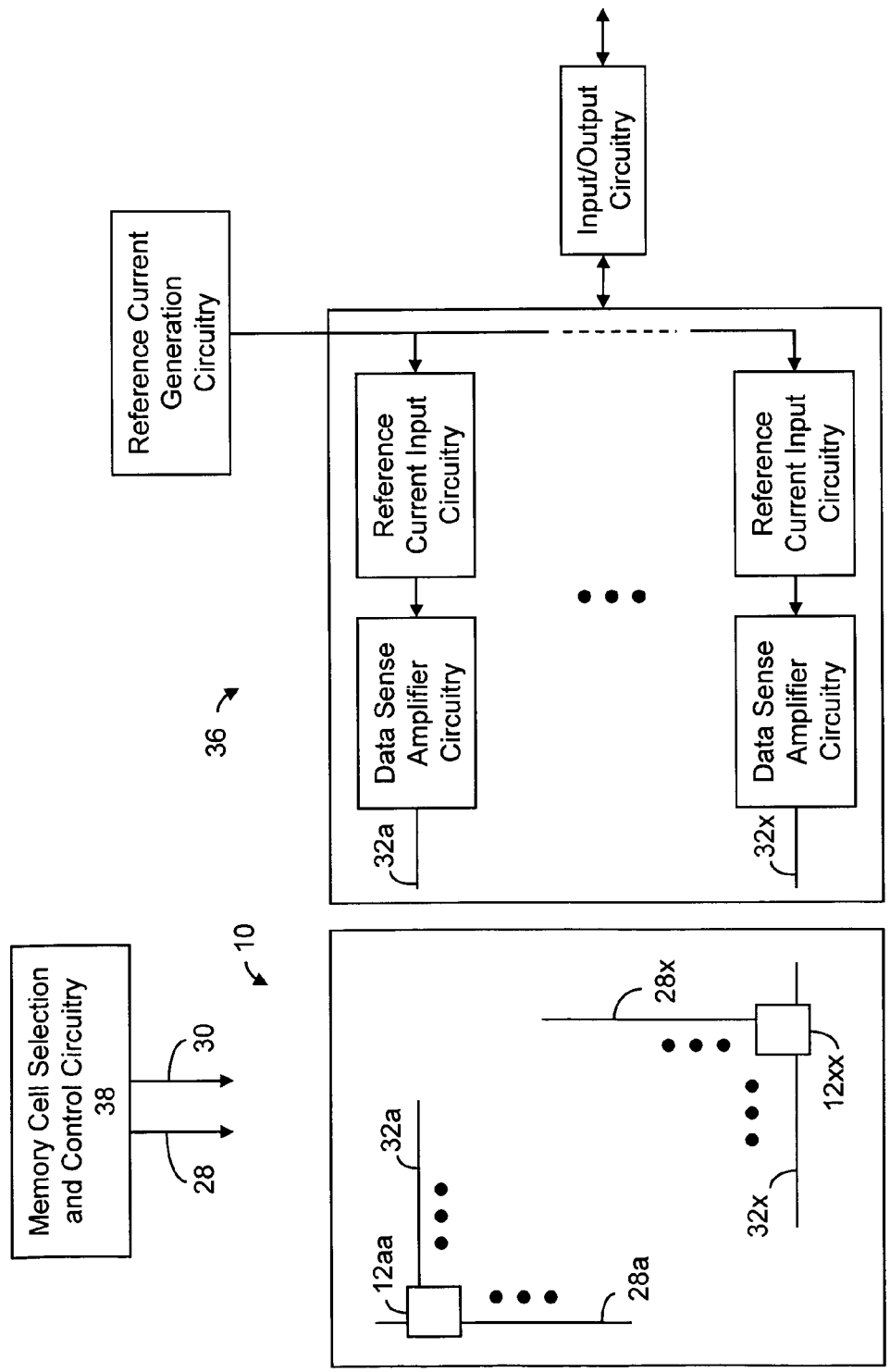

For example, with reference to FIGS. 12A and 12B, the integrated circuit device may include array 10, having a plurality of memory cells 12, data write and sense circuitry 36, and memory cell selection and control circuitry 38. The data write and sense circuitry 36 reads data from and writes data to selected memory cells 12. In one embodiment, data write and sense circuitry 36 includes a plurality of data sense amplifiers. Each data sense amplifier receives at least one bit line 32 and an output of reference generator circuitry (for example, a current or voltage reference signal). In one embodiment, the data sense amplifier may be a cross-coupled type sense amplifier as described and illustrated in the Non-Provisional U.S. patent application Ser. No. 11/299,590 (U.S. Patent Application Publication US 2006/0126374), filed by Waller and Carman, on Dec. 12, 2005, and entitled "Sense Amplifier Circuitry and Architecture to Write Data into and/or Read Data from Memory Cells", the application being incorporated herein by reference in its entirety) to sense the data state stored in memory cell 12 and/or write-back data into memory cell 12.

The data sense amplifier may employ voltage and/or current sensing circuitry and/or techniques. In the context of current sensing, a current sense amplifier may compare the current from the selected memory cell to a reference current, for example, the current of one or more reference cells. From that comparison, it may be determined whether memory cell 12 contained logic high (relatively more majority carries 34 contained within body region 18) or logic low data state (relatively less majority carries 28 contained within body region 18). Notably, the present inventions may employ any type or form of data write and sense circuitry 36 (including one or more sense amplifiers, using voltage or current sensing techniques, to sense the data state stored in memory cell 12) to read the data stored in memory cells 12 and/or write data in memory cells 12.

Briefly, memory cell selection and control circuitry 38 selects and/or enables one or more predetermined memory cells 12 to facilitate reading data therefrom and/or writing data thereto by applying a control signal on one or more word lines 28. The memory cell selection and control circuitry 38 may generate such control signals using address data, for example, row address data. Indeed, memory cell selection and control circuitry 38 may include a conventional word line decoder and/or driver. There are many different control/selection techniques (and circuitry therefor) to implement the memory cell selection technique. Such techniques, and circuitry therefor, are well known to those skilled in the art. Notably, all such control/selection techniques, and circuitry therefor, whether now known or later developed, are intended to fall within the scope of the present inventions.

The present inventions may be implemented in any architecture, layout, and/or configuration comprising memory cells having electrically floating body transistors. For example, in one embodiment, memory array 10 including a plurality of memory cells 12 having a separate source line for each row of memory cells (a row of memory cells includes a common word line connected to the gates of each memory cell of the row). (See, for example, FIGS. 13-15). The memory array 10 may employ one or more of the exemplary programming, reading and/or holding techniques described above.

In one embodiment, the present inventions are implemented in conjunction with a two step write operation whereby all the memory cells of a given row are written to a predetermined data state by first executing a "clear" operation, whereby all of the memory cells of the given row are written or programmed to logic "0", and thereafter selective memory cells of the row are selectively write operation to the predetermined data state (here logic "1"). The present inventions may also be implemented in conjunction with a one step write operation whereby selective memory cells of the selected row are selectively written or programmed to either logic "1" or logic "0" without first implementing a "clear" operation.

Figure 13:
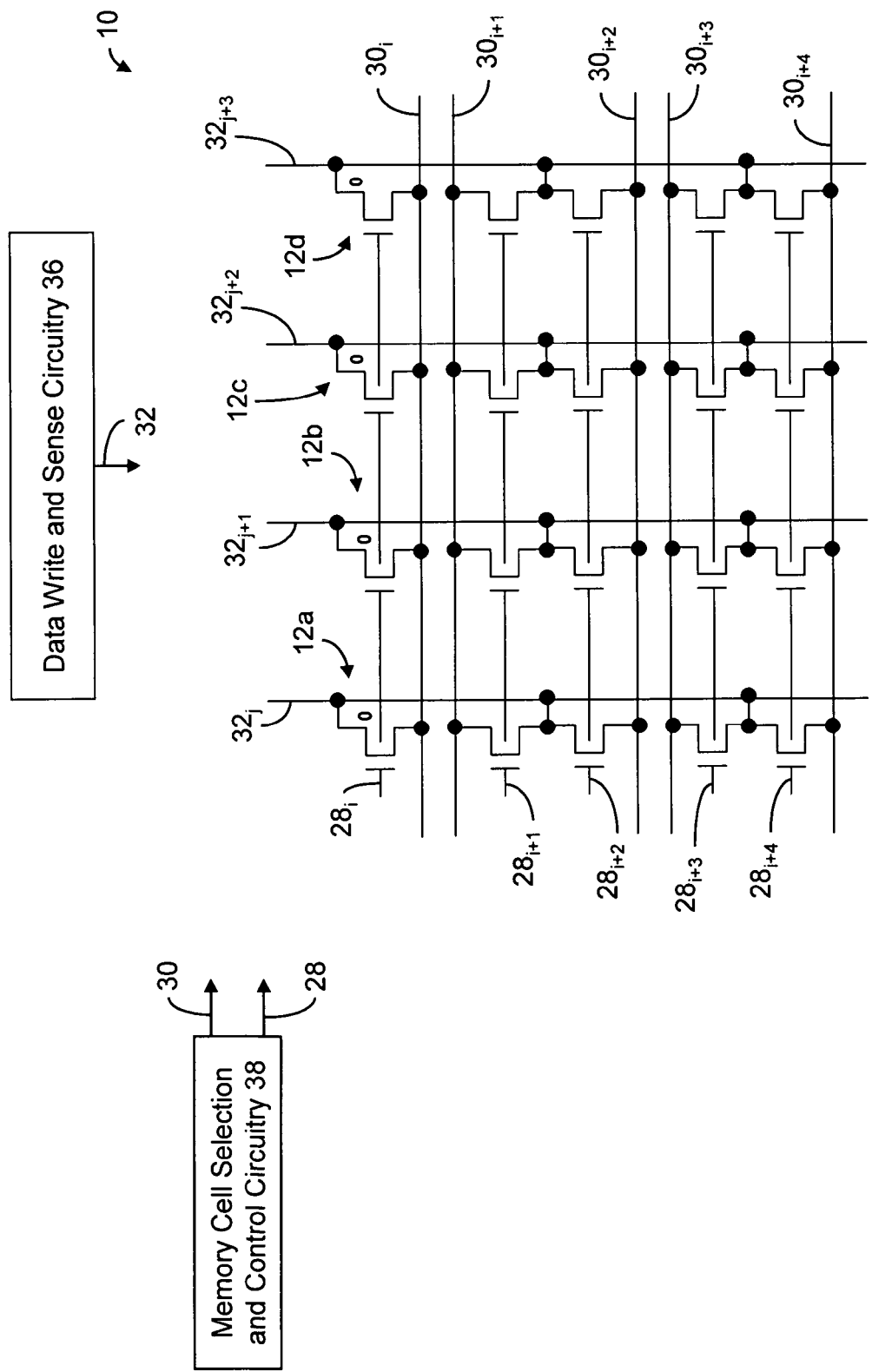
FIGS. 13-15 illustrate an embodiment of an exemplary memory array having a plurality of memory cells and employing a separate source line configuration for each row of memory cells, according to certain aspects of the present inventions.
Figure 14A:
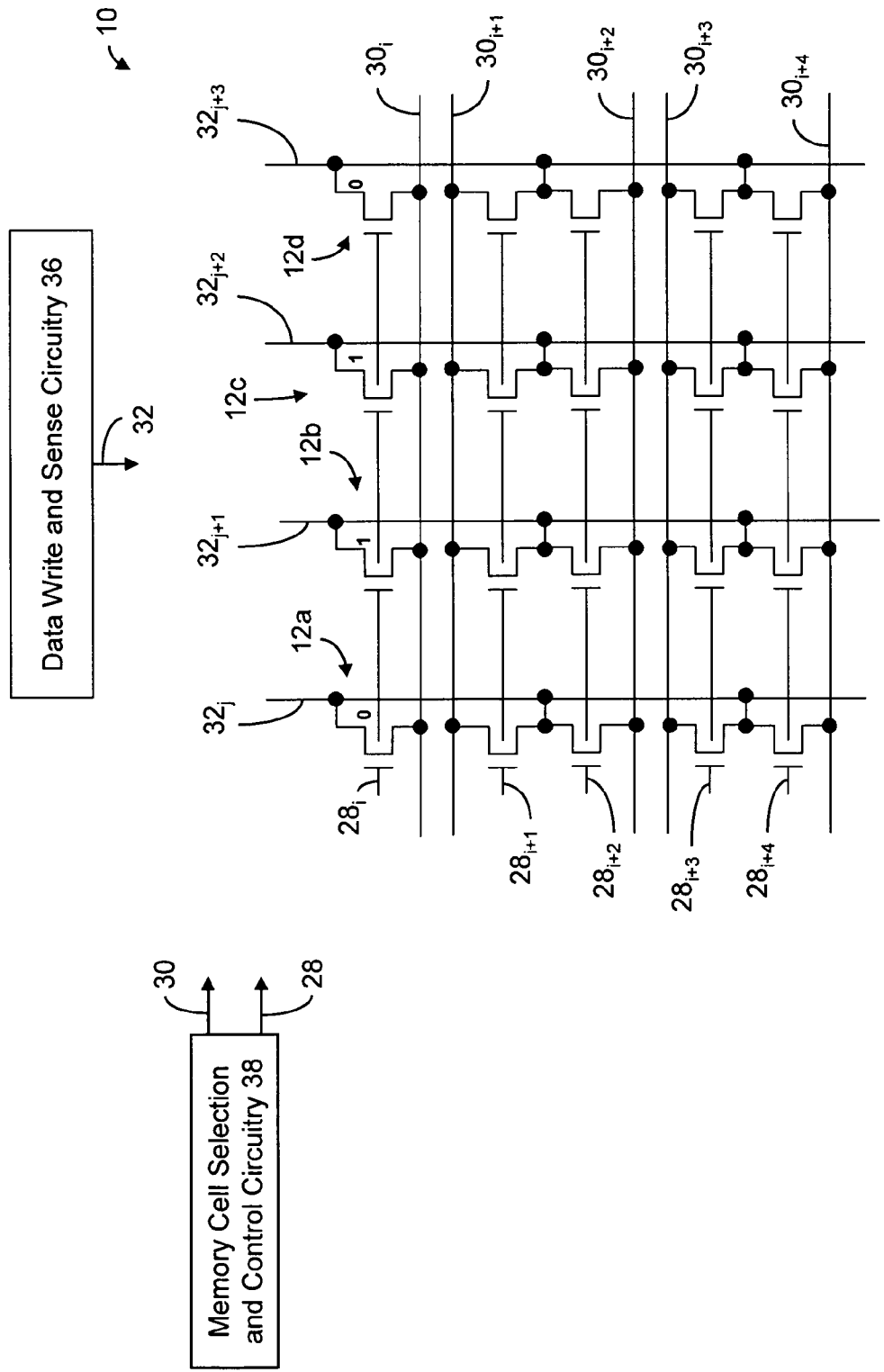
Figure 14B:
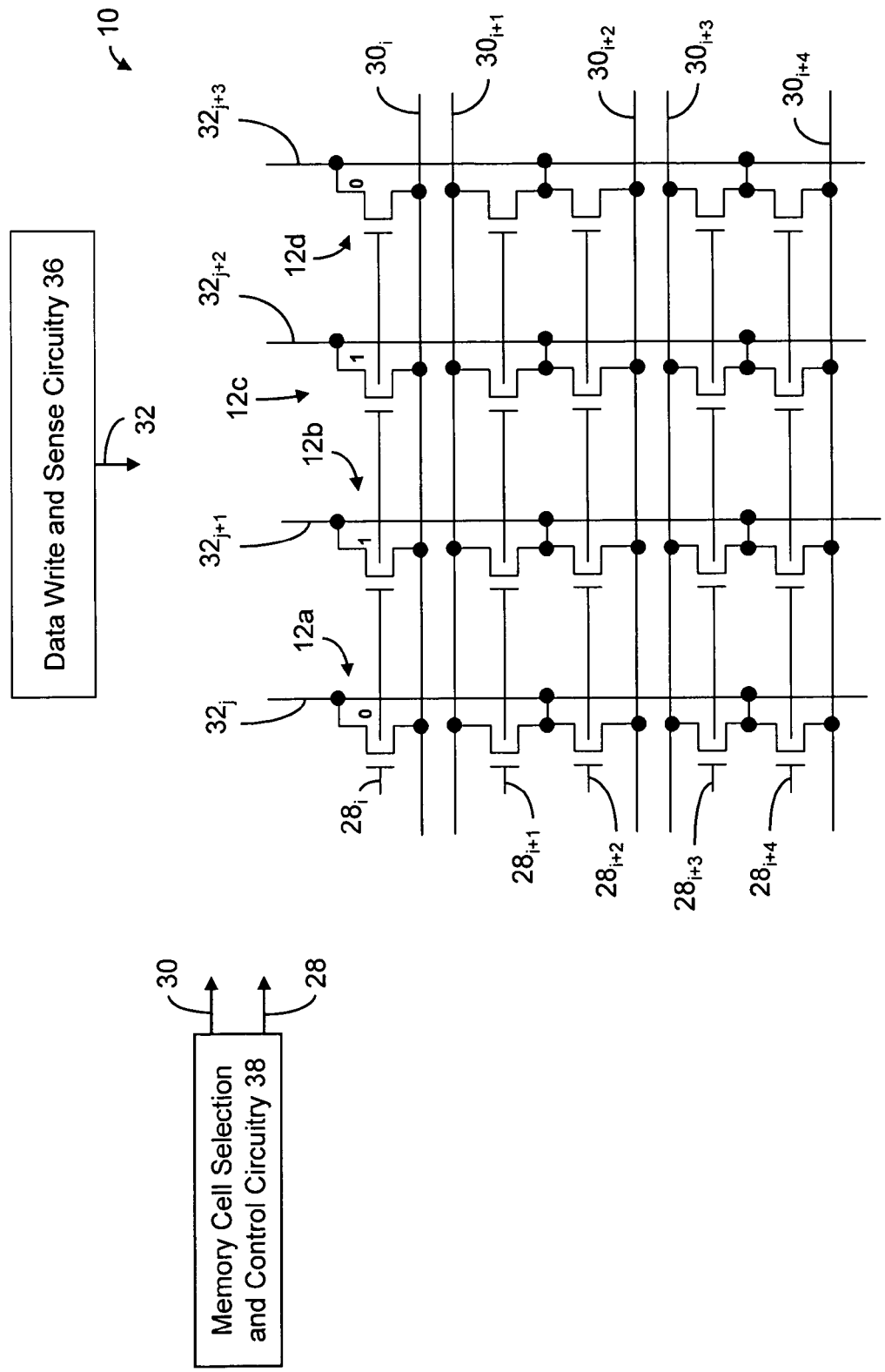
Figure 15:
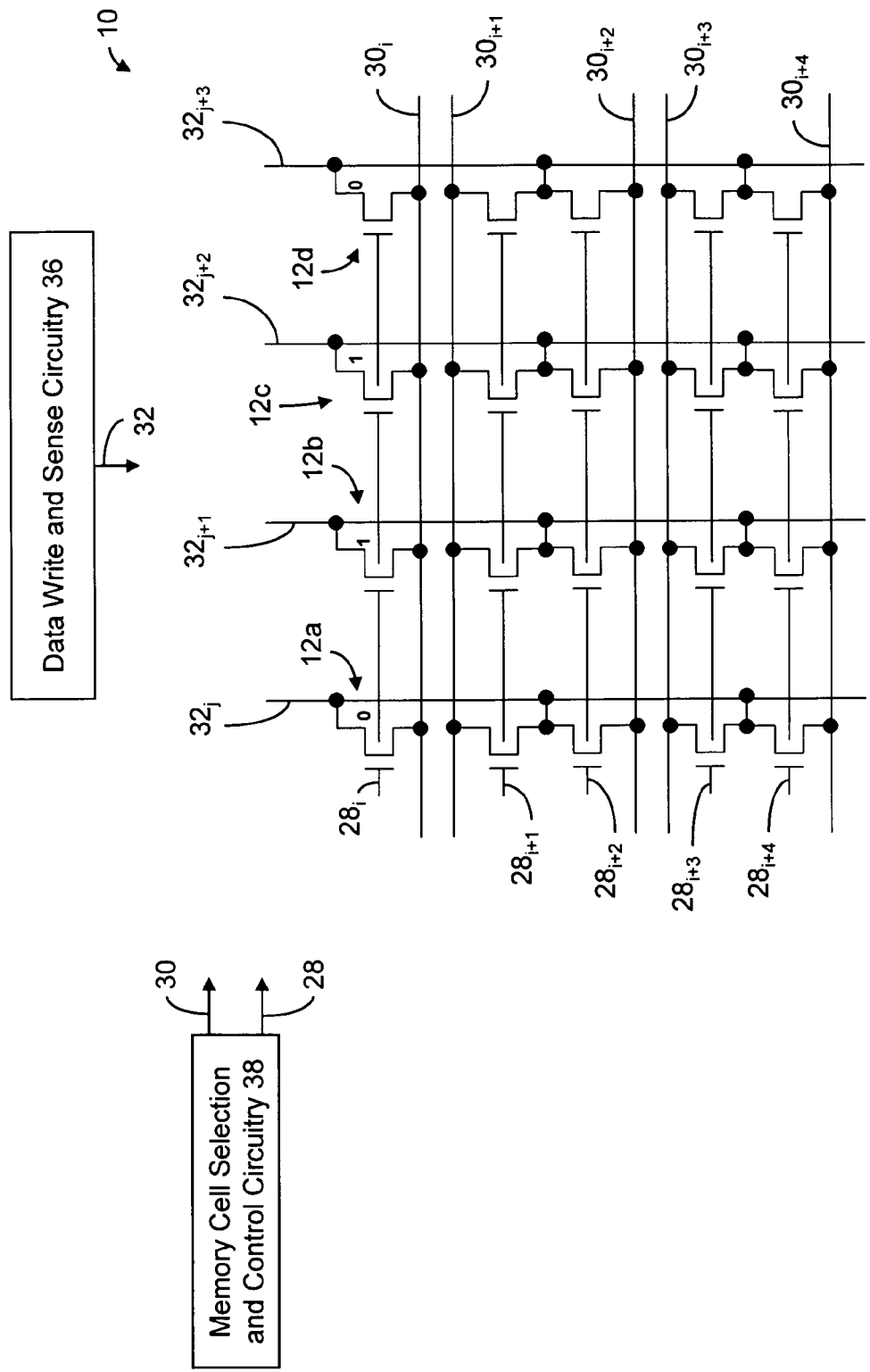

With reference to FIGS. 13, 14A and 14B, memory cells 12 may be programmed using the two step operation wherein a given row of memory cells are written to a first predetermined data state by first executing a "clear" operation (which, in this exemplary embodiment, all of the memory cells of the given row are written or programmed to logic "0") and thereafter selected memory cells are written to a second predetermined data state (i.e., a selective write operation to the second predetermined data state). The "clear" operation may be performed by writing or programming each memory cell of the given row to a first predetermined data state (in this exemplary embodiment the first predetermined data state is logic "0") using the inventive technique described above. (See, FIG. 7).

In particular, transistor of each memory cell 12 of a given row (for example, memory cells 12a-12d) is controlled to store a majority carrier concentration in the electrically floating body region of the transistor which corresponds to logic "0". In this regard, control signals to implement a clear operation are applied to the gate, the source region and the drain region of the transistor of memory cells 12a-12d. In one embodiment, a clear operation includes applying (i) 1.5v to the gate, (ii) 0v to the source region, and (iii) 0v to the drain region of the transistor. In response, the same logic state (for example, logic low or logic "0") is stored in memory cells 12a-12d and the state of memory cells 12a-12d are "cleared". Notably, it may be preferable to maintain the gate-to-source voltage below the threshold voltage of the transistor of memory cell 12 to further minimize or reduce power consumption.

Thereafter, selected memory cells of the given row may be programmed to the second predetermined logic state. In this regard, the transistors of certain memory cells of a given row are written to the second predetermined logic state in order to store the second predetermined logic state in memory cells. For example, with reference to FIG. 14A, memory cells 12b and 12c are programmed to logic high or logic "1", via impact ionization and/or avalanche multiplication, by applying (i) −2v to the gate (via word line $28_i$), (ii) −2v to the source region (via source line $30_i$), and (iii) 1.5v to the drain region (via bit line $32_{j+1}$ and $32_{j+2}$). In particular, such control signals generate or provide a bipolar current in the electrically floating body region of the transistor of memory cell 12. The bipolar current causes or produces impact ionization and/or the avalanche multiplication phenomenon in the electrically floating body region of the transistors of memory cells 12b and 12c. In this way, an excess of majority carriers are provided and stored in the electrically floating body region of the transistor of memory cells 12b and 12c which corresponds to logic high or logic "1".

As mentioned above, it is preferred that the bipolar transistor current responsible for impact ionization and/or avalanche multiplication in the floating body is initiated or induced by the control signal (control pulse) applied to the gate of the transistor. Such a signal/pulse may induce the channel impact ionization which raises or increases the potential of the electrically floating body region of the transistor of memory cells 12b and 12c and "turns-on" and/or produces a bipolar current in transistor 14. One advantage of the proposed method is that a large amount of the excess majority carriers may be generated and stored in the electrically floating body region of the transistor of memory cells 12b and 12c.

Notably, in this exemplary embodiment, memory cells 12a and 12d are maintained at logic low (or logic "0") by applying an inhibit control signal to the drain region of each memory cell 12a and 12d. For example, applying 0v to the drain regions of memory cells 12a and 12d (via bit lines $32_j$ and $32_{j+4}$) inhibits writing logic high or logic "1" into memory cells 12a and 12d during the selective write operation for memory cells 12b and 12c.

It may be advantageous to employ a "holding" operation or condition for the other memory cells in memory cell array 10 to minimize and/or reduce the impact of the write operation for memory cells 12a-12d connected to word line $28_i$. With reference to FIGS. 13 and 14A, in one embodiment, a holding voltage is applied to the gates of the transistors of other memory cells of memory cell array 10 (for example, each memory cell connected to word lines $28_{i+1}$, $28_{i+2}$, $28_{i+3}$, and $28_{i+4}$). In one exemplary embodiment, a holding voltage of −1.2v is applied to the gate of each transistor of the memory cells connected to word lines $28_{i+1}$, $28_{i+2}$, $28_{i+3}$, and 28i+4. In this way, the impact of the write operation of memory cells 12a-12d (which are connected to word line 28$_i$) on the other memory cells of memory cell array 10 is minimized and/or reduced.

With reference to FIG. 14B, in another embodiment, memory cells are selectively written to logic high (logic "1") using the band-to-band tunneling (GIDL) method. As mentioned above, the band-to-band tunneling provides, produces and/or generates an excess of majority carriers in the electrically floating body of the transistors of each selected memory cell (in this exemplary embodiment, memory cells 12b and 12c). For example, after implementing the clear operation, memory cells 12b and 12c are programmed to logic high or logic "1", via band-to-band tunneling, by applying (i) −3v to the gate (via word line 28$_i$), (ii) −0.5v to the source region (via source line 30$_i$), and (iii) 1v to the drain region (via bit line 32$_{j+1}$ and 32$_{j+2}$).

As mentioned above, the other memory cells connected to word line 28$_i$ (in this exemplary embodiment, memory cells 12a and 12d) may be maintained at logic low via application of a write "inhibit" control signal to the bits lines associated with such other memory cells (bit lines 32$_j$ and 32$_{j+4}$, respectively). Moreover, the other memory cells of memory cell array 10 which are not connected to word line 28$_i$ may be maintained at a given data state via application of "holding" operation or condition. In this regard, with reference to FIG. 14B, in one embodiment, a holding voltage is applied to the gate of the transistor of each memory cell connected to word lines 28$_{i+1}$, 28$_{i+2}$, 28$_{i+3}$, and 28$_{i+4}$. In one exemplary embodiment, −1.2v is applied to the gate of each transistor of the memory cells connected to word lines 28$_{i+1}$, 28$_{i+2}$, 28$_{i+3}$, and 28$_{i+4}$. In this way, the impact of the write operation for memory cells 12a-12d (which are connected to word line 28$_i$) on the other memory cells of memory cell array 10 is minimized and/or reduced.

A selected row of memory cells may be read by applying a read control signals to the associated word line 28 and associated source lines 30 and sensing a signal (voltage and/or current) on associated bit lines 32. In one exemplary embodiment, with reference to FIG. 15, memory cells 12a-12d are read by applying (i) -0.5 v to the gate (via word line 28$_i$) and (ii) 3 v to the source region (via source line 30$_i$). The data write and sense circuitry 36 reads the data state of the memory cells 12a-12d by sensing the response to the read control signals applied to word line 28 and source line 30$_i$. In response to the read control signals, memory cells 12a-12d generate a bipolar transistor current which is representative of the data state of memory cells 12a-12d. In this example, memory cells 12b and 12c (which were earlier programmed to logic "1"), in response to the read control signals, generate a bipolar transistor current which is considerably larger than any channel current. In contrast, memory cells 12a and 12d (which were earlier programmed to logic "0"), in response to such control signals induce, cause and/or produce little to no bipolar transistor current (for example, a considerable, substantial or sufficiently measurable bipolar transistor current). The circuitry in data write and sense circuitry 36 which senses the data state of the memory cell (for example, a cross-coupled sense amplifier) senses the data state using and/or based substantially on the bipolar transistor current.

Thus, in response to read control signals, the electrically floating body transistor of each memory cell 12a-12d generates a bipolar transistor current which is representative of the data state stored therein. The data sensing circuitry in data write and sense circuitry 36 determines the data state of memory cells 12a-12d based substantially on the bipolar transistor current induced, caused and/or produced in response to the read control signals. Notably, as mentioned above, a read operation may be performed by applying other control signaling techniques.

Again, it may be advantageous to employ a "holding" operation or condition for the other memory cells in memory cell array 10 to minimize and/or reduce the impact of the read operation of memory cells 12a-12d. With continued reference to FIG. 15, in one embodiment, a holding voltage is applied to the gates of the transistors of other memory cells of memory cell array 10 (for example, each memory cell connected to word lines 28$_{i+1}$, 28$_{i+2}$, 28$_{i+3}$, and 28$_{i+4}$). In one exemplary embodiment, a holding voltage of −1.2v is applied to the gate of each transistor of the memory cells connected to word lines 28$_{i+1}$, 28$_{i+2}$, 28$_{i+3}$, and 28$_{i+4}$. In this way, the impact of the read operation of memory cells 12a-12d (which are connected to word line 28$_i$) on the other memory cells of memory cell array 10 is minimized and/or reduced.

Figure 16:
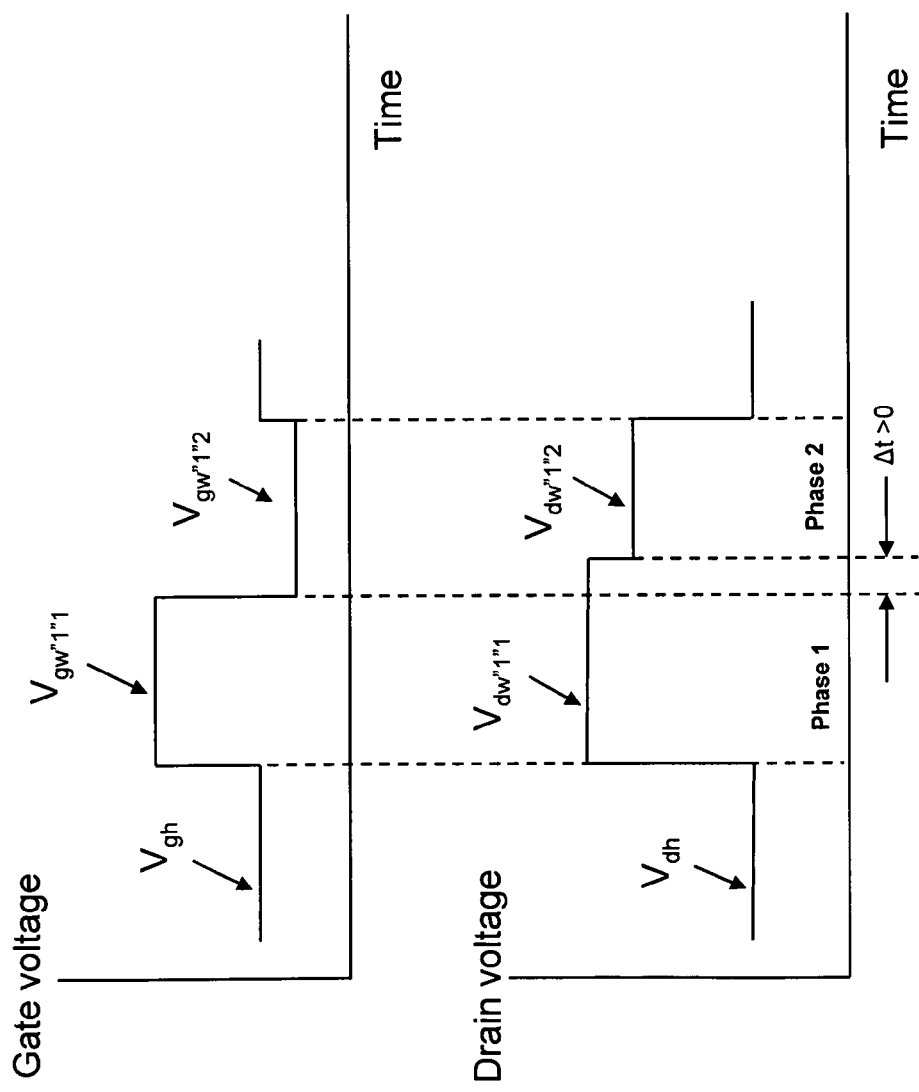
FIG. 16 illustrates exemplary relationships of selected write control signals to implement a program or write operation for logic high or logic "1" into a memory cell according to one embodiment of the present inventions.

In another embodiment, with reference to FIG. 16, the control signals to implement a write operation may be configured to provide a lower power consumption as well as a one step write whereby selective memory cells of a selected row of memory cells are selectively written or programmed to either logic "1" or logic "0" without first implementing a "clear" operation. In this embodiment, the temporally varying control signals to implement the write logic "1" operation include the voltage applied to the gate ($V_{gw"1"}$) and the voltage applied to the drain region ($V_{dw"1"}$). The logic states "1" and "0" are written to one or more selected cells by applying appropriate bit line voltages. In this regard, during phase 1, the drain pulse ($V_{dw"1"1}$) may be applied to the drain region (via, for example, the associated bit line) of the electrically floating body transistor of the memory cell before the gate pulse ($V_{gw"1"1}$) is applied to the gate (via, for example, the associated word line), simultaneously thereto, or after the gate pulse ($V_{gw"1"1}$) is applied to gate. It is preferred that the drain pulse ($V_{dw"1"1}$) include an amplitude which is sufficient to maintain a bipolar current that is suitable for programming the memory cell to logic "1". From a relative timing perspective, it is preferred that the drain pulse ($V_{dw"1"1}$) extend beyond/after or continue beyond the conclusion of the gate pulse ($V_{gw"1"1}$), or extend beyond/after or continue beyond the time the gate pulse ($V_{gw"1"1}$) is reduced, as illustrated in FIG. 16 (see, Δt>0). In this way, majority carriers are generated in the electrically floating body region via a bipolar current and majority carriers may accumulate (and be stored) in a portion of the electrically floating body region of the transistor of the memory cell 12 that is juxtaposed or near the gate dielectric (which is disposed between the gate and the electrically floating body region).

Notably, with continued reference to FIG. 16, during phase 2 of the programming, the gate voltage ($V_{gw"1"2}$) may be equal to (or substantially equal to) the voltage applied to the gate to implement a hold operation ($V_{gh}$) and the drain bias ($V_{dw"1"2}$) may be equal to (or substantially equal to) the voltage applied to the drain region to implement a hold operation ($V_{dh}$).

Figure 17:
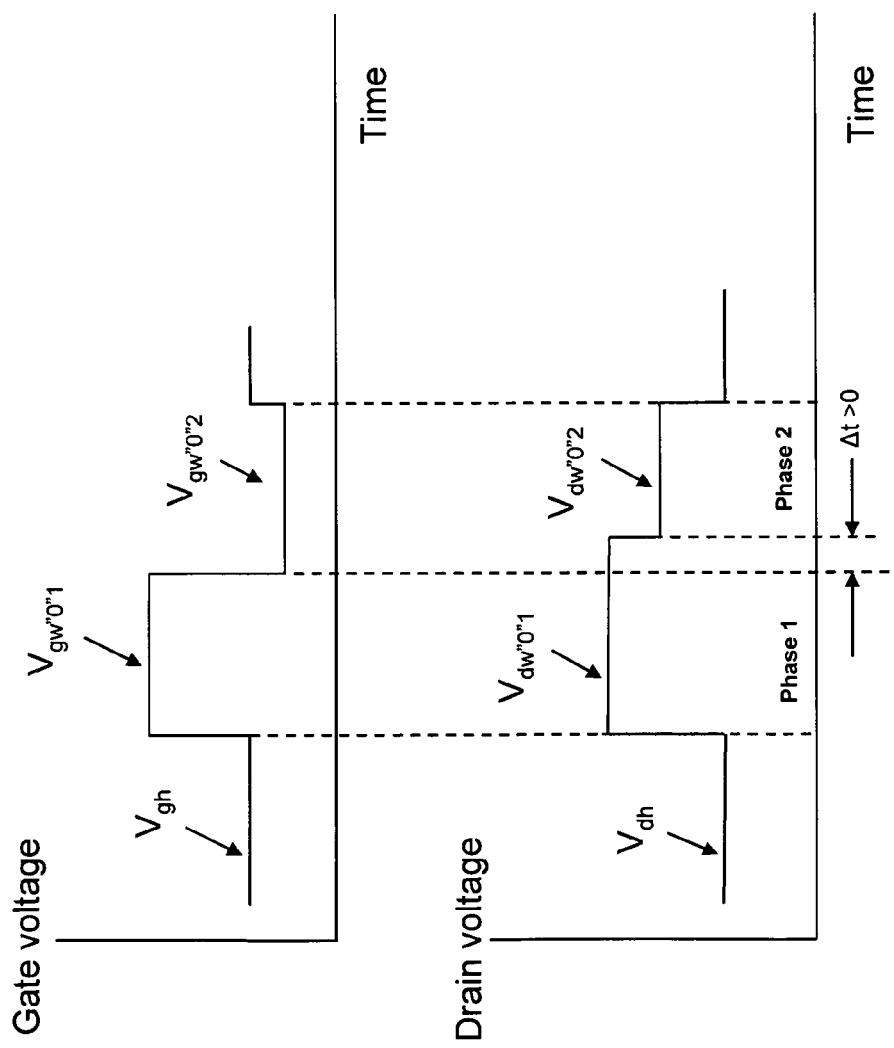
FIG. 17 illustrates exemplary relationships of selected write control signals to implement a program or write operation for logic low or logic "0" into a memory cell according to one embodiment of the present inventions.

With reference to FIG. 17, the temporally varying control signals to implement the write logic "0" operation including the voltage applied to the gate ($V_{gw"0"}$) and the voltage applied to the drain region ($V_{dw"0"}$). In this embodiment, during phase 1, the control signal applied to the drain region ($V_{dw"0"1}$) may be applied before the control signal is applied to the gate ($V_{gw"0"1}$), or simultaneously thereto, or after the control signal is applied to the gate. It is preferred that the drain pulse ($V_{dw"0"1}$) include an amplitude which is insufficient to maintain a bipolar current that is suitable for programming the memory cell to logic "1". From a relative timing perspective, it is preferred that the drain pulse ($V_{dw\text{``}0\text{''}1}$) extend beyond/after or continue beyond the conclusion of the gate pulse ($V_{gw\text{``}0\text{''}1}$), or extend beyond/after or continue beyond the time the gate pulse ($V_{gw\text{``}0\text{''}1}$) is reduced, as illustrated in FIG. 17 (see, Δt>0). In this way, majority carriers are generated in the electrically floating body region via a bipolar current and majority carriers may accumulate (and be stored) in a portion of the electrically floating body region of the transistor of the memory cell 12 that is juxtaposed or near the gate dielectric (which is disposed between the gate and the electrically floating body region).

Like phase 2 of the write logic "1" described above, during phase 2 of the write operation for logic "0", the gate voltage ($V_{gw\text{``}0\text{''}2}$) may be equal to (or substantially equal to) the voltage applied to the gate to implement a hold operation ($V_{gh}$) and the drain bias ($V_{dw\text{``}0\text{''}2}$) may be equal to (or substantially equal to) the voltage applied to the drain region to implement a hold operation ($V_{dh}$).

Notably, in the preceding discussion pertaining to an exemplary write operation, the reference to a first phase and a second phase of a write operation was used for explanation purposes to highlight changes in voltage conditions of control signals in the exemplary embodiments. It may be advantageous, when writing logic "1" and "0", to apply constant or non-changing voltages to gate, drain region and/or source region during or through what has been labeled as write phases 1 and 2.

Figure 18:
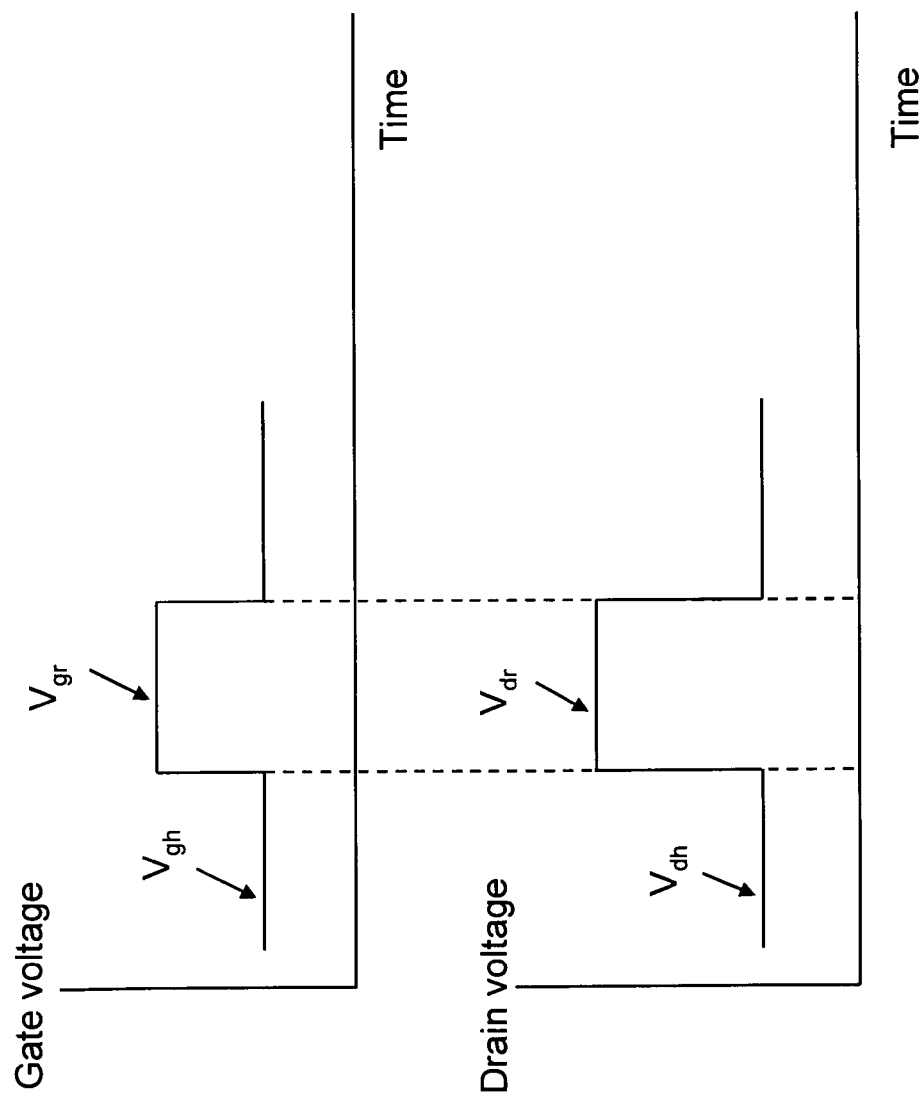
FIG. 18 illustrates exemplary relationships of selected control signals to implement a read operation of a memory cell according to one embodiment of the present inventions.

The memory cell may be read using read control signals illustrated in FIG. 18. In this embodiment, a read control signal is applied to the drain region and the gate. The voltage applied to the drain region ($V_{dr}$) may be applied to drain region before application of the voltage applied to the gate ($V_{gr}$), simultaneously thereto, or after the voltage is applied to the gate. Further, the drain pulse ($V_{dr}$) may cease or terminate before the gate pulse ($V_{gr}$), simultaneously thereto (as illustrated in FIG. 18), or after the gate pulse ($V_{gr}$) concludes or ceases.

Notably, in this embodiment, during the read operation, a bipolar current is generated in those memory cells storing logic "1" and little to no bipolar current is generated in those memory cells storing logic "0". The data state is determined primarily by, sensed substantially using and/or based substantially on the bipolar transistor current that is responsive to the read control signals and significantly less by the interface channel current component, which is less significant and/or negligible relatively to the bipolar component.

The programming and reading techniques described herein may be employed in conjunction with a plurality of memory cells arranged in an array of memory cells. A memory array implementing the structure and techniques of the present inventions may be controlled and configured including a plurality of memory cells having a separate source line for each row of memory cells (a row of memory cells includes a common word line). The exemplary layouts or configurations (including exemplary control signal voltage values), according to certain aspects of the present inventions are shown, each consisting of the control signal waveforms and exemplary array voltages during one-step writing phase 1, phase 2, and reading.

Figure 19:
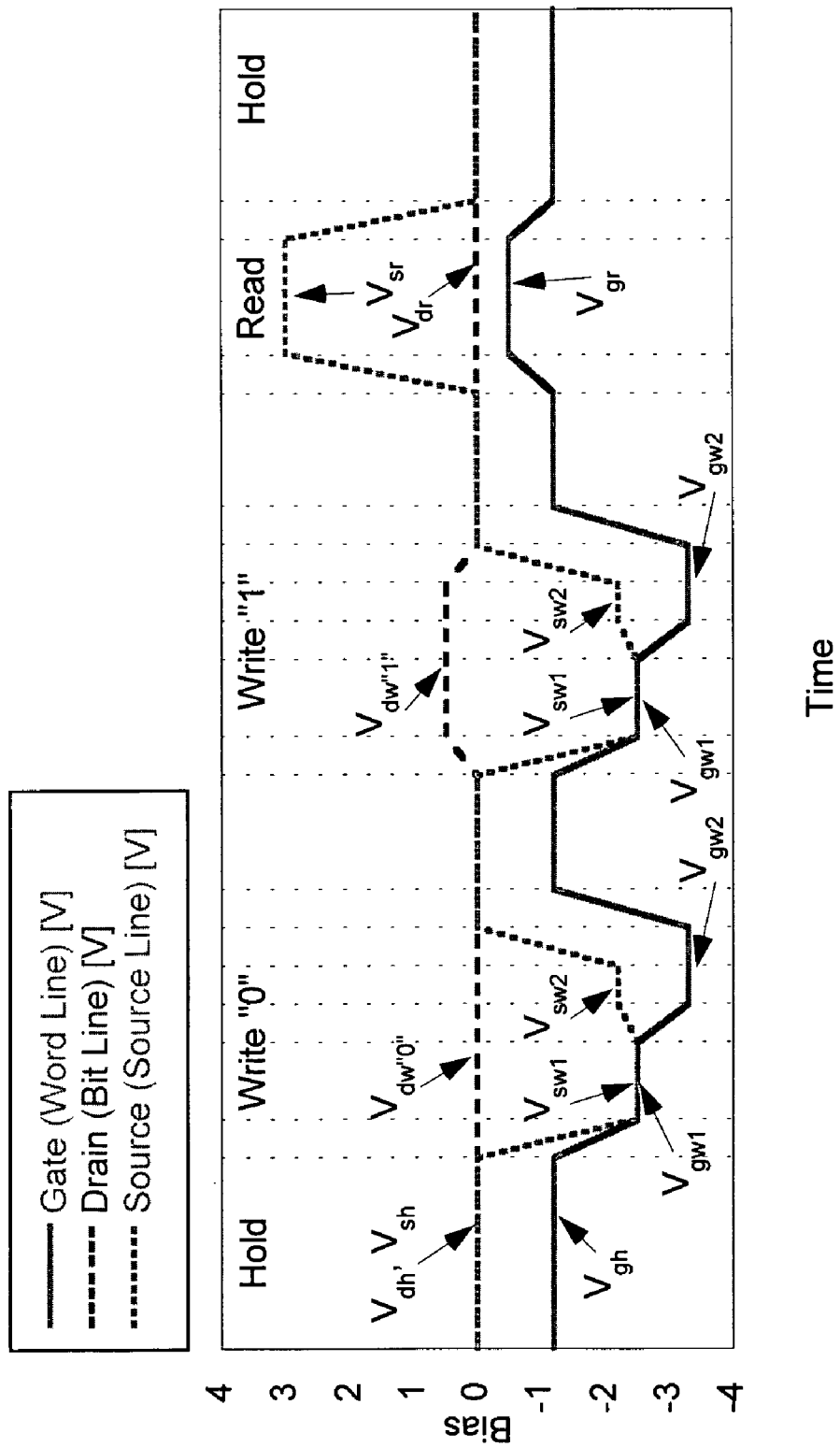
FIGS. 19, 21, 22, 23, 24, 25 and 26 illustrate exemplary relationships of selected control signals to control or implement certain operations of the memory cells of associated memory array configurations or layouts illustrated herein, according to certain aspects of the present inventions.
Figure 20:
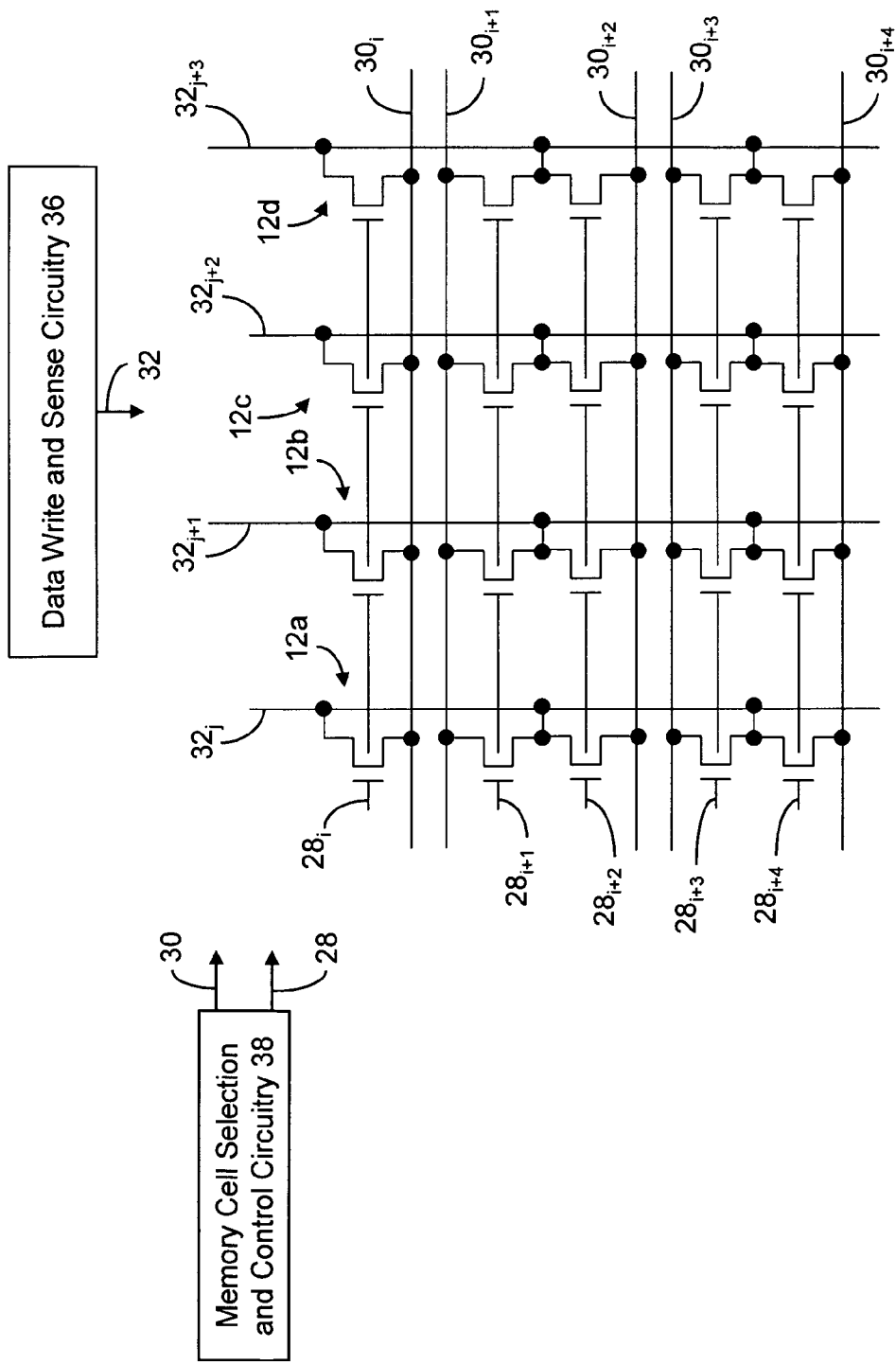
FIGS. 20 and 27 illustrate exemplary embodiments of memory arrays having a plurality of memory cells and employing separate or common source line configurations for each row of memory cells, according to certain aspects of the present inventions.

FIG. 19 provides exemplary control signal information (temporal and amplitude) in connection with the exemplary layout or configuration illustrated in FIG. 20. In this embodiment, the temporally varying control signals to implement the write operation include (i) a voltage applied to the gate ($V_{gw}$) via the associated word line, (ii) a voltage applied to the source ($V_{sw}$) via the source line, and (iii) a voltage applied to the drain region ($V_{dw}$) via the associated bit line. The logic states "1" and "0" are written to one or more selected cells by applying appropriate bit line voltages. In this regard, logic "1" is written into a memory cell by applying drain pulse ($V_{dw\text{``}1\text{''}}$) having an amplitude of 0.5V, and logic "0" is written into a memory cell by applying the drain pulse ($V_{dw\text{``}0\text{''}}$) having an amplitude of 0V. In addition, during phase 1 of the write operation, the source pulse ($V_{sw1}$) includes an amplitude of −2.5V and the gate pulse ($V_{gw1}$) includes an amplitude of −2.5V. During phase 2 of the write operation, the source pulse ($V_{sw2}$) includes an amplitude of −2.2V and the gate pulse ($V_{gw2}$) includes an amplitude of −3.3V.

Notably, under these conditions, a bipolar current that is suitable for programming the memory cell to logic "1" is provided. Moreover, under these conditions, little to no bipolar current is generated for programming the memory cell to logic "0".

As noted above, in the preceding discussion pertaining to an exemplary write operation, the reference to a first phase and a second phase of a write operation was used for explanation purposes to highlight changes in voltage conditions of control signals in the exemplary embodiments. It may be advantageous, when writing logic "1" and "0", to apply constant or non-changing voltages to gate, drain region and/or source region during or through what has been labeled as write phases 1 and 2. Although the "one-step" programming technique may consume more power than the "two-step" programming technique, the "one-step" programming technique may present a less complex control signaling regime and circuitry therefor.

A row of memory cells (for example, 12a-12d) may be read in parallel. In this embodiment, memory cells 12 are read by applying the following read control signals: (i) a voltage applied to the gate ($V_{gr}$) via the associated word line and (ii) a voltage applied to the source ($V_{sr}$) via the source line. The logic state of each memory cell (for example, 12a-12d) is sensed, determined and/or sampled on the associated bit line ($32_j$-$32_{j+3}$, respectively). In particular, during the read operation, the gate pulse ($V_{gr}$) includes an amplitude of −0.5V and the source pulse ($V_{sr}$) includes an amplitude of 3V.

Notably, during the read operation, a bipolar current is generated in those memory cells storing logic "1" and little to no bipolar current is generated in those memory cells storing logic "0". The data state is determined primarily by, sensed substantially using and/or based substantially on the bipolar transistor current that is responsive to the read control signals and significantly less by the interface channel current component, which is less significant and/or negligible relatively to the bipolar component.

Figure 21:
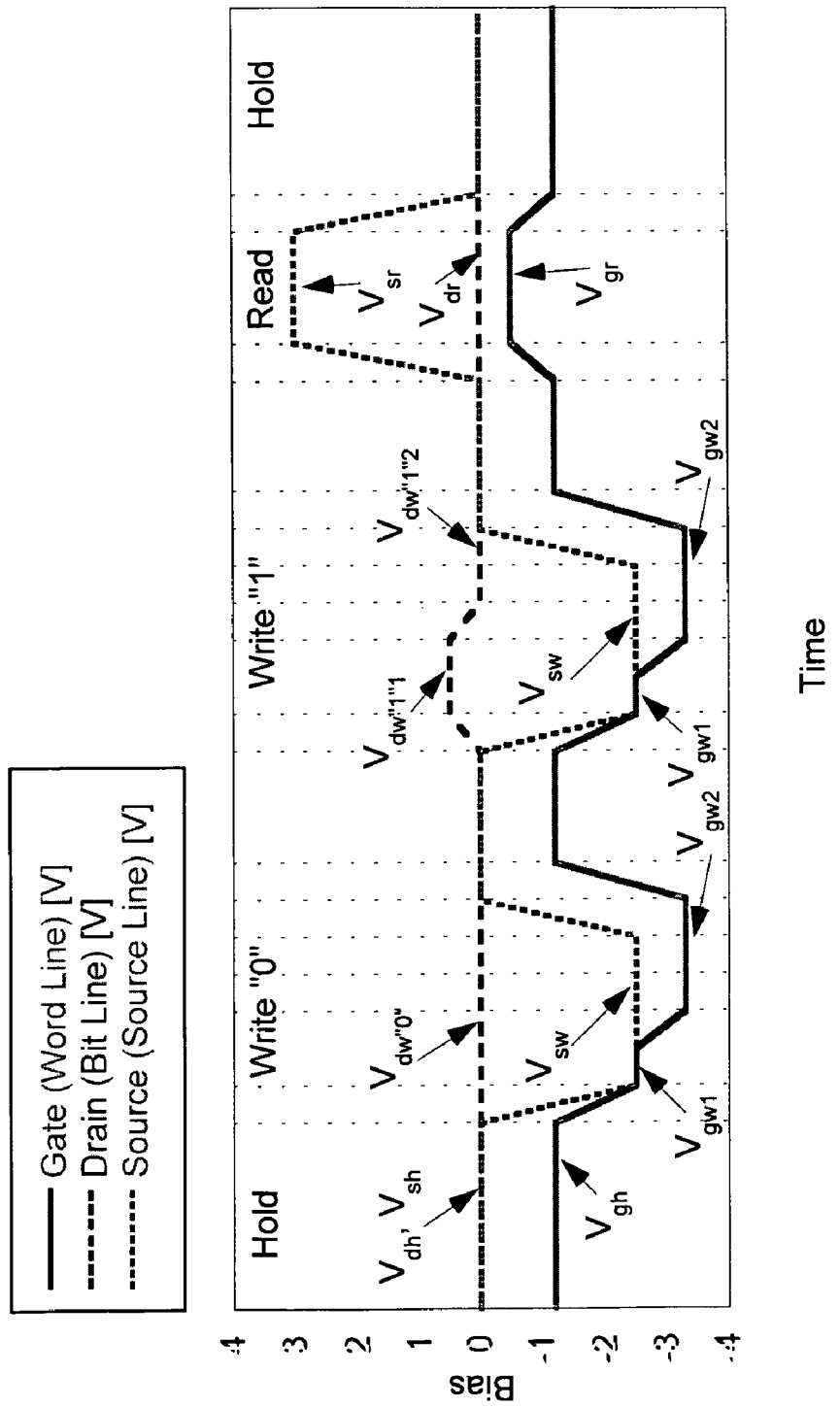

FIG. 21 provides exemplary control signal information (temporal and amplitude) in connection with the exemplary layout illustrated in FIG. 20. In this embodiment, the temporally varying control signals to implement the write operation include (i) a voltage applied to the gate ($V_{gw}$) via the associated word line, (ii) a voltage applied to the source ($V_{sw}$) via the source line, and (iii) a voltage applied to the drain region ($V_{dw}$) via the associated bit line. The logic states "1" and "0" are written to one or more selected cells by applying appropriate bit line voltages. In this regard, logic "1" is written into a memory cell by applying drain pulse ($V_{dw\text{``}1\text{''}}$) having (i) an amplitude of 0.5V during phase 1 and (ii) an amplitude of 0V during phase 2, and logic "0" is written into a memory cell by applying the drain pulse ($V_{dw\text{``}0\text{''}}$) having an amplitude of 0V. In addition, during phase 1 of the write operation, the source pulse ($V_{sw1}$) includes an amplitude of −2.5V and the gate pulse ($V_{gw1}$) includes an amplitude of −2.5V. During phase 2 of the write operation, the source pulse ($V_{sw2}$) includes an amplitude of –2.5V and the gate pulse ($V_{gw2}$) includes an amplitude of –3.3V.

Notably, under these conditions, a bipolar current that is suitable for programming the memory cell to logic "1" is provided. Moreover, under these conditions, little to no bipolar current is generated for programming the memory cell to logic "0".

As noted above, in the preceding discussion pertaining to an exemplary write operation, the reference to a first phase and a second phase of a write operation was used for explanation purposes to highlight changes in voltage conditions of control signals in the exemplary embodiments. It may be advantageous, when writing logic "1" and "0", to apply constant or non-changing voltages to gate, drain region and/or source region during or through what has been labeled as write phases 1 and 2.

A row of memory cells (for example, 12a-12d) may be read in parallel. The memory cells are read by applying the following read control signals: (i) a voltage applied to the gate ($V_{gr}$) via the associated word line and (ii) a voltage applied to the source ($V_{sr}$) via the source line. The logic state of each memory cell (for example, 12a-12d) is sensed, determined and/or sampled on the associated bit line (32$_j$-32$_{j+3}$, respectively). In particular, during the read operation, the gate pulse ($V_{gr}$) includes an amplitude of –0.5V and the source pulse ($V_{sr}$) includes an amplitude of 3V.

Notably, as mentioned above, during the read operation, a bipolar current is generated in those memory cells storing logic "1" and little to no bipolar current is generated in those memory cells storing logic "0". The data state is determined primarily by, sensed substantially using and/or based substantially on the bipolar transistor current that is responsive to the read control signals and significantly less by the interface channel current component, which is less significant and/or negligible relatively to the bipolar component.

Figure 22:
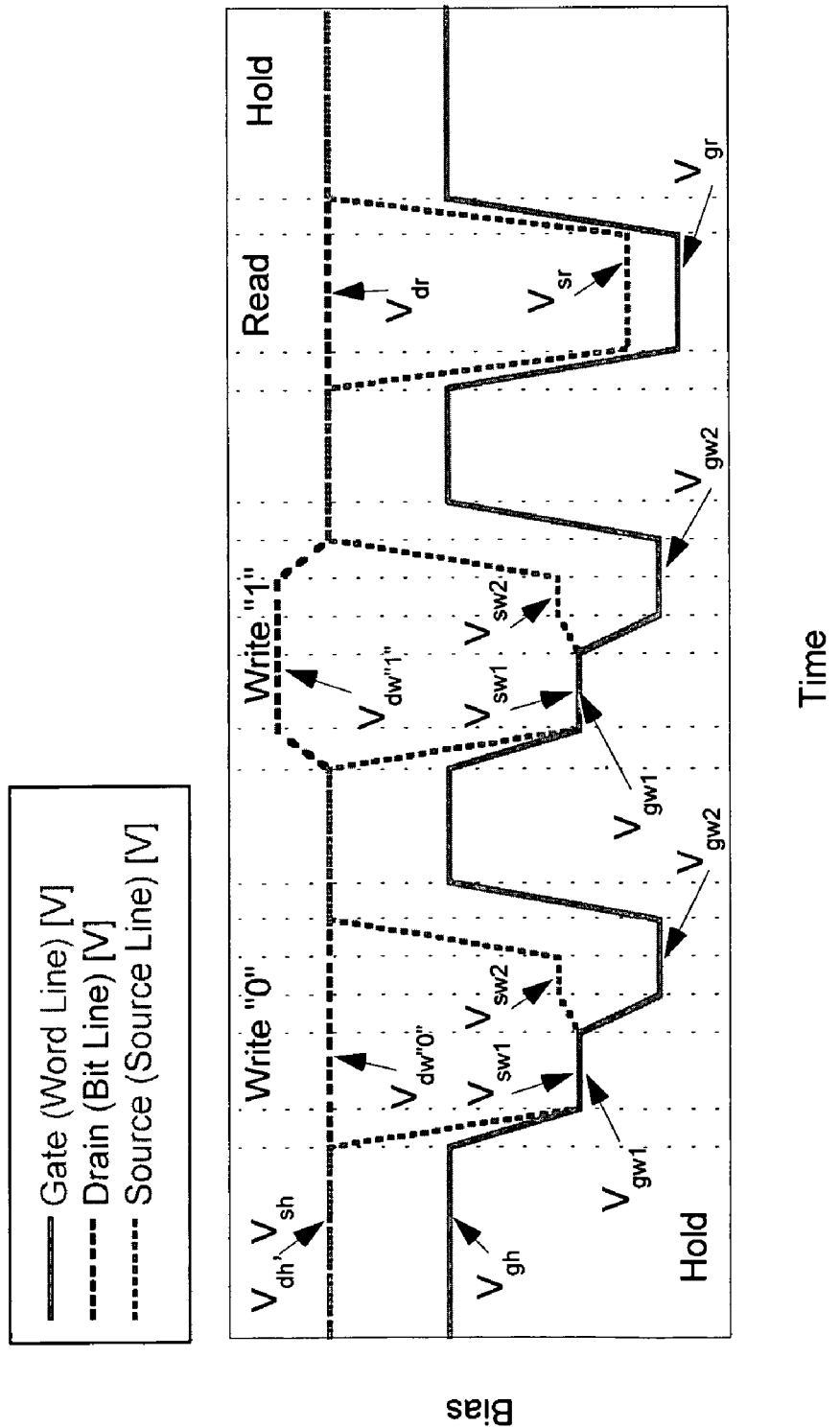

FIG. 22 provides exemplary control signal information (temporal and amplitude) in connection with the exemplary layout illustrated in FIG. 20. In this embodiment, the temporally varying control signals to implement the write operation include (i) a voltage applied to the gate ($V_{gw}$) via the associated word line, (ii) a voltage applied to the source ($V_{sw}$) via the source line, and (iii) a voltage applied to the drain region ($V_{dw}$) via the associated bit line. The logic states "1" and "0" are written to one or more selected cells by applying appropriate bit line voltages. In this regard, logic "1" is written into a memory cell by applying drain pulse ($V_{dw"1"}$) having an amplitude of 0.5V, and logic "0" is written into a memory cell by applying the drain pulse ($V_{dw"0"}$) having an amplitude of 0V. In addition, during phase 1 of the write operation, the source pulse ($V_{sw"1"1}$) includes an amplitude of –2.5V and the gate pulse ($V_{gw"1"1}$) includes an amplitude of –2.5V. During phase 2 of the write operation, the source pulse ($V_{sw"1"2}$) includes an amplitude of –2.2V, and the gate pulse ($V_{gw"1"2}$) includes an amplitude of –3.3V. Under these conditions, a bipolar current that is suitable for programming the memory cell to logic "1" is provided. Moreover, little to no bipolar current is generated for programming the memory cell to logic "0".

As noted above, in the preceding discussions pertaining to an exemplary write operation, the reference to a first phase and a second phase of a write operation was used for explanation purposes to highlight changes in voltage conditions of control signals in the exemplary embodiments. It may be advantageous, when writing logic "1" and "0", to apply constant or non-changing voltages to gate, drain region and/or source region during or through what has been labeled as write phases 1 and 2.

A row of memory cells (for example, 12a-12d) may be read in parallel. The memory cells are read by applying the following read control signals: (i) a voltage applied to the gate ($V_{gr}$) via the associated word line and (ii) a voltage applied to the source ($V_{sr}$) via the source line. The logic state of each memory cell (for example, 12a-12d) is sensed, determined and/or sampled on the associated bit line (32$_j$-32$_{j+3}$, respectively). In particular, during the read operation, the gate pulse ($V_{gr}$) includes an amplitude of –3V and the source pulse ($V_{sr}$) includes an amplitude of –3.5V.

As noted above, during the read operation, a bipolar current is generated in those memory cells storing logic "1" and little to no bipolar current is generated in those memory cells storing logic "0". The data state is determined primarily by, sensed substantially using and/or based substantially on the bipolar transistor current that is responsive to the read control signals and significantly less by the interface channel current component, which is less significant and/or negligible relatively to the bipolar component.

Figure 23:
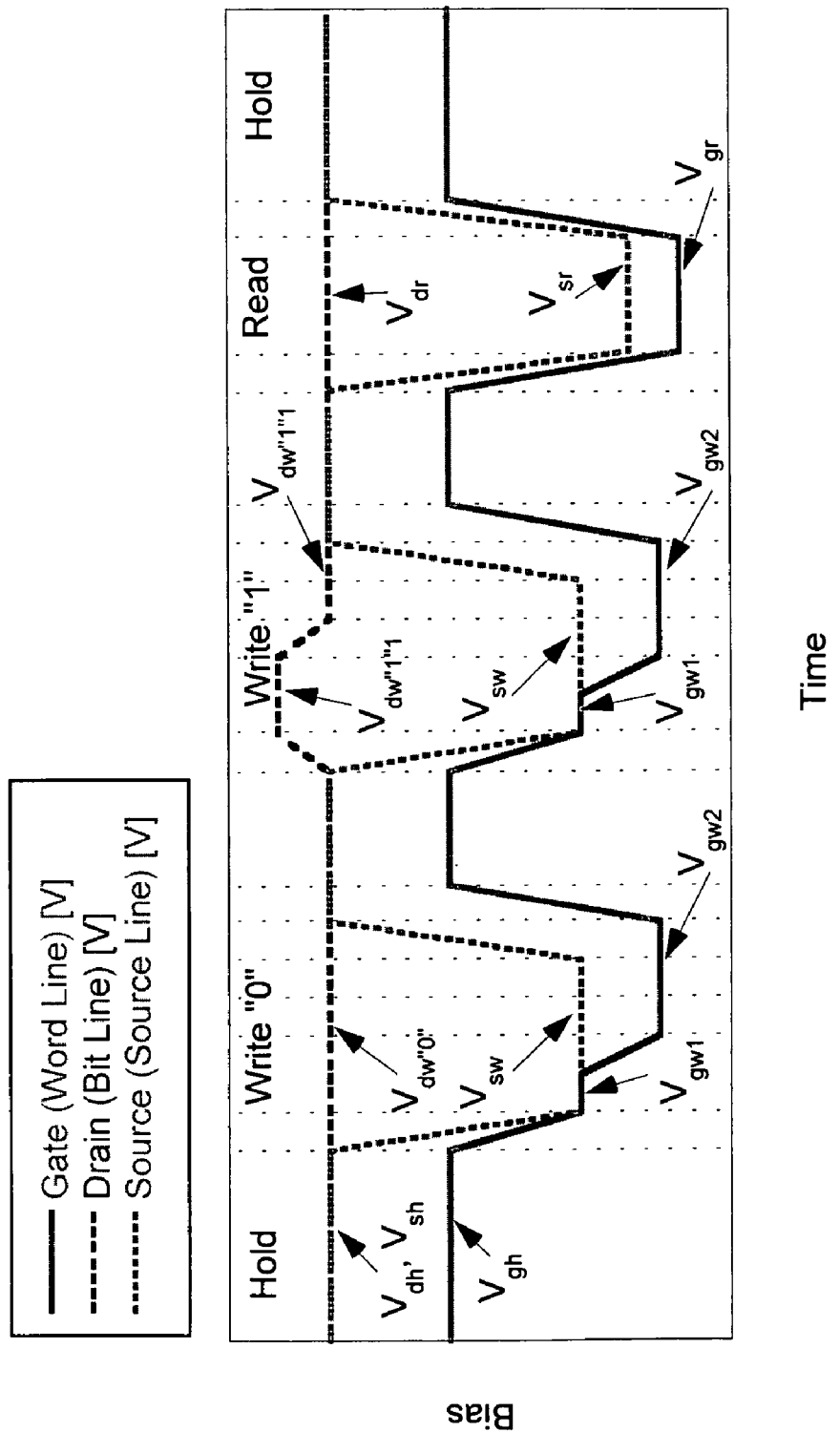

FIG. 23 provides exemplary control signal information (temporal and amplitude) in connection with the exemplary layout illustrated in FIG. 20. In this embodiment, the temporally varying control signals to implement the write operation include (i) a voltage applied to the gate ($V_{gw}$) via the associated word line, (ii) a voltage applied to the source ($V_{sw}$) via the source line, and (iii) a voltage applied to the drain region ($V_{dw}$) via the associated bit line. The logic states "1" and "0" are written to one or more selected cells by applying appropriate bit line voltages. In this regard, logic "1" is written into a memory cell by applying drain pulse ($V_{dw"1"}$) having (i) an amplitude of 0.5V during phase 1 and (ii) an amplitude of 0V during phase 2, and logic "0" is written into a memory cell by applying the drain pulse ($V_{dw"0"}$) having an amplitude of 0V. In addition, during phase 1 of the write operation, the source pulse ($V_{sw1}$) includes an amplitude of –2.5V and the gate pulse ($V_{gw1}$) includes an amplitude of –2.5V. During phase 2 of the write operation, the source pulse ($V_{sw2}$) includes an amplitude of –2.5V, and the gate pulse ($V_{gw2}$) includes an amplitude of –3.3V. Under these conditions, a bipolar current that is suitable for programming the memory cell to logic "1" is provided. Moreover, little to no bipolar current is generated for programming the memory cell to logic "0".

As noted above, in the preceding discussions pertaining to an exemplary write operation, the reference to a first phase and a second phase of a write operation was used for explanation purposes to highlight changes in voltage conditions of control signals in the exemplary embodiments. It may be advantageous, when writing logic "1" and "0", to apply constant or non-changing voltages to gate, drain region and/or source region during or through what has been labeled as write phases 1 and 2.

A row of memory cells (for example, 12a-12d) may be read in parallel. The memory cells are read by applying the following read control signals: (i) a voltage applied to the gate ($V_{gr}$) via the associated word line and (ii) a voltage applied to the source ($V_{sr}$) via the source line. The logic state of each memory cell (for example, 12a-12d) is sensed, determined and/or sampled on the associated bit line (32$_j$-32$_{j+3}$, respectively). In particular, during the read operation, the gate pulse ($V_{gr}$) includes an amplitude of –3V and the source pulse ($V_{sr}$) includes an amplitude of –3.5V.

As noted above, during the read operation, a bipolar current is generated in those memory cells storing logic "1" and little to no bipolar current is generated in those memory cells storing logic "0". The data state is determined primarily by, sensed substantially using and/or based substantially on the bipolar transistor current that is responsive to the read control signals and significantly less by the interface channel current component, which is less significant and/or negligible relatively to the bipolar component.

Figure 24:
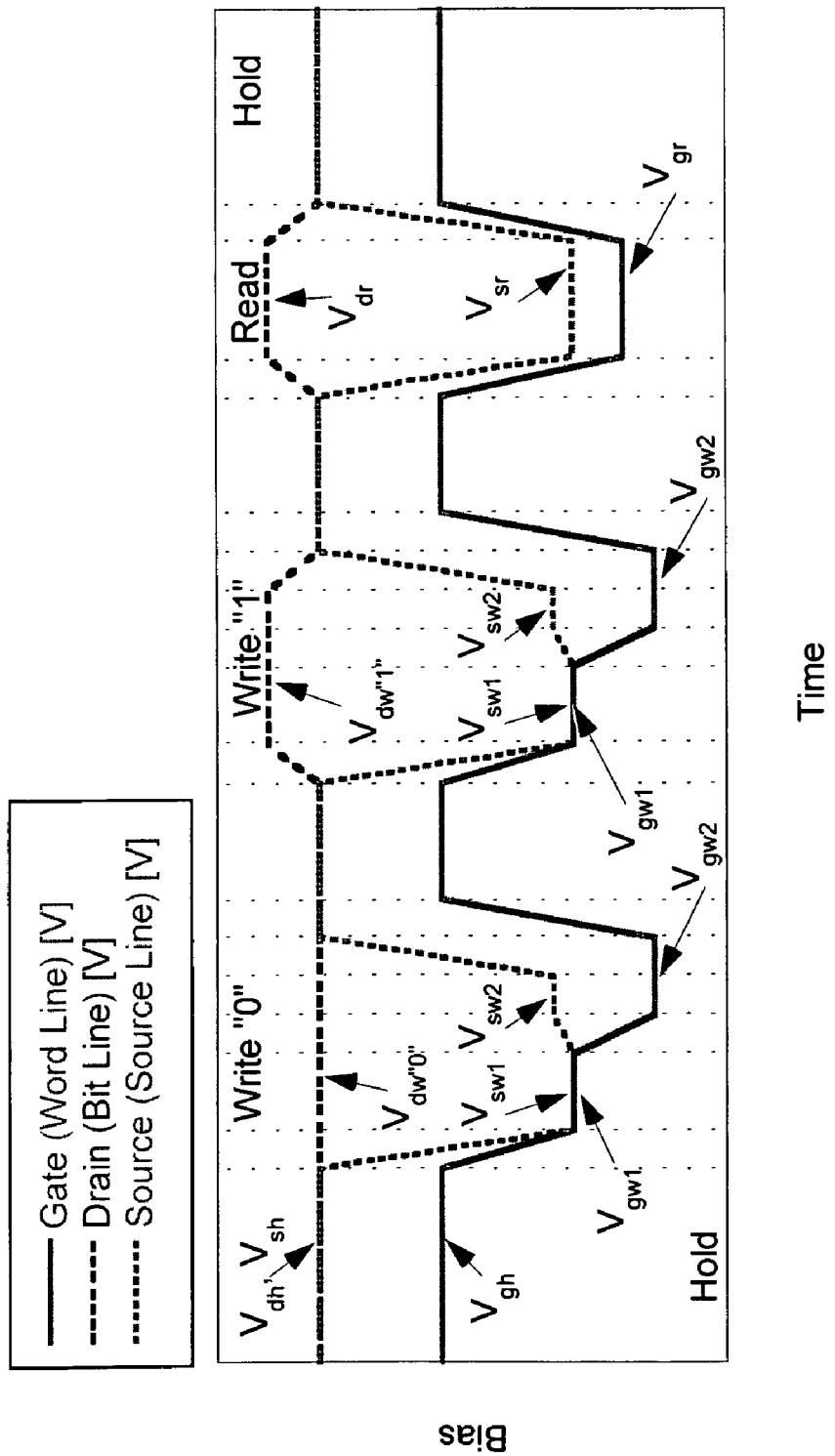

FIG. 24 provides exemplary control signal information (temporal and amplitude) in connection with the exemplary layout illustrated in FIG. 20.

In this embodiment, the temporally varying control signals to implement the write operation include (i) a voltage applied to the gate ($V_{gw}$) via the associated word line, (ii) a voltage applied to the source ($V_{sw}$) via the source line, and (iii) a voltage applied to the drain region ($V_{dw}$) via the associated bit line. The logic states "1" and "0" are written to one or more selected cells by applying appropriate bit line voltages. In this regard, logic "1" is written into a memory cell by applying drain pulse ($V_{dw"1"}$) having an amplitude of 0.5V, and logic "0" is written into a memory cell by applying the drain pulse ($V_{dw"0"}$) having an amplitude of 0V. In addition, during phase 1 of the write operation, the source pulse ($V_{sw1}$) includes an amplitude of –2.5V and the gate pulse ($V_{gw1}$) includes an amplitude of –2.5V. During phase 2 of the write operation, the source pulse ($V_{sw2}$) includes an amplitude of –2.2V, and the gate pulse ($V_{gw2}$) includes an amplitude of –3.3V. Under these conditions, a bipolar current that is suitable for programming the memory cell to logic "1" is provided. Moreover, little to no bipolar current is generated for programming the memory cell to logic "0".

As noted above, in the preceding discussions pertaining to an exemplary write operation, the reference to a first phase and a second phase of a write operation was used for explanation purposes to highlight changes in voltage conditions of control signals in the exemplary embodiments. It may be advantageous, when writing logic "1" and "0", to apply constant or non-changing voltages to gate, drain region and/or source region during or through what has been labeled as write phases 1 and 2.

A row of memory cells (for example, 12a-12d) may be read in parallel. The memory cells are read by applying the following read control signals: (i) a voltage applied to the gate ($V_{gr}$) via the associated word line and (ii) a voltage applied to the source ($V_{sr}$) via the source line. The logic state of each memory cell (for example, 12a-12d) is sensed, determined and/or sampled on the associated bit line ($32_j$-$32_{j+3}$, respectively). In particular, during the read operation, the gate pulse ($V_{gr}$) includes an amplitude of –2.5V and the source pulse ($V_{sr}$) includes an amplitude of –3V.

As noted above, during the read operation, a bipolar current is generated in those memory cells storing logic "1" and little to no bipolar current is generated in those memory cells storing logic "0". The data state is determined primarily by, sensed substantially using and/or based substantially on the bipolar transistor current that is responsive to the read control signals and significantly less by the interface channel current component, which is less significant and/or negligible relatively to the bipolar component.

Figure 25:
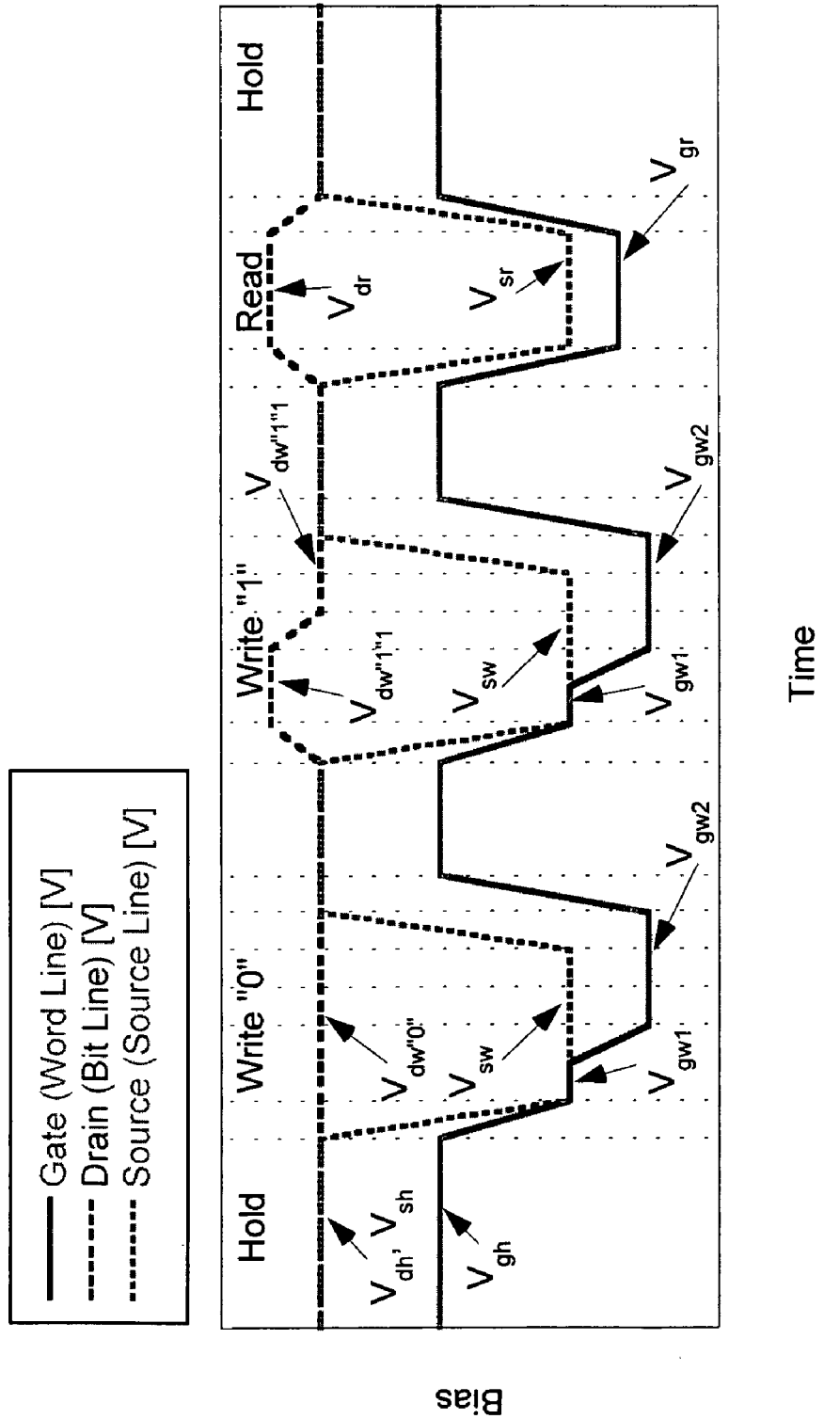

FIG. 25 provides exemplary control signal information (temporal and amplitude) in connection with the exemplary layout illustrated in FIG. 20. In this embodiment, the temporally varying control signals to implement the write operation include (i) a voltage applied to the gate ($V_{gw}$) via the associated word line, (ii) a voltage applied to the source ($V_{sw}$) via the source line, and (iii) a voltage applied to the drain region ($V_{dw}$) via the associated bit line. The logic states "1" and "0" are written to one or more selected cells by applying appropriate bit line voltages. In this regard, logic "1" is written into a memory cell by applying drain pulse ($V_{dw"1"}$) having (i) an amplitude of 0.5V during phase 1 and (ii) an amplitude of 0V during phase 2, and logic "0" is written into a memory cell by applying the drain pulse ($V_{dw"0"}$) having an amplitude of 0V. In addition, during phase 1 of the write operation, the source pulse ($V_{sw1}$) includes an amplitude of –2.5V and the gate pulse ($V_{gw1}$) includes an amplitude of –2.5V. During phase 2 of the write operation, the source pulse ($V_{sw2}$) includes an amplitude of –2.5V, the drain pulse ($V_{dw2}$) includes an amplitude of 0V, and the gate pulse ($V_{gw2}$) includes an amplitude of –3.3V. Under these conditions, a bipolar current that is suitable for programming the memory cell to logic "1" is provided. Moreover, little to no bipolar current is generated for programming the memory cell to logic "0".

As noted above, in the preceding discussions pertaining to an exemplary write operation, the reference to a first phase and a second phase of a write operation was used for explanation purposes to highlight changes in voltage conditions of control signals in the exemplary embodiments. It may be advantageous, when writing logic "1" and "0", to apply constant or non-changing voltages to gate, drain region and/or source region during or through what has been labeled as write phases 1 and 2.

A row of memory cells (for example, 12a-12d) may be read in parallel. The memory cells are read by applying the following read control signals: (i) a voltage applied to the gate ($V_{gr}$) via the associated word line, (ii) a voltage applied to the source ($V_{sr}$) via the source line, and (iii) a voltage applied to the drain ($V_{dr}$) via the associated bit line. The logic state of each memory cell (for example, 12a-12d) is sensed, determined and/or sampled on the associated bit line ($32_j$-$32_{j+3}$, respectively). In particular, during the read operation, the gate pulse ($V_{gr}$) includes an amplitude of –3V, the source pulse ($V_{sr}$) includes an amplitude of –2.5V and the drain pulse ($V_{dr}$) includes an amplitude of 0.5V.

As noted above, during the read operation, a bipolar current is generated in those memory cells storing logic "1" and little to no bipolar current is generated in those memory cells storing logic "0". The data state is determined primarily by, sensed substantially using and/or based substantially on the bipolar transistor current that is responsive to the read control signals and significantly less by the interface channel current component, which is less significant and/or negligible relatively to the bipolar component.

Although not discussed above with respect to the embodiments illustrated in FIGS. 19-25, it may be advantageous to employ a "holding" operation or condition for the other memory cells in memory cell array 10 to minimize and/or reduce the impact of the write and/or read operations for memory cells 12a-12d connected to word line $28_i$. For example, with reference to FIGS. 19 and 20, in one embodiment, a holding voltage is applied to the gates of the transistors of other memory cells of memory cell array 10 (for example, each memory cell connected to word lines $28_{i+1}$, $28_{i+2}$, $28_{i+3}$, and $28_{i+4}$). In one exemplary embodiment, a holding voltage of –1.2v is applied to the gate of each transistor of the memory cells connected to word lines $28_{i+1}$, $28_{i+2}$, $28_{i+3}$, and $28_{i+4}$. In this way, the impact of the write operation of memory cells 12a-12d (which are connected to word line $28_i$) on the other memory cells of memory cell array 10 is minimized and/or reduced.

Notably, the illustrated/exemplary voltage levels discussed above to implement the write and read operations of the embodiments of FIGS. 19-25 are merely exemplary. In the context of certain write and read operations, the control signals increase the potential of electrically floating body region which "turns on" or produces a bipolar current in the transistor of the memory cell. In the context of a write operation, the bipolar current generates majority carriers in the electrically floating body region which are then stored. In the context of a read operation, the data state may be determined primarily by, sensed substantially using and/or based substantially on the bipolar transistor current that is responsive to the read control signals and significantly less by the interface channel current component, which is less significant and/or negligible relatively to the bipolar component.

Accordingly, the illustrated/exemplary voltage levels to implement the write and read operations are merely exemplary. the indicated voltage levels may be relative or absolute. Alternatively, the voltages indicated may be relative in that each voltage level, for example, may be increased or decreased by a given voltage amount (for example, each voltage may be increased or decreased by 0.5, 1.0 and 2.0 volts) whether one or more of the voltages (for example, the source, drain or gate voltages) become or are positive and negative.

Figure 26:
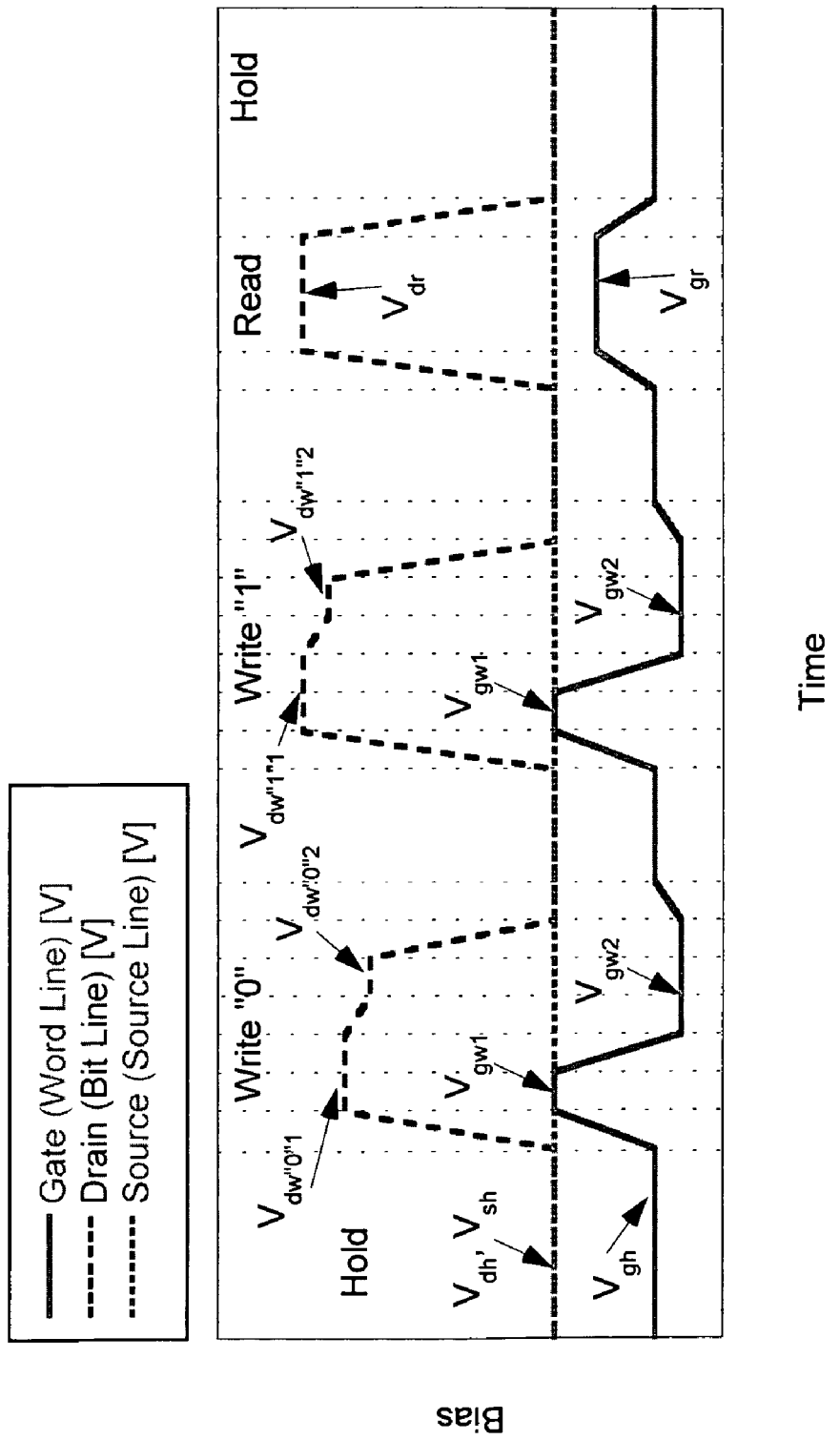

As mentioned above, the present inventions may be implemented in any memory array architecture having a plurality of memory cells that employ electrically floating body transistors. For example, in one embodiment, with reference to FIGS. 26 and 27, a memory array implementing the structure and techniques of the present inventions may be controlled and configured having a common source line for every two rows of memory cells (a row of memory cells includes a common word line). An example (including exemplary control signal voltage values), according to certain aspects of the present inventions is also shown that consists of the control signal waveforms and exemplary array voltages during one-step writing phase 1, phase 2, and reading.

In this embodiment, the temporally varying control signals to implement the write operation include (i) a voltage applied to the gate ($V_{gw}$) via the associated word line and (ii) a voltage applied to the drain region ($V_{dw}$) via the associated bit line. The logic states "1" and "0" are written to one or more selected cells by applying appropriate bit line voltages. In this regard, logic "1" is written into a memory cell by applying drain pulse ($V_{dw"1"}$) having (i) an amplitude of 3V during phase 1 and (ii) an amplitude of 2.7V during phase 2. Conversely, logic "0" is written into a memory cell by applying the drain pulse ($V_{dw"0"}$) having (i) an amplitude of 2.5V during phase 1 and (ii) an amplitude of 2.2V during phase 2. In addition, during phase 1 of the write operation, the gate pulse ($V_{gw1}$) includes an amplitude of 0V. During phase 2 of the write operation, the gate pulse ($V_{gw2}$) includes an amplitude of –1.5V. The voltage applied to the source lines (and, as such, the source regions of the transistors of the row of memory cells) is 0V. Under these conditions, a bipolar current that is suitable for programming the memory cell to logic "1" is provided. Moreover, little to no bipolar current is generated for programming the memory cell to logic "0".

As noted above, in the preceding discussions pertaining to an exemplary write operation, the reference to a first phase and a second phase of a write operation was used for explanation purposes to highlight changes in voltage conditions of control signals in the exemplary embodiments. It may be advantageous, when writing logic "1" and "0", to apply constant or non-changing voltages to gate, drain region and/or source region during or through what has been labeled as write phases 1 and 2.

A row of memory cells (for example, 12a-12d) may be read in parallel. The memory cells are read by applying the following read control signals: (i) a voltage applied to the gate ($V_{gr}$) via the associated word line and (ii) a voltage applied to the drain ($V_{dr}$) via the associated bit line. The logic state of each memory cell (for example, 12a-12d) is sensed, determined and/or sampled on the associated bit line (32j-32$_{j+3}$, respectively). In particular, during the read operation, the gate pulse ($V_{gr}$) includes an amplitude of –0.5V and the drain pulse ($V_{dr}$) includes an amplitude of 3V. The voltage applied to the source lines (and, as such, the source regions of the transistors of the row of memory cells) is 0V.

As noted above, during the read operation, a bipolar current is generated in those memory cells storing logic "1" and little to no bipolar current is generated in those memory cells storing logic "0". The data state is determined primarily by, sensed substantially using and/or based substantially on the bipolar transistor current that is responsive to the read control signals and significantly less by the interface channel current component, which is less significant and/or negligible relatively to the bipolar component.

Again, it may be advantageous to employ a "holding" operation or condition for the other memory cells in memory cell array 10 to minimize and/or reduce the impact of the write operation for memory cells 12a-12d connected to word line 28$_i$. In this embodiment, a holding voltage is applied to the gates of the transistors of other memory cells of memory cell array 10 (for example, each memory cell connected to word lines 28$_{i+1}$, 28$_{i+2}$, 28$_{i+3}$, and 28$_{i+4}$). In one exemplary embodiment, a holding voltage of –1.2v is applied to the gate of each transistor of the memory cells connected to word lines 28$_{i+1}$, 28$_{i+2}$, 28$_{i+3}$, and 28$_{i+4}$. In this way, the impact of the write operation of memory cells 12a-12d (which are connected to word line 28$_i$) on the other memory cells of memory cell array 10 is minimized and/or reduced.

Figure 28:
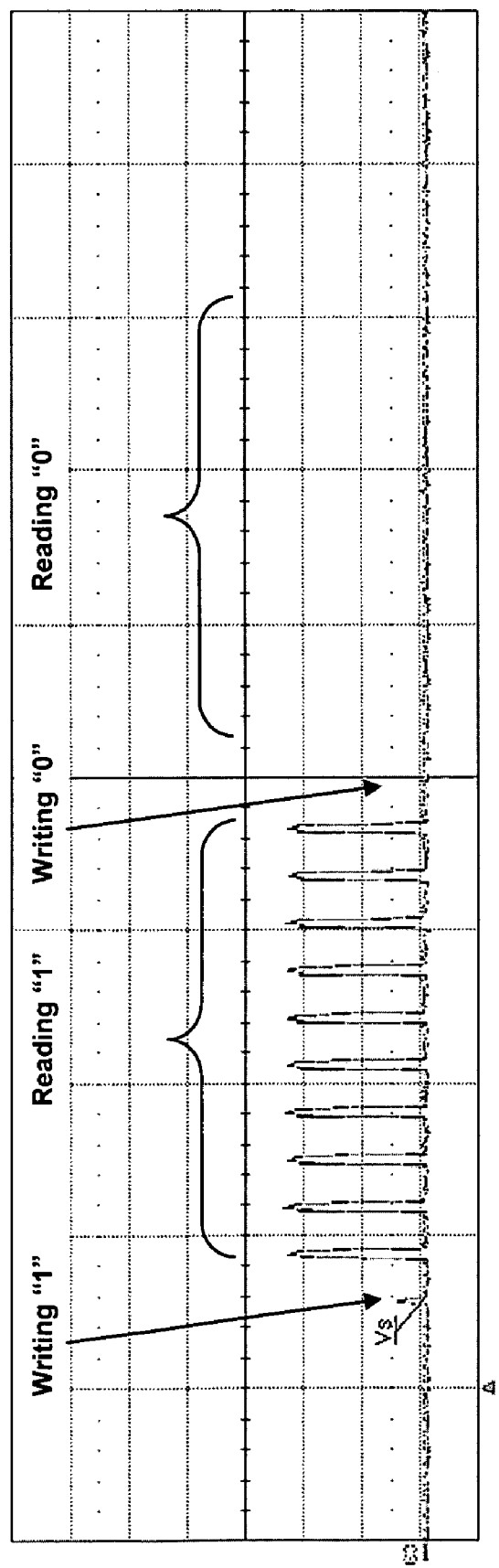
FIG. 28 illustrates a quasi non-destructive reading technique according to one embodiment of the present inventions.

Notably, the reading technique described herein may reduce the degradation of the floating body charge caused by charge-pumping (charge-pumping disturb) thus allowing the quasi non-disturbing reading (see, for example, FIG. 28). As a result, when memory cell 12 is read multiple times without or before a refresh operation, the read window remains relatively stable for each successive read operation.

The memory array may employ any of the exemplary programming, holding and/or reading techniques described herein. Moreover, exemplary voltage values for each of the control signals for a given operation (for example, programming, holding or reading), according to exemplary embodiments of the present inventions, is also provided.

As noted above, these embodiments of the present inventions may be implemented in any electrically floating body memory cell and memory cell array. For example, in one aspect, the present inventions are a memory array, having a plurality of memory cells each including an electrically floating body transistor, and/or technique of writing or programming data into one or more memory cells of such a memory array. In this aspect of the inventions, the data states of adjacent memory cells and/or memory cells that share a word line may be individually programmed.

The memory arrays may be comprised of N-channel, P-channel and/or both types of transistors. Indeed, circuitry that is peripheral to the memory array (for example, sense amplifiers or comparators, row and column address decoders, as well as line drivers (not illustrated herein)) may include P-channel and/or N-channel type transistors. Where P-channel type transistors are employed as memory cells 12 in the memory array(s), suitable write and read voltages (for example, negative voltages) are well known to those skilled in the art in light of this disclosure. Accordingly, for sake of brevity, these discussions will not be repeated.

Figure 29:
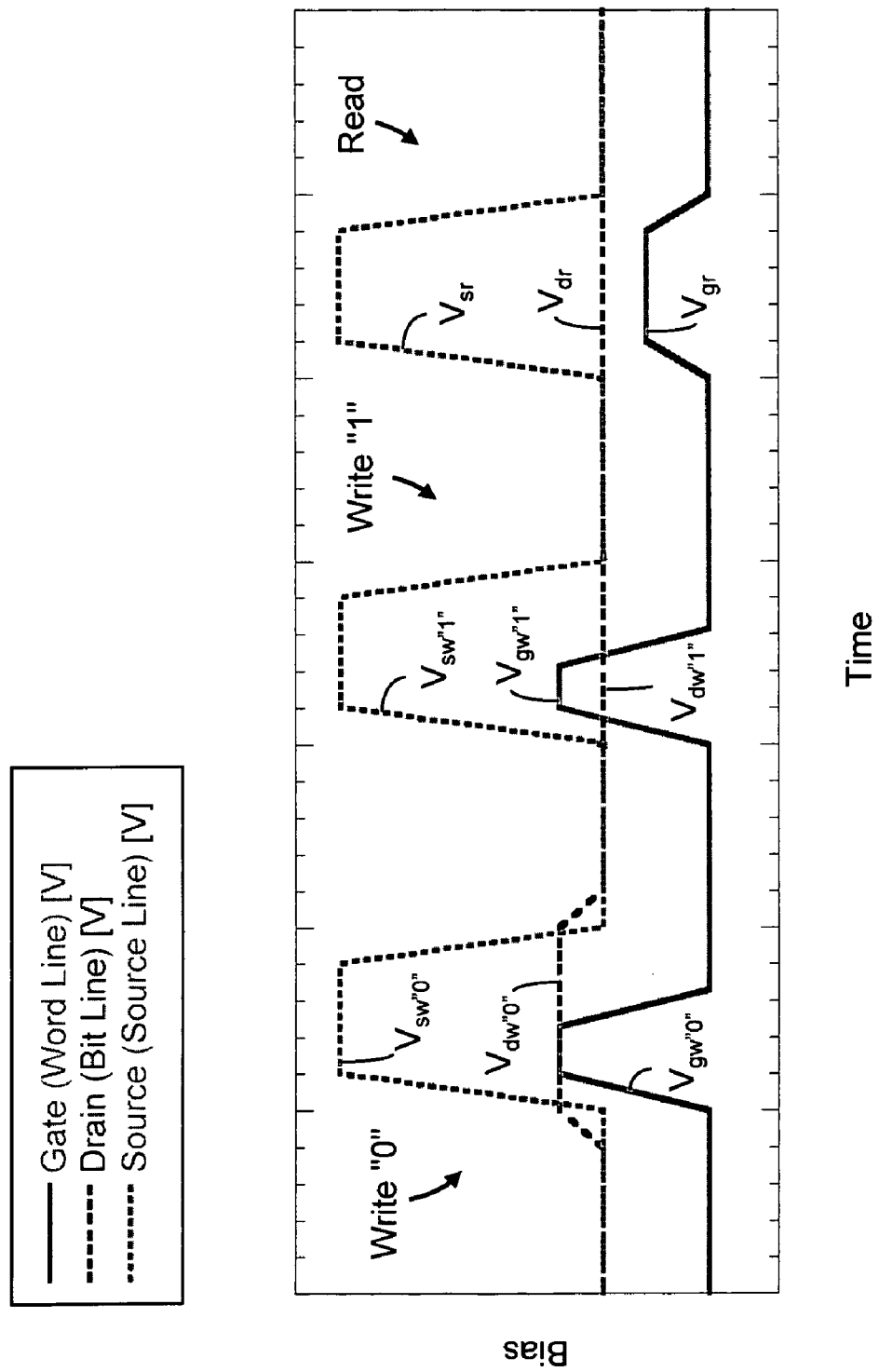
FIG. 29 illustrates exemplary timing relationships of selected write control signals to (i) program or write logic "0" into one or more N-channel type memory cells, (ii) program or write logic "1" into one or more N-channel type memory cells, and (iii) read one or more N-channel type memory cells according to one embodiment of the present inventions.
Figure 30:
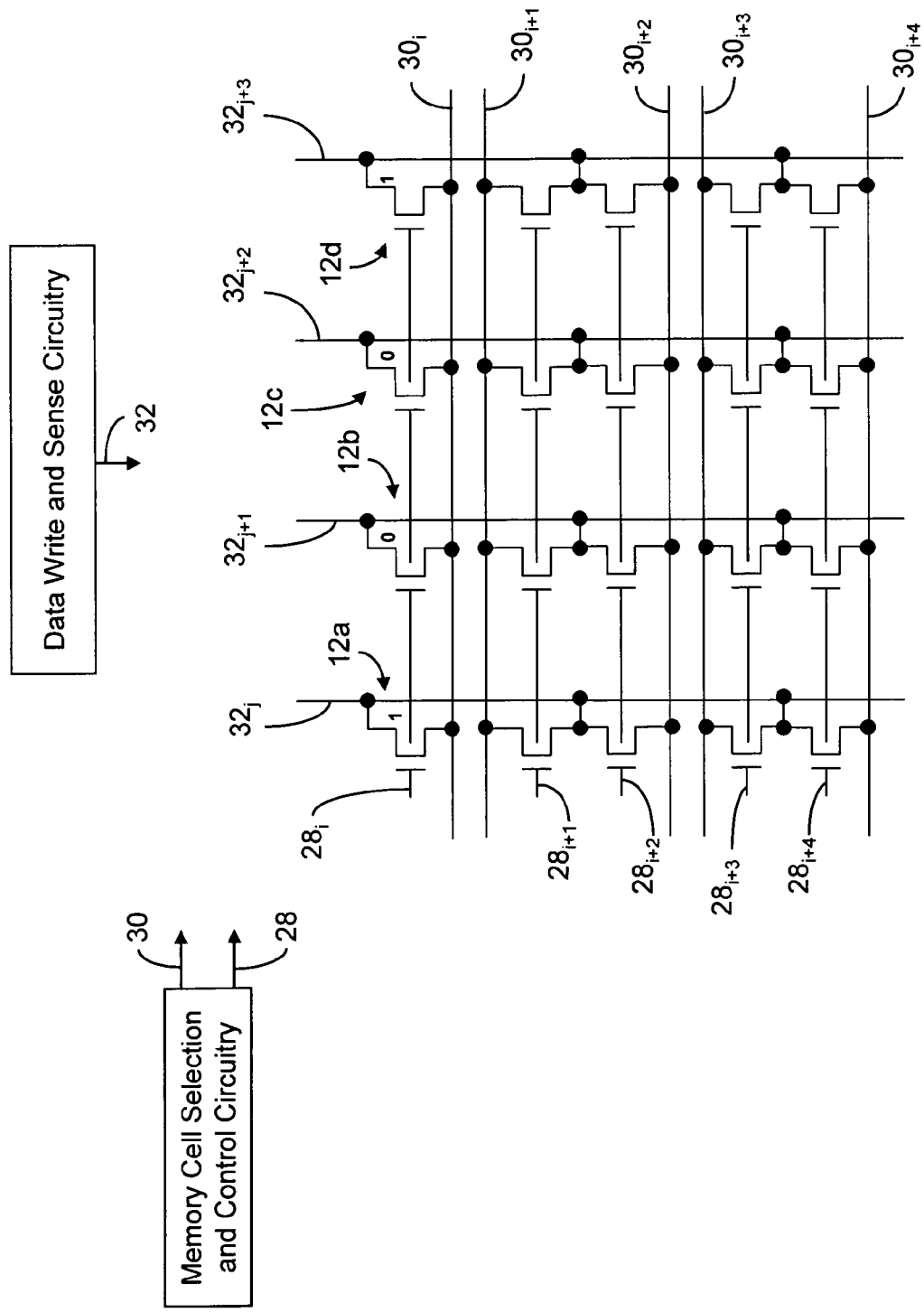
FIG. 30 illustrates an exemplary embodiment of a memory array having a plurality of memory cells (including N-channel type transistors) and employing a common source line configuration for each row of memory cells, according to certain aspects of the present inventions.

In another exemplary embodiment, with reference to FIGS. 29 and 30, control signals having a predetermined amplitude may be selectively applied to a row of memory cells (for example, memory cells 12a-d) to write logic "1" into selected memory cells 12a and 12d, and logic "0" into selected memory cells 12b and 12c. In particular, the logic "1" and "0" are written to one or more selected cells by applying appropriate bit line voltages. In this regard, logic "1" is written into a memory cell by applying drain pulse ($V_{dw"1"}$) having an amplitude of 0V, and logic "0" is written into a memory cell by applying the drain pulse ($V_{dw"0"}$) having an amplitude of 0.5V. For example, logic "1" may be programmed or written in memory cells 12a and 12d by applying a voltage pulse of 0V to bit lines $32_j$ and $32_{j+3}$, respectively. Logic "0" is programmed in memory cells 12b and 12c by applying a voltage pulse of 0.5V to bit lines $32_{j+1}$ and $32_{j+2}$, respectively.

In addition, a voltage of 3V is applied to source region of the transistors of memory cells 12a-12d (via source line $30_i$-$30_{i+4}$) and a voltage pulse of 0.5V to gate of the transistors of memory cells 12a-12d (via word line $28_i$). The source pulse may be applied before the gate pulse, simultaneously thereto, or after the gate pulse is applied to gate 16 of memory cells 12a and 12d. It is preferred that the source pulse be applied to source region of the transistors of memory cells 12a and 12d with a sufficient amplitude to maintain a sufficient bipolar current to program logic "1" into memory cells 12a and 12d. From a relative timing perspective, it is preferred that the source pulse extend beyond when the gate pulse reduces or ceases, as illustrated in FIG. 29. In this way, majority carriers are generated in the electrically floating body region and majority carriers may accumulate (and be stored) in a portion of the electrically floating body region of the transistor of the memory cell 12 that is juxtaposed or near the gate dielectric (which is disposed between the gate and the electrically floating body region).

Notably, in this exemplary embodiment, when programming logic "0", a drain pulse (0.5V amplitude in this example) is applied to drain regions of the transistors of memory cells 12b and 12c to prevent, prohibit, limit and/or retard a bipolar current (if any) from causing or generating a sufficient charge in the floating body region of transistors to program or write logic state "1" into the transistors of memory cells 12b and 12c. As such, the drain pulse may be characterized as a "blocking" pulse. From a relative timing perspective, it is preferred that the drain pulse be applied to drain regions of the transistors of memory cells 12b and 12c for a temporal period that extends beyond or is applied before, during and after the source and gate pulses (for example, initiates, starts, ramps, declines and/or terminates) as illustrated in FIG. 29.

With continued reference to FIGS. 29 and 30, for those unselected memory cells (i.e., the memory cells coupled to word lines $28_{i+1}$, $28_{i+2}$ and $28_{i+3}$), a holding condition may be applied or established to prevent, minimize or avoid disturbance of the data state of, or charge stored in the unselected memory cells. In this regard, a voltage (for example, −1.2V) may be applied to gates 16 of the unselected memory cells and a voltage (for example, 0V) may be applied to source regions and drain regions of the transistors of the unselected memory cells to prevent, minimize or avoid disturbance of the data state in the unselected memory cells during the programming or writing operation. Under these conditions, the data state of the unselected memory cells is unaffected (or substantially unaffected) by the programming of or writing to selected memory cells 12a-d.

The memory cells may be read by applying the following read control signals: (i) a voltage applied to the gate ($V_{gr}$) via the associated word line and (ii) a voltage applied to the source ($V_{sr}$) via the source line. The logic state of each memory cell (for example, 12a-12d) is sensed, determined and/or sampled on the associated bit line ($32_j$-$32_{j+3}$, respectively). In particular, during the read operation, the gate pulse ($V_{gr}$) includes an amplitude of −0.5V and the source pulse ($V_{sr}$) includes an amplitude of 3V. In this embodiment, the source pulse ($V_{sr}$) may be applied to source line 30 (and, for example, the source regions of the transistors of memory cells 12a-12d) before application of the gate pulse to word line 28 (and, for example, the gates of the transistors of memory cells 12a-12d), simultaneously thereto, or after the gate pulse is applied to word line 28. Further, the source pulse may cease or terminate before the gate pulse, simultaneously thereto (as illustrated in FIG. 29), or after the gate pulse concludes or ceases.

Notably, for those memory cells that are not read (i.e., those memory cells coupled to word lines $28_{i+1}$, $28_{i+2}$ and $28_{i+3}$), a holding condition may be applied or established to prevent, minimize or avoid disturbance of the data state in the unselected memory cells. In this regard, a voltage (for example, −1.2V) may be applied to gates 16 of the unselected memory cells and a voltage (for example, 0V) may be applied to source regions of the transistors of the unselected memory cells to prevent, minimize or avoid disturbance of the data state in the unselected memory cells during the read operation. Under these conditions, the state of the unselected memory cells is unaffected (or it is substantially unaffected) during the reading of, for example, selected memory cells 12a-d.

As noted above, the illustrated/exemplary voltage levels to implement the write and read operations are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.25, 0.5, 1.0 and 2.0 volts) whether one or more of the voltages (for example, the source, drain or gate voltages) become or are positive and negative.

During the read operation, a bipolar current is generated in those memory cells storing logic "1" and little to no bipolar current is generated in those memory cells storing logic "0". The data state is determined primarily by, sensed substantially using and/or based substantially on the bipolar transistor current that is responsive to the read control signals and significantly less by the interface channel current component, which is less significant and/or negligible relatively to the bipolar component.

Further, the reading technique described herein may reduce the degradation of the floating body charge caused by charge-pumping (charge-pumping disturb) thus allowing the quasi non-disturbing reading. As a result, when memory cell 12 is read multiple times without or before a refresh operation, the read window remains relatively stable for each successive read operation.

Figure 31:
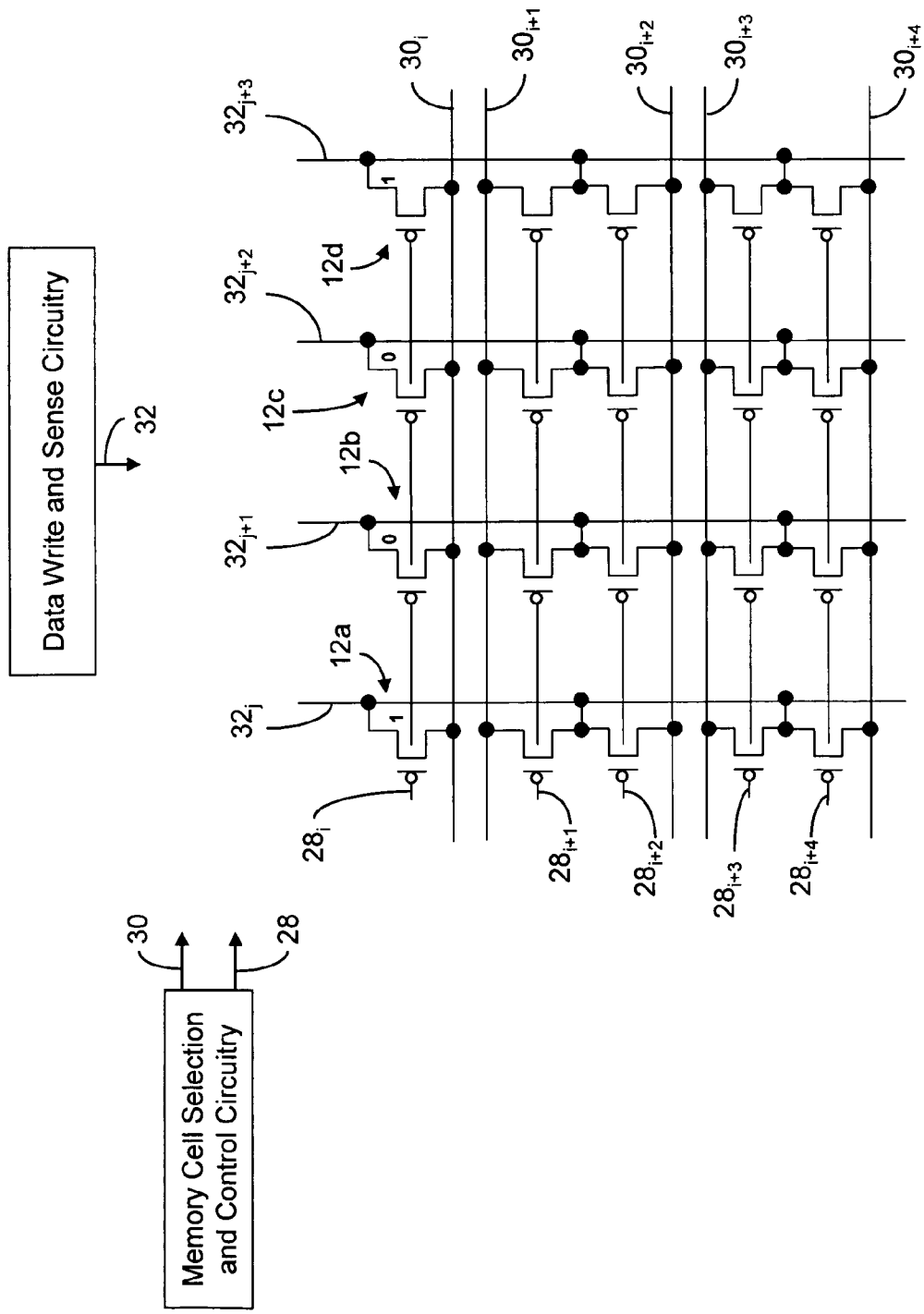
FIG. 31 illustrates an exemplary embodiment of a memory array having a plurality of memory cells (including P-channel type transistors) and employing a common source line configuration for each row of memory cells, according to certain aspects of the present inventions.

As noted above, memory array 10 may be comprised of N-channel, P-channel and/or both types of transistors. Indeed, circuitry that is peripheral to the memory array (for example, sense amplifiers or comparators, row and column address decoders, as well as line drivers (not illustrated herein)) may include P-channel and/or N-channel type transistors. Where P-channel type transistors are employed as memory cells 12 in the memory array(s), suitable write and read voltages (for example, negative voltages) are well known to those skilled in the art in light of this disclosure. For example, with reference to FIG. 31, where P-channel type transistors are employed as memory cells 12, the exemplary control voltages and timing relationships of FIG. 32 may be employed to (i) program or write logic state "1" into one or more P-channel type memory cells, (ii) program or write logic state "0" into one or more P-channel type memory cells, and (iii) read one or more P-channel type memory cells.

Briefly, the logic "1" and "0" are written to one or more selected memory cells, having P-channel type transistors, by applying appropriate bit line voltages. In this regard, logic "1" is written into a memory cell by applying drain pulse ($V_{dw"1"}$) having an amplitude of 0V, and logic "0" is written into a memory cell by applying the drain pulse ($V_{dw"0"}$) having an amplitude of −0.5V. For example, logic "1" may be programmed or written in memory cells 12a and 12d by applying a voltage pulse of 0V to bit lines $32_j$ and $32_{j+3}$, respectively. Logic "0" is programmed in memory cells 12b and 12c by applying a voltage pulse of −0.5V to bit lines $32_{j+1}$ and $32_{j+2}$, respectively.

In addition, a voltage of −3V is applied to source region of the transistors of memory cells 12a-12d (via source line $30_i$-$30_{i+4}$) and a voltage pulse of −0.5V to gate of the transistors of memory cells 12a-12d (via word line $28_i$). As with the N-channel type memory cells, the source pulse may be applied before the gate pulse, simultaneously thereto, or after the gate pulse is applied to the gate of the memory cells. It is preferred that the source pulse be applied to source region of the memory cells with a sufficient amplitude to maintain a sufficient bipolar current to program logic state "1" into the memory cells. From a relative timing perspective, it is preferred that the source pulse extends beyond when the gate pulse reduces or ceases (See, FIG. 32). In this way, majority carriers are generated in the electrically floating body region and majority carriers may accumulate (and be stored) in a portion of the electrically floating body region of the transistor of the memory cell 12 that is juxtaposed or near the gate dielectric (which is disposed between the gate and the electrically floating body region).

Figure 32:
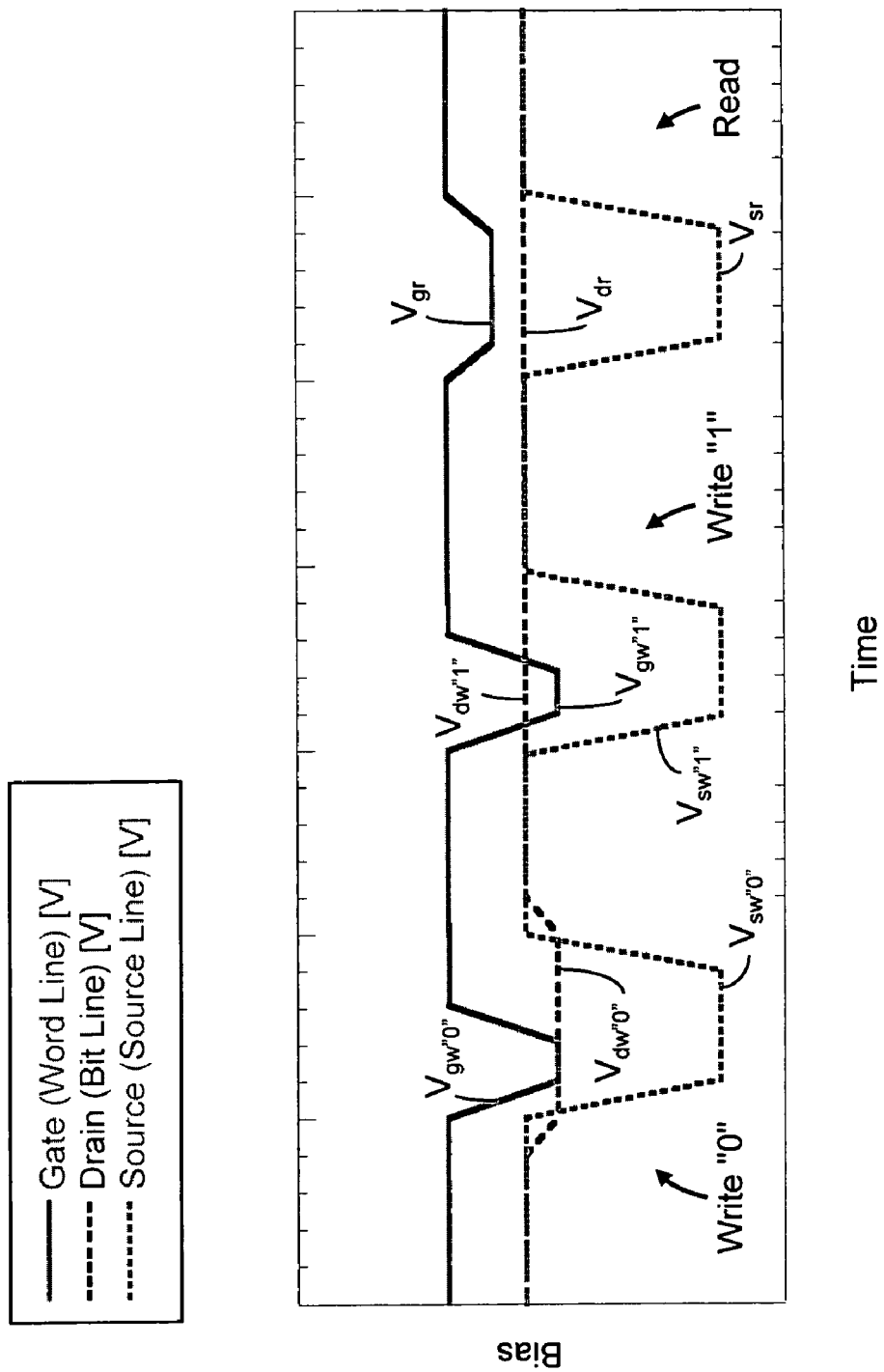
FIG. 32 illustrates exemplary timing relationships of selected write control signals to (i) program or write logic "0" into one or more P-channel type memory cells, (ii) program or write logic "1" into one or more P-channel type memory cells, and (iii) read one or more P-channel type memory cells according to one embodiment of the present inventions.

Notably, in this exemplary embodiment, when programming logic "0", a drain pulse (−0.5V amplitude in this example) is applied to drain regions of the transistors of memory cells 12b and 12c to prevent, prohibit, limit and/or retard a bipolar current (if any) from causing or generating a sufficient charge in the floating body region of transistors to program or write logic state "1" into the transistors of memory cells 12b and 12c. As such, the drain pulse may be characterized as a "blocking" pulse. From a relative timing perspective, it is preferred that the drain pulse be applied to drain regions of the transistors of memory cells 12b and 12c for a temporal period that extends beyond or is applied before, during and after the source and gate pulses (for example, initiates, starts, ramps, declines and/or terminates) as illustrated in FIG. 32.

From a relative timing perspective, it is preferred that the drain pulse be applied to the drain region of the memory cells programmed to logic state "0" for a temporal period that extends or is applied before, during and after the source and gate pulses (for example, initiates, starts, ramps, declines and/or terminates). (See, FIG. 32).

Notably, for those unselected memory cells (i.e., the memory cells coupled to word lines not enabled), a holding condition may be applied or established to prevent, minimize or avoid disturbance of the data state of, or charge stored in the unselected memory cells. In this regard, a voltage (for example, 1.2V) may be applied to the gates of the unselected memory cells and a voltage (for example, 0V) may be applied to the source and drain regions of the unselected memory cells to prevent, minimize or avoid disturbance of the data state in the unselected memory cells during the programming or writing operation. Under these conditions, the data state of the unselected memory cells is unaffected (or substantially unaffected) by the programming of or writing to selected memory cells.

The data may be read from P-channel type memory cells applying the following read control signals: (i) a voltage applied to the gate ($V_{gr}$) via the associated word line and (ii) a voltage applied to the source ($V_{sr}$) via the source line. The logic state of each memory cell (for example, 12a-12d) is sensed, determined and/or sampled on the associated bit line ($32_j$-$32_{j+3}$, respectively). In particular, during the read operation, the gate pulse ($V_{gr}$) includes an amplitude of 0.5V and the source pulse ($V_{sr}$) includes an amplitude of −3V. In this embodiment, the source pulse ($V_{sr}$) may be applied to source line 30 (and, for example, the source regions of the transistors of memory cells 12a-12d) before application of the gate pulse to word line 28 (and, for example, the gates of the transistors of memory cells 12a-12d), simultaneously thereto, or after the gate pulse is applied to word line 28. Further, the source pulse may cease or terminate before the gate pulse, simultaneously thereto (as illustrated in FIG. 32), or after the gate pulse concludes or ceases.

During the read operation, a bipolar current is generated in those memory cells storing logic "1" and little to no bipolar current is generated in those memory cells storing logic "0". The data state is determined primarily by, sensed substantially using and/or based substantially on the bipolar transistor current that is responsive to the read control signals and significantly less by the interface channel current component, which is less significant and/or negligible relatively to the bipolar component.

Notably, for those memory cells that are not read (i.e., those memory cells coupled to non-enabled or unselected word lines), a holding condition may be applied or established to prevent, minimize or avoid disturbance of the data state in the unselected memory cells. In this regard, a voltage (for example, 1.2V) may be applied to the gates of the unselected memory cells and a voltage (for example, 0V) may be applied to the source regions of the unselected memory cells to prevent, minimize or avoid disturbance of the data state in the unselected memory cells during the read operation. Under these conditions, the states of the unselected memory cells are unaffected (or it is substantially unaffected) during the reading of selected memory cells.

The voltage amplitudes illustrated in FIG. 32 to perform certain operations are merely exemplary. The indicated voltage levels may be relative or absolute. Alternatively, as mentioned above, the voltages indicated may be relative in that each voltage level, for example, may be increased or decreased by a given voltage amount (for example, each voltage may be increased or decreased by −0.1, −0.25, −0.5, −1.0 and −2.0 volts) whether one or more of the voltages (for example, the source, drain or gate voltages) become or are positive and negative.

As mentioned above, the present inventions may be implemented in any electrically floating body memory cell and memory cell array. For example, in certain aspects, the present inventions are directed to a memory array, having a plurality of memory cells each including an electrically floating body transistor, and/or technique of programming data into one or more memory cells of such a memory cell array. In this aspect of the inventions, the data states of adjacent memory cells and/or memory cells that share a word line may or may not be individually programmed.

With reference to FIGS. 12A and 12B, memory array 10 may be comprised of a plurality of memory cells 12 of N-channel type, P-channel type and/or both types of electrically floating body transistors. The memory array 10 includes a plurality of rows and columns (for example, in a matrix form) of memory cells 12.

The circuitry which is peripheral to memory array 10 (for example, data write and sense circuitry 36 (such as, for example, sense amplifiers or comparators), memory cell selection and control circuitry 38 (such as, for example, address decoders and word line drivers)) may include P-channel type and/or N-channel type transistors. Where N-channel type transistors or P-channel type transistors are employed as memory cells 12 in memory array(s) 10, suitable write voltages are known to those skilled in the art. Accordingly, for sake of brevity, these discussions will not be repeated here.

As mentioned above, memory cells 12 (having electrically floating body transistor 14) and memory cell array 10 of the present inventions may be implemented in an integrated circuit device having a memory portion and a logic portion (see, for example, FIG. 12A), or an integrated circuit device that is primarily a memory device (see, for example, FIG. 12B). Indeed, the present inventions may be implemented in any device having one or more memory cells 12 (having electrically floating body transistors) and/or memory cell arrays 10. For example, with reference to FIG. 12A, an integrated circuit device may include array 10, having a plurality of memory cells 12 (having electrically floating body transistors), data write and sense circuitry, and memory cell selection and control circuitry (not illustrated in detail). The data write and sense circuitry writes data into and senses the data state of one or more memory cells. The memory cell selection and control circuitry selects and/or enables one or more predetermined memory cells 12 to be read by data sense circuitry during a read operation.

For example, the electrically floating body transistor, which programmed (written to), controlled and/or read using the techniques of the present inventions, may be employed in any electrically floating body memory cell, and/or memory cell array architecture, layout, structure and/or configuration employing such electrically floating body memory cells. In this regard, an electrically floating body transistor, which state is read by using the techniques of the present inventions, may be implemented in the memory cell, architecture, layout, structure and/or configuration described and illustrated in the following non-provisional U.S. patent applications:

(1) application Ser. No. 10/450,238, which was filed by Fazan et al. on Jun. 10, 2003 and entitled "Semiconductor Device" (now U.S. Pat. No. 6,969,662);

(2) application Ser. No. 10/487,157, which was filed by Fazan et al. on Feb. 18, 2004 and entitled "Semiconductor Device" (U.S. Patent Application Publication No. 2004/0238890);

(3) application Ser. No. 10/829,877, which was filed by Ferrant et al. on Apr. 22, 2004 and entitled "Semiconductor Memory Cell, Array, Architecture and Device, and Method of Operating Same" (U.S. Patent Application Publication No. 2005/0013163);

(4) application Ser. No. 10/840,009, which was filed by Ferrant et al. on May 6, 2004 and entitled "Semiconductor Memory Device and Method of Operating Same" (U.S. Patent Application Publication No. 2004/0228168); and (5) application Ser. No. 10/941,692, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same" (U.S. Patent Application Publication No. 2005/0063224).

The entire contents of these five (5) U.S. patent applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference herein in its entirety.

Notably, the memory cells may be controlled (for example, programmed or read) using any of the control circuitry described and illustrated in the above-referenced five (5) U.S. patent applications. For the sake of brevity, those discussions will not be repeated; such control circuitry is incorporated herein by reference. Indeed, all memory cell selection and control circuitry for programming, reading, controlling and/or operating memory cells including electrically floating body transistors, whether now known or later developed, are intended to fall within the scope of the present inventions.

Moreover, the data write and data sense circuitry may include a sense amplifier (not illustrated in detail herein) to read the data stored in memory cells 12. The sense amplifier may sense the data state stored in memory cell 12 using voltage or current sensing circuitry and/or techniques. In the context of a current sense amplifier, the current sense amplifier may compare the cell current to a reference current, for example, the current of a reference cell (not illustrated). From that comparison, it may be determined whether memory cell 12 contained logic high (relatively more majority carriers 34 contained within body region 18) or logic low data state (relatively less majority carriers 34 contained within body region 18). Such circuitry and configurations thereof are well known in the art.

In addition, the present inventions may employ the reference generation techniques (used in conjunction with the data sense circuitry for the read operation) described and illustrated in U.S. Provisional Patent Application Ser. No. 60/718,417, which was filed by Bauser on Sep. 19, 2005, and entitled "Method and Circuitry to Generate a Reference Current for Reading a Memory Cell Having an Electrically Floating Body Transistor, and Device Implementing Same". The entire contents of the U.S. Provisional Patent Application Ser. No. 60/718,417 are incorporated herein by reference. Further, the present inventions may also employ the read circuitry and techniques described and illustrated in U.S. patent application Ser. No. 10/840,902, which was filed by Portmann et al. on May 7, 2004, and entitled "Reference Current Generator, and Method of Programming, Adjusting and/or Operating Same" (now U.S. Pat. No. 6,912,150). The contents of U.S. Provisional Patent Application Ser. No. 60/718,417 and U.S. Pat. No. 6,912,150 are hereby incorporated by reference herein.

It should be further noted that while each memory cell 12 in the exemplary embodiments (described above) includes one transistor 14, memory cell 12 may include two transistors, as described and illustrated in application Ser. No. 10/829,877, which was filed by Ferrant et al. on Apr. 22, 2004 and entitled "Semiconductor Memory Cell, Array, Architecture and Device, and Method of Operating Same" (U.S. Patent Application Publication No. 2005/0013163). The contents of U.S. Patent Application Publication No. 2005/0013163 are hereby incorporated by reference herein The electrically floating memory cells, transistors and/or memory array(s) may be fabricated using well known techniques and/or materials. Indeed, any fabrication technique and/or material, whether now known or later developed, may be employed to fabricate the electrically floating memory cells, transistors and/or memory array(s). For example, the present inventions may employ silicon, germanium, silicon/ germanium, gallium arsenide or any other semiconductor material (whether bulk-type or SOI) in which transistors may be formed. As such, the electrically floating memory cells may be disposed on or in (collectively "on") SOI-type substrate or a bulk-type substrate.

Indeed, the electrically floating transistors, memory cells, and/or memory array(s) may employ the techniques described and illustrated in non-provisional patent application entitled "Integrated Circuit Device, and Method of Fabricating Same", which was filed on Jul. 2, 2004, by Fazan, Ser. No. 10/884,481 (U.S. Patent Application Publication No. 2005/0017240), provisional patent application entitled "One Transistor Memory Cell having Mechanically Strained Electrically Floating Body Region, and Method of Operating Same", which was filed on Oct. 19, 2005, Ser. No. 60/728,060, by Bassin, and/or provisional patent application entitled "Memory Cell, Array and Device, and Method of Operating Same", which was filed on Oct. 19, 2005, Ser. No. 60/728,061, by Okhonin et al. (hereinafter collectively "Integrated Circuit Device Patent Applications"). The contents of the Integrated Circuit Device Patent Applications are hereby incorporated by reference herein.

In another aspect, the present inventions are directed to techniques for programming, reading, controlling and/or operating a semiconductor memory cell, array, architecture and device including electrically floating body transistors, having, for example, fully depleted (FD), surrounding-gate, double-gate, triple-gate and/or FinFET characteristics, in which electrical charge is stored in the body of the transistor. The present inventions are also directed to semiconductor memory cell, array, architecture and device that implement circuitry to implement such reading, controlling and/or operating techniques. The programming/reading technique may employ any of the techniques described and/or illustrated herein.

Figure 33:
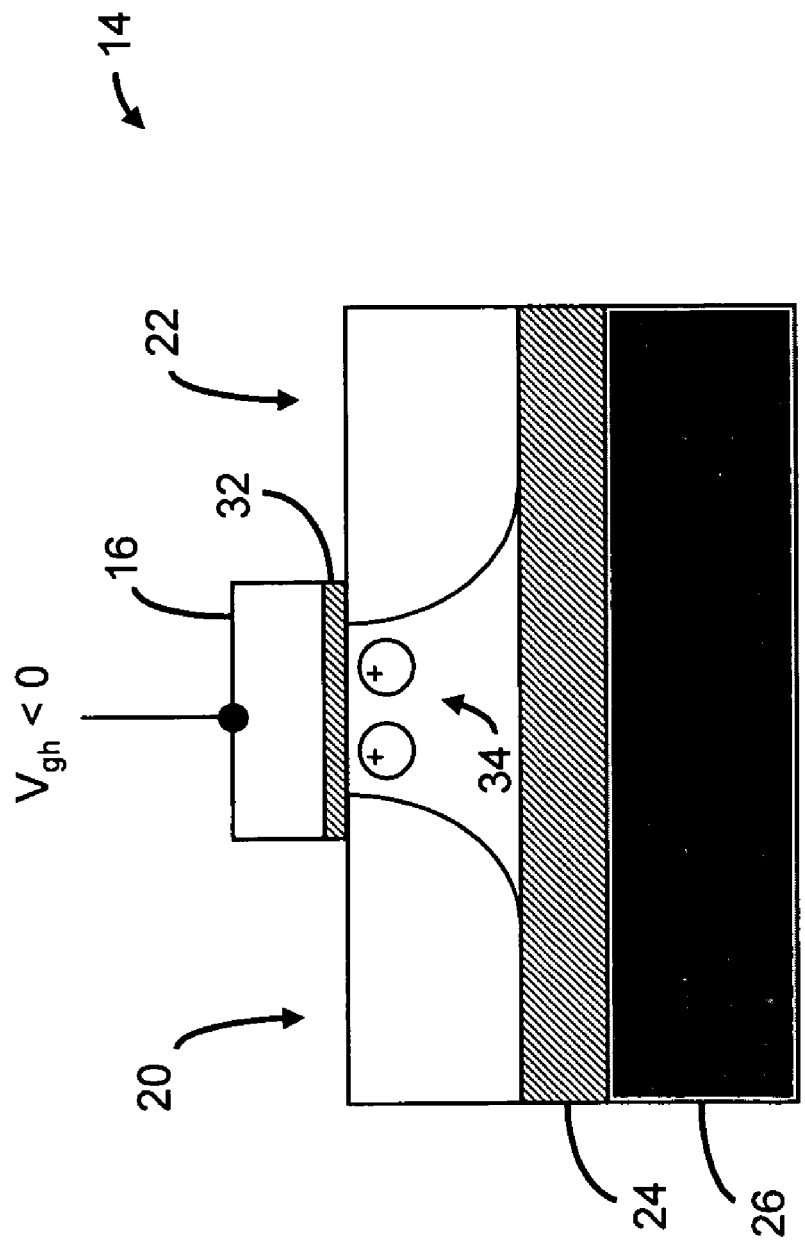
FIG. 33 illustrates an exemplary schematic (and control signals) of an FD transistor employed as a floating body memory cell, according to an aspect of the present inventions; notably, back gate bias is not required (although it may be employed)

FIG. 33 illustrates the FD transistor (N-channel type) in a holding condition in accordance with the present inventions. The accumulation layer is induced by application of a negative bias or voltage to the front gate (i.e., gate 16). In this case FD transistor 14 behaves as a PD transistor thus it may be used as a floating body memory cell. When used in this manner, an advantage of this embodiment is that a back gate bias need not be applied.

Figure 34:
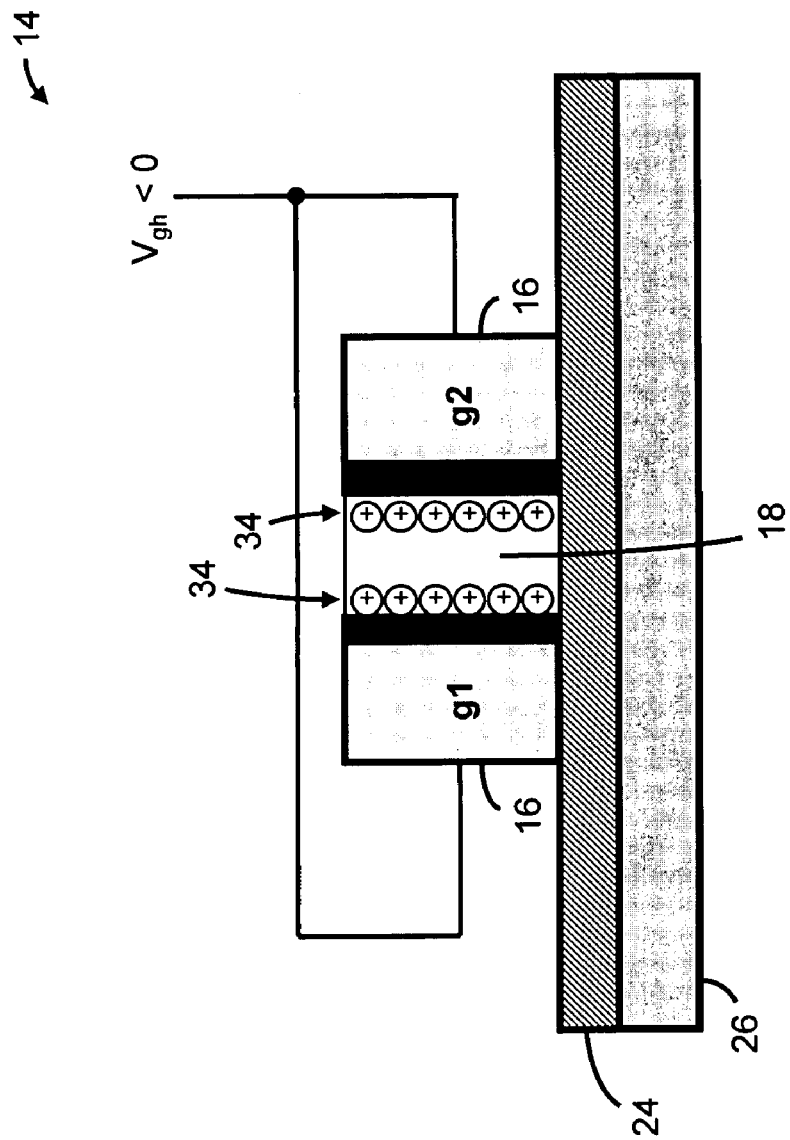
FIGS. 34 and 35 illustrate exemplary schematic (and control signals) of a double-gate and triple-gate transistor, respectively, employed as a floating body memory cell, according to aspects of the present inventions.
Figure 35:
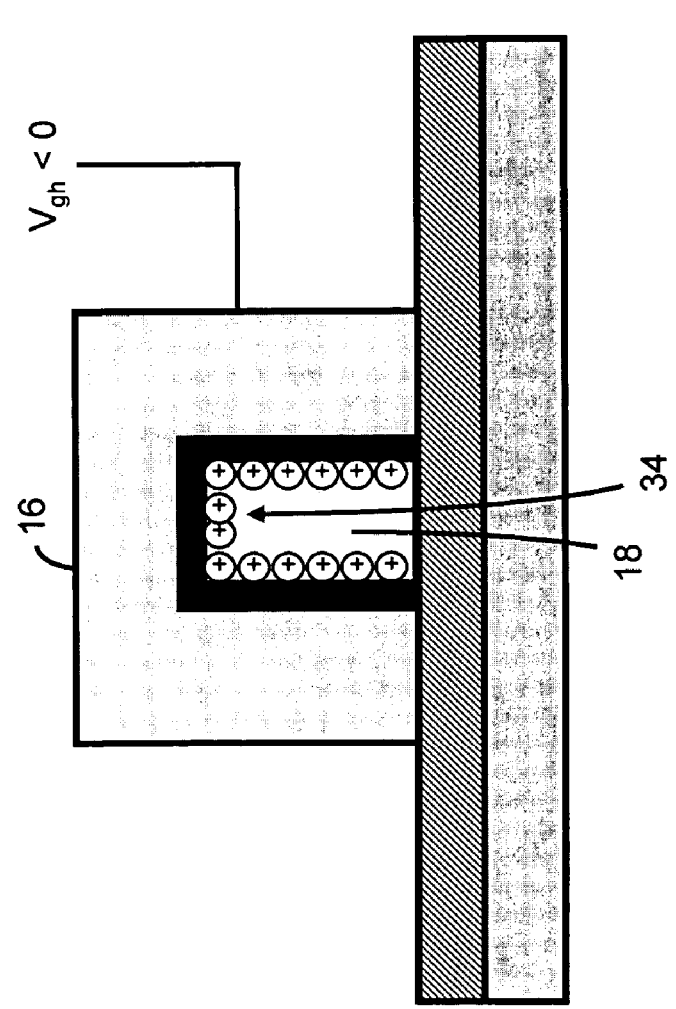

FIGS. 34 and 35 illustrate the inventive technique applied to the double-gate and triple-gate transistors, respectively, wherein the electrically floating body transistor is used as a memory cell. With reference to FIG. 34, double gate transistor (N-channel type) 14 is in a holding condition. By inducing an accumulation layer via application of a negative bias or voltage to the front gate (i.e., gate 16—illustrated as g1 and g2 in the cross-sectional view) double gate transistor 14 behaves as or similar to a PD transistor. In this way, transistor 14 may be employed as a floating body memory cell. Again, a back gate bias need not be applied but may be incorporated.

Similarly, with reference to FIG. 35, triple gate transistor (N-channel type) 14 is in a holding condition. By inducing an accumulation layer via application of a negative bias or voltage to the front gate (i.e., gate 16) transistor 14 behaves as or similar to a PD transistor and, as such, may be employed as a floating body memory cell.

Figure 36:
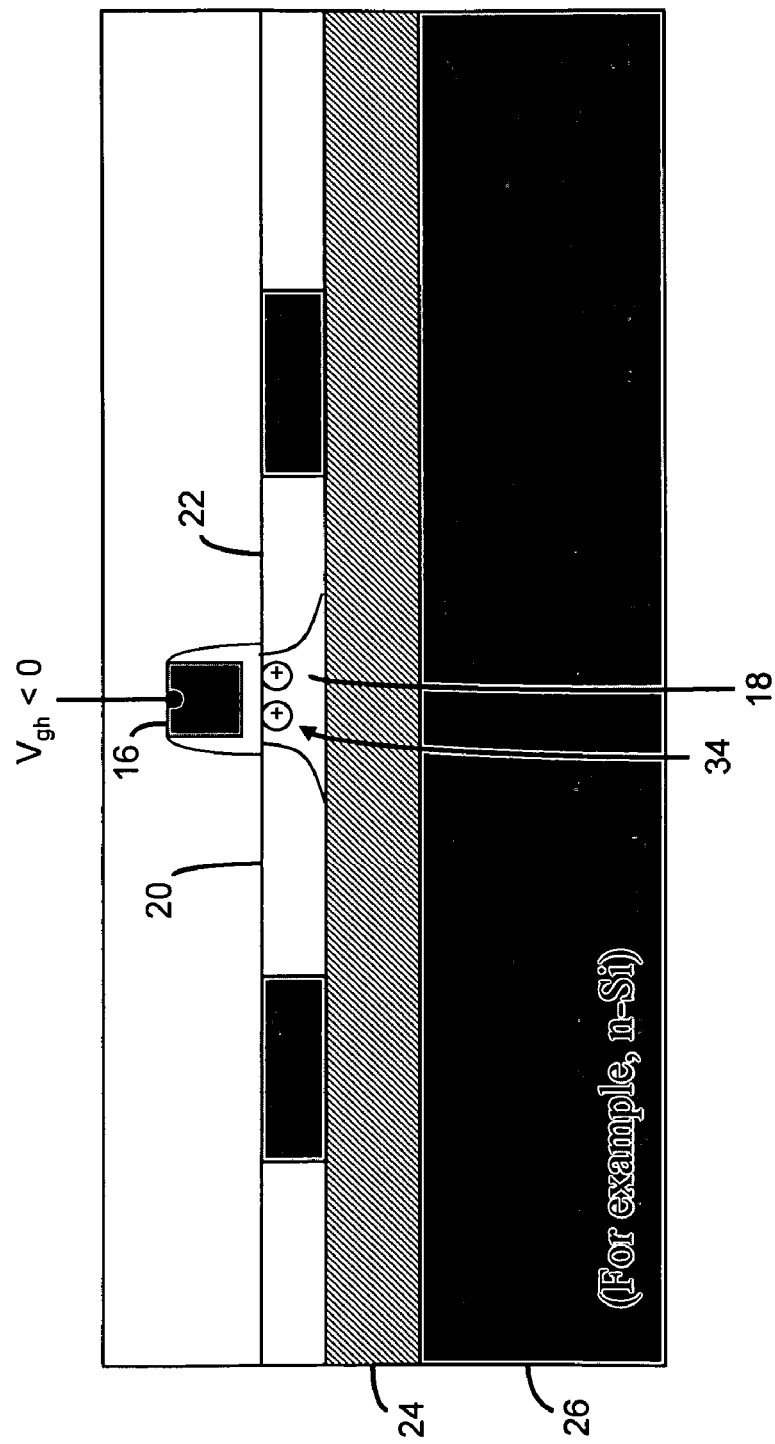
FIG. 36 illustrates an exemplary semiconductor cell (and control signals) that may be used as a floating memory cell according to the present inventions; as before, a back gate bias is not required (although it may be employed) and additional technology/fabrication processes are also not required (although such processing may be implemented)

FIG. 36 illustrates that the use of the present inventions may simplify the memory array by eliminating additional fabrication steps in relation to certain other techniques/embodiments (See, for example, conventional FD-SOI or PD-SOI transistors integration of Fazan, U.S. patent application Ser. No. 10/487,157). In this embodiment, a voltage may be applied to the entire substrate or predetermined portion or regions thereof (for example, regions in which the memory array(s) are/is located) to provide or create a PD-like region wherein the memory cells comprised of transistors having electrically floating body are disposed.

Moreover, memory array 10 (including SOI memory transistors) may be integrated with SOI logic transistors, as described and illustrated in the Integrated Circuit Device Patent Applications. For example, in one embodiment, an integrated circuit device includes memory section (having, for example, PD or FD SOI memory transistors 14) and logic section (having, for example, high performance transistors, such as FinFET, multiple gate transistors, and/or non-high performance transistors (for example, single gate transistors that do not possess the performance characteristics of high performance transistors—not illustrated)).

Further, memory array(s) 10 may be comprised of N-channel, P-channel and/or both types of transistors, as well as partially depleted and/or fully depleted type transistors. For example, circuitry that is peripheral to the memory array (for example, sense amplifiers or comparators, row and column address decoders, as well as line drivers (not illustrated herein)) may include fully depleted type transistors (whether P-channel and/or N-channel type). Alternatively, such circuitry may include partially depleted type transistors (whether P-channel and/or N-channel type). There are many techniques to integrate both partially depleted and/or fully depleted type transistors on the same substrate (see, for example, application Ser. No. 10/487,157, which was filed by Fazan et al. on Feb. 18, 2004 and entitled "Semiconductor Device" (U.S. Patent Application Publication No. 2004/0238890)). All such techniques, whether now known or later developed, are intended to fall within the scope of the present inventions.

Notably, electrically floating body transistor 14 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable. This notwithstanding, the drain region of the electrically floating N-channel transistor of the memory cell (whether the source and drain regions are interchangeable or not) is that region of the transistor that is connected to the bit line/sense amplifier.

As mentioned above, the memory arrays may be comprised of N-channel, P-channel and/or both types of transistors. Indeed, circuitry that is peripheral to the memory array (for example, sense amplifiers or comparators, row and column address decoders, as well as line drivers (not illustrated herein)) may include P-channel and/or N-channel type transistors. Where P-channel type transistors are employed as memory cells 12 in the memory array(s), suitable write and read voltages (for example, negative voltages) are well known to those skilled in the art in light of this disclosure. Accordingly, for sake of brevity, these discussions will not be repeated.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

As mentioned above, the illustrated/exemplary voltage levels to implement the read and write operations are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1 volt) whether one or more of the voltages (for example, the source, drain or gate voltages) become or are positive and negative.

The illustrated/exemplary voltage levels and timing to implement the write and read operations are merely exemplary. In this regard, in certain embodiments, the control signals increase the potential of electrically floating body region of the transistor of the memory cell which "turns on" or produces a bipolar current in the transistor. In the context of a write operation, the bipolar current generates majority carriers in the electrically floating body region which are then stored. In the context of a write operation, the bipolar current generates majority carriers in the electrically floating body region which are then stored. In the context of a read operation, the data state may be determined primarily by, sensed substantially using and/or based substantially on the bipolar transistor current that is responsive to the read control signals and significantly less by the interface channel current component, which is less significant and/or negligible relatively to the bipolar component.

Figure 27:
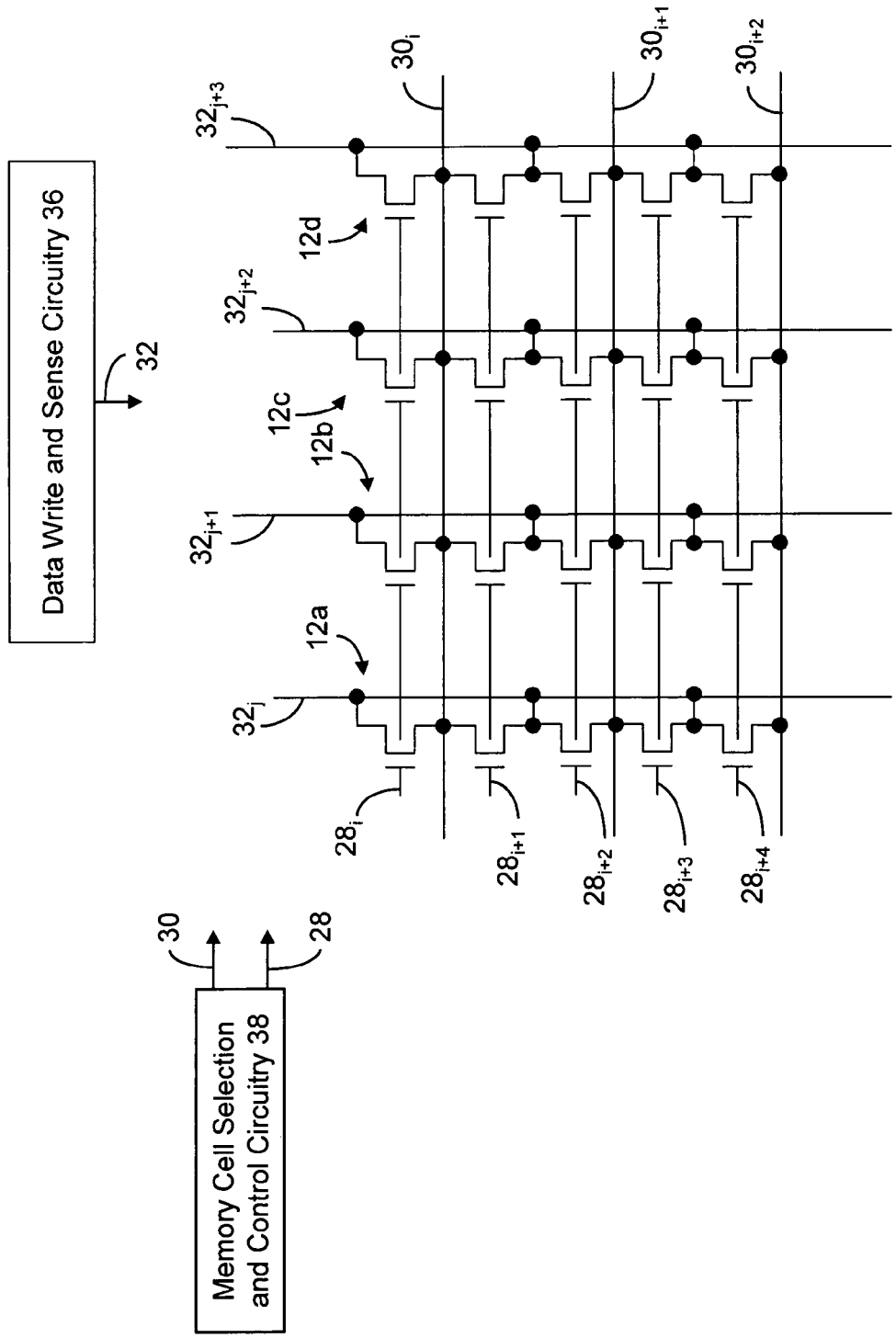
Figure 37:
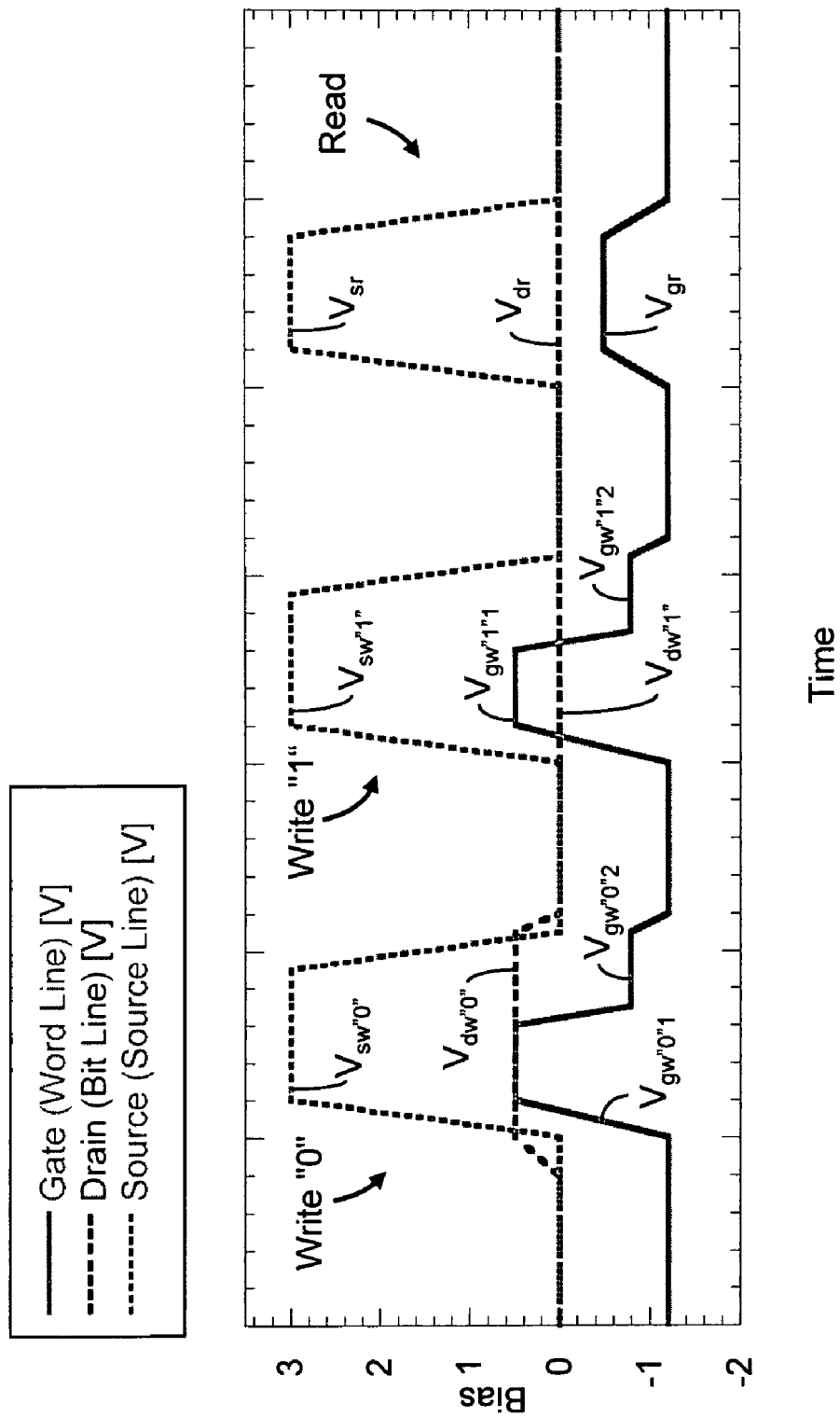
FIG. 37 illustrates exemplary relationships of selected control signals to control or implement certain operations of the memory cells of associated memory array configurations or layouts illustrated herein, according to certain aspects of the present inventions.

For example, with reference to FIGS. 27 and 37, temporally varying control signals to implement the write operation include (i) a voltage applied to the gate ($V_{gw}$) via the associated word line and (ii) a voltage applied to the drain region ($V_{dw}$) via the associated bit line. The logic states "1" and "0" are written to one or more selected cells by applying appropriate bit line voltages. In this regard, logic "1" is written into a memory cell by applying drain pulse ($V_{dw"1"}$) having an amplitude of 0V. Conversely, logic "0" is written into a memory cell by applying the drain pulse ($V_{dw"0"}$) having an amplitude of 0.5V. In addition, during phase 1 of the write operation, the gate pulse ($V_{gw1}$) includes an amplitude of 0.5V. During phase 2 of the write operation, the gate pulse ($V_{gw2}$) includes an amplitude of −1V. The voltage applied to the source lines (and, as such, the source regions of the transistors of the row of memory cells) is 3V.

Under these conditions, a bipolar current that is suitable for programming the memory cell to logic "1" is provided. Moreover, little to no bipolar current is generated for programming the memory cell to logic "0". Here, the drain pulse may be characterized as a "blocking" pulse. From a relative timing perspective, it is preferred that the drain pulse be applied to drain regions of the transistors of memory cells 12 for a temporal period that extends beyond or is applied before, during and after the source and gate pulses (for example, initiates, starts, ramps, declines and/or terminates) as illustrated in FIG. 37.

As noted above, in the preceding discussions pertaining to an exemplary write operation, the reference to a first phase and a second phase of a write operation was used for explanation purposes to highlight changes in voltage conditions of control signals in the exemplary embodiments. It may be advantageous, when writing logic "1" and "0", to apply constant or non-changing voltages to gate, drain region and/or source region during or through what has been labeled as write phases 1 and 2.

In this embodiment, the control techniques facilitate a one step write operation whereby selective memory cells of the selected row are selectively written or programmed to either logic "1" or logic "0" without first implementing a "clear" operation.

Notably, memory cells of the embodiment of FIG. 37 (for example, 12a-12d) may be read in the same manner as described above with respect to FIGS. 26 and 27.

After a read and/or write operation of a row of memory cells, it may be advantageous to employ a refresh operation to the neighboring row of memory cells. In this regard, the neighboring rows of memory cells are those rows of memory cells which "share" a source line 30. Thus, with reference to FIG. 27, where the read and/or write operation is conducted on the row of memory cells associated with word line $28_i$, the neighboring row of memory cells is associated with word line $28_{i+1}$. The word lines $28_i$ and $28_{i+1}$ "share" source line $30_i$.

Further, it may be advantageous to employ a "holding" operation or condition for the other memory cells in memory cell array 10 to minimize and/or reduce the impact of the read and write operations for memory cells 12a-12d connected to word line $28_i$. For example, with reference to FIGS. 27 and 37, in one embodiment, a holding voltage is applied to the gates of the transistors of other memory cells of memory cell array 10 (for example, each memory cell connected to word lines $28_{i+1}$, $28_{i+2}$, $28_{i+3}$, and $28_{i+4}$). In one exemplary embodiment, a holding voltage of −1.2v is applied to the gate of each transistor of the memory cells connected to word lines $28_{i+1}$, $28_{i+2}$, $28_{i+3}$, and $28_{i+4}$. In this way, the impact of the write operation of memory cells 12a-12d (which are connected to word line $28_i$) on the other memory cells of memory cell array 10 is minimized and/or reduced.

As mentioned above, each of the aspects of the present inventions, and/or embodiments thereof, may be employed alone or in combination with one or more of such aspects and/or embodiments. For the sake of brevity, those permutations and combinations will not be discussed separately herein. As such, the present inventions are neither limited to any single aspect (nor embodiment thereof, nor to any combinations and/or permutations of such aspects and/or embodiments.

Moreover, the above embodiments of the present inventions are merely exemplary embodiments. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present inventions. As such, the foregoing description of the exemplary embodiments of the inventions has been presented for the purposes of illustration and description. Many modifications and variations are possible in light of the above teaching. It is intended that the scope of the inventions not be limited solely to the description above.

What is claimed is:

1. An integrated circuit device comprising:
   a memory cell including an electrically floating body transistor, wherein the electrically floating body transistor includes:
   a source region;
   a drain region;
   a body region disposed between the source region and the drain region, wherein the body region is electrically floating; and
   a gate disposed over the body region;

wherein the memory cell stores (i) a first data state which is representative of a first charge in the body region of the electrically floating body transistor, and (ii) a second data state which is representative of a second charge in the body region of the electrically floating body transistor;

data write circuitry, coupled to the memory cell, to apply (i) first write control signals to the memory cell to write the first data state therein and (ii) second write control signals to the memory cell to write the second data state therein; and wherein, in response to the first write control signals applied to the memory cell, the electrically floating body transistor generates a first bipolar transistor current which substantially provides the first charge in the body region of the electrically floating body transistor.

2. The integrated circuit device of claim 1 wherein the first write control signals cause, provide, produce and/or induce the first bipolar transistor current.

3. The integrated circuit device of claim 1 wherein the first write control signals include a signal applied to the gate and a signal applied to the source region wherein the signal applied to the source region includes a first voltage having a first amplitude and a second voltage having a second amplitude.

4. The integrated circuit device of claim 3 wherein the first write control signals further include a signal applied to the drain region wherein the signal applied to the drain region includes a third voltage.

5. The integrated circuit device of claim 1 wherein the first write control signals include a signal applied to the gate and a signal applied to the source region to cause, provide, produce and/or induce the first bipolar transistor current, and wherein:
the signal applied to the source region includes a first voltage having a first amplitude and a second voltage having a second amplitude; and
the signal applied to the gate includes a third voltage having a third amplitude and a fourth voltage having a fourth amplitude.

6. The integrated circuit device of claim 5 wherein the first write control signals further include a signal applied to the drain region to cause, provide, produce and/or induce the first bipolar transistor current, and wherein:
the signal applied to the drain region includes a fifth voltage.

7. The integrated circuit device of claim 5 wherein the first write control signals further include a signal applied to the drain region to cause, provide, produce and/or induce the first bipolar transistor current wherein, in response to the first bipolar transistor current, majority carriers are generated in the electrically floating body region.

8. The integrated circuit device of claim 7 wherein the signal applied to the gate temporally changes relative to the signal applied to the drain region to cause, provide, produce and/or induce the majority carriers to accumulate in a portion of the electrically floating body region that is juxtaposed or near a gate dielectric which is disposed between the gate and the electrically floating body region.

9. The integrated circuit device of claim 8 wherein the signal applied to the gate changes or terminates before the signal applied to the drain region.

10. The integrated circuit device of claim 1 wherein the second write control signals include a signal applied to the gate, a signal applied to the source region, and a signal applied to the drain region and wherein the signal applied to the drain region includes a blocking voltage to prevent the first data state from being written into the electrically floating body transistor.

11. The integrated circuit device of claim 1 further including:
data sense circuitry, coupled to the memory cell, to sense the data state of the memory cell; and
wherein, in response to read control signals applied to the memory cell when the memory cell stores the first data state, the electrically floating body transistor generates a second bipolar transistor current which is representative of the first data state, and wherein the data sense circuitry determines the first data state at least substantially based on the second bipolar transistor current.

12. An integrated circuit device comprising:
a memory cell array including a:
plurality of word lines;
plurality of source lines;
plurality of bit lines; and
plurality of memory cells arranged in a matrix of rows and columns, wherein each memory cell includes an electrically floating body transistor, wherein the electrically floating body transistor includes:
a source region coupled to an associated source line;
a drain region coupled to an associated bit line;
a body region disposed between the source region and the drain region, wherein the body region is electrically floating;
a gate coupled to an associated word line; and
wherein each memory cell stores (i) a first data state which is representative of a first charge in the body region of electrically floating body the transistor, and (ii) a second data state which is representative of a second charge in the body region of the electrically floating body transistor; and
wherein the source region of the electrically floating body transistor of each memory cell of a first row of memory cells is connected to a first source line;
data write circuitry, coupled to the memory cells of the first row of memory cells, to apply (i) first write control signals to memory cells of the first row of memory cells to write the first data state therein or (ii) second write control signals to memory cells of the first row of memory cells to write the second data state therein; and
wherein, in response to the first write control signals applied to at least a portion of the memory cells of the first row of memory cells, the electrically floating body transistor of each memory cell of the portion of the memory cells of the first row of memory cells generates a first bipolar transistor current which at least substantially provides the first charge in the body region of the electrically floating body transistors corresponding to the portion of the memory cells of the first row of memory cells.

13. The integrated circuit device of claim 12 wherein the source region of the electrically floating body transistor of each memory cell of a second row of memory cells is connected to the first source line.

14. The integrated circuit device of claim 12 wherein:
the source region of the electrically floating body transistor of each memory cell of a second row of memory cells is connected to a second source line;
the source region of the electrically floating body transistor of each memory cell of a third row of memory cells is connected to the second source line; and
wherein the second and third rows of memory cells are adjacent to the first row of memory cells.

15. The integrated circuit device of claim 12 wherein the first write control signals cause, provide, produce and/or induce the first bipolar transistor current.

16. The integrated circuit device of claim 12 wherein the first write control signals include a signal applied to the gate which includes a first voltage having a first amplitude and a second voltage having a second amplitude.

17. The integrated circuit device of claim 12 wherein the first write control signals include a signal applied to the source region includes a first voltage having a first amplitude and a second voltage having a second amplitude.

18. The integrated circuit device of claim 17 wherein the first write control signal further includes a signal applied to the drain region having a third amplitude.

19. The integrated circuit device of claim 12 wherein the data write circuitry, prior to applying the first write control signals, applies the second write control signals to all of the memory cells of the first row of memory cells to write the second data state therein.

20. The integrated circuit device of claim 12 wherein the data write circuitry at least substantially simultaneously applies:
the first write control signals to the portion of the memory cells of the first row of memory cells to write the first data state therein; and
the second write control signals to another, different portion of the memory cells of the first row of memory cells to write the second data state therein.

21. The integrated circuit device of claim 12 wherein the first write control signals include a signal applied to the gate and a signal applied to the source region of the electrically floating body transistors of a one or more memory cells of the first row of memory cells to cause, provide, produce and/or induce the first bipolar transistor current, and wherein:
the signal applied to the source region includes a first voltage having a first amplitude and a second voltage having a second amplitude; and
the signal applied to the gate includes a third voltage having a third amplitude and a fourth voltage having a fourth amplitude.

22. The integrated circuit device of claim 21 wherein the first write control signals further include a signal applied to the drain region of the electrically floating body transistors of the one or more memory cells of the first row of memory cells to cause, provide, produce and/or induce the first bipolar transistor current, and wherein:
the signal applied to the drain region includes a fifth voltage.

23. The integrated circuit device of claim 12 further including:
data sense circuitry, coupled to each memory cell of the plurality of memory cells, to sense a data state of the memory cell; and
wherein, in response to read control signals applied to memory cells storing the first data state, the electrically floating body transistor of each memory cell storing the first data state generates a second bipolar transistor current which is representative of the first data state, and wherein the data sense circuitry determines the first data state substantially based on the second bipolar transistor current.

24. The integrated circuit device of claim 23 wherein one or more of the read control signals include a constant or unchanging voltage amplitude.

25. An integrated circuit device comprising:
a memory cell consisting essentially of an electrically floating body transistor, wherein the electrically floating body transistor comprises:
a source region;
a drain region;
a body region disposed between the source region and the drain region, wherein the body region is electrically floating; and
a gate spaced apart from and capacitively coupled to the body region;
wherein the memory cell stores (i) a first data state which is representative of a first charge in the body region of the electrically floating body transistor, and (ii) a second data state which is representative of a second charge in the body region of the electrically floating body transistor;
data write circuitry, coupled to the memory cell, to apply (i) first write control signals to the memory cell to write the first data state therein and (ii) second write control signals to the memory cell to write the second data state therein; and
wherein, in response to the first write control signals applied to the memory cell, the electrically floating body transistor generates a first bipolar transistor current which at least substantially provides the first charge In the body region of the electrically floating body transistor.

26. The integrated circuit device of claim 25 wherein the first write control signals include a signal applied to the gate and a signal applied to the source region wherein the signal applied to the source region includes a first voltage having a first amplitude and a second voltage having a second amplitude.

27. The Integrated circuit device of claim 26 where the first write control signals further include a signal applied to the drain region wherein the signal applied to the drain region includes a third voltage.

28. The integrated circuit device of claim 25 wherein the first write control signals include a signal applied to the gate and a signal applied to the source region to cause, provide, produce and/or induce the first bipolar transistor current, and wherein:
the signal applied to the source region includes a first voltage having a first amplitude and a second voltage having a second amplitude; and
the signal applied to the gate includes a third voltage having a third amplitude and a fourth voltage having a fourth amplitude.

29. The integrated circuit device of claim 28 wherein the first write control signals include a signal applied to the drain region to cause, provide, produce and/or induce the first bipolar transistor current, and wherein:
the signal applied to the drain region includes a fifth voltage.

30. The integrated circuit device of claim 28 wherein the first write control signals further include a signal applied to the drain region to cause, provide, produce and/or induce the first bipolar transistor current wherein, in response to the first bipolar transistor current, majority carriers are generated in the electrically floating body region.

31. The integrated circuit device of claim 30 wherein the signal applied to the gate temporally changes relative to the signal applied to the drain region to cause, provide, produce and/or induce the majority carriers to accumulate in a portion of the electrically floating body region that is juxtaposed or near a gate dielectric which is disposed between the gate and the electrically floating body region.

32. The integrated circuit device of claim 31 wherein the signal applied to the gate changes or terminates before the signal applied to the drain region.

33. The integrated circuit device of claim 25 wherein the second write control signals include a signal applied to the gate, a signal applied to the source region, and a signal applied to the drain region and wherein the signal applied to the drain region includes a blocking voltage to prevent the first data state from being written into the electrically floating body transistor.

34. The integrated circuit device of claim 25 further including:
- data sense circuitry, coupled to the memory cell, to sense the data state of the memory cell; and
- wherein, in response to read control signals applied to the memory cell, when the memory cell stores the first data state, the electrically floating body transistor generates a second bipolar transistor current which is representative of the first data state, and wherein the data sense circuitry determines the first data state, at least substantially based on the second bipolar transistor current.

35. The integrated circuit device of claim 25 wherein the electrically floating body transistor is an N-channel type transistor or a P-channel type transistor.

36. The integrated circuit device of claim 25 wherein the gate of the electrically floating body transistor is disposed over the body region.

37. The integrated circuit device of claim 36 wherein the gate of the electrically floating body transistor is disposed above the body region.

38. The integrated circuit device of claim 25 wherein the data write circuitry includes means for writing a data state into the memory cell.

39. The integrated circuit device of claim 34 wherein the data sense circuitry includes means for sensing the data state of the memory cell.

40. The integrated circuit device of claim 1 wherein the gate of the electrically floating body transistor is disposed above the body region.

41. The integrated circuit device of claim 1 wherein the data write circuitry includes means for writing a data state into the memory cell.

42. The integrated circuit device of claim 11 wherein the data sense circuitry includes means for sensing the data state of the memory cell.

* * * * *